United States Patent
Banno et al.

(10) Patent No.: US 9,893,276 B2
(45) Date of Patent: Feb. 13, 2018

(54) SWITCHING ELEMENT, SWITCHING ELEMENT MANUFACTURING METHOD, SEMICONDUCTOR DEVICE, AND SEMICONDUCTOR DEVICE MANUFACTURING METHOD

(71) Applicant: NEC CORPORATION, Tokyo (JP)

(72) Inventors: Naoki Banno, Tokyo (JP); Munehiro Tada, Tokyo (JP)

(73) Assignee: NEC CORPORATION, Minato-ku, Tokyo (JP)

(*) Notice: Subject to any disclaimer, the term of this patent is extended or adjusted under 35 U.S.C. 154(b) by 0 days.

(21) Appl. No.: 14/895,017

(22) PCT Filed: Jun. 17, 2014

(86) PCT No.: PCT/JP2014/003247
§ 371 (c)(1),
(2) Date: Dec. 1, 2015

(87) PCT Pub. No.: WO2014/208050
PCT Pub. Date: Dec. 31, 2014

(65) Prior Publication Data
US 2016/0111638 A1  Apr. 21, 2016

(30) Foreign Application Priority Data

Jun. 27, 2013  (JP) .................................. 2013-134426

(51) Int. Cl.
*H01L 45/00* (2006.01)
*H01L 27/10* (2006.01)
*H01L 27/24* (2006.01)

(52) U.S. Cl.
CPC .......... *H01L 45/085* (2013.01); *H01L 27/101* (2013.01); *H01L 27/2463* (2013.01);
(Continued)

(58) Field of Classification Search
CPC ........................ H01L 45/085; H01L 45/1233
See application file for complete search history.

(56) References Cited

U.S. PATENT DOCUMENTS

| 2008/0138996 A1 | 6/2008 | Nishizuka |
| 2011/0068312 A1 | 3/2011 | Sekine et al. |
(Continued)

FOREIGN PATENT DOCUMENTS

| JP | 05-217961 A | 8/1993 |
| JP | 2002-536840 A | 10/2002 |
(Continued)

OTHER PUBLICATIONS

Munehiro Tada, et al., "Nonvolatile Crossbar Switch Using TiOx /TaSiOy Solid Electrolyte", IEEE Transactions on Electron Devices, Aug. 2010, pp. 1987-1995, vol. 57, No. 8.
(Continued)

*Primary Examiner* — Tran Tran
(74) *Attorney, Agent, or Firm* — Sughrue Mion, PLLC

(57) ABSTRACT

To provide a switching element having excellent operational stability and a high production yield, and a semiconductor device using the switching element, a switching element according to this invention includes a non-volatile resistive-change element, a rectifying element, and an insulating material. The non-volatile resistive-change element includes a first electrode, a second electrode, and a non-volatile resistive-change layer provided between the first electrode and the second electrode. The rectifying element includes the second electrode, a third electrode, and a volatile resistive-change layer provided between the second electrode and the third electrode. The insulating material is provided at least on the side surface of the third electrode.

2 Claims, 37 Drawing Sheets

(52) U.S. Cl.
CPC ...... *H01L 45/1206* (2013.01); *H01L 45/1233* (2013.01); *H01L 45/1246* (2013.01); *H01L 45/1266* (2013.01); *H01L 45/146* (2013.01); *H01L 45/1608* (2013.01); *H01L 45/1633* (2013.01); *H01L 45/1675* (2013.01)

(56) References Cited

U.S. PATENT DOCUMENTS

2012/0097916 A1* 4/2012 Tada ................ H01L 27/101
    257/4
2013/0121063 A1    5/2013 Tsuji et al.

FOREIGN PATENT DOCUMENTS

| | | |
|---|---|---|
| JP | 2006-156675 A | 6/2006 |
| JP | 2010-040728 A | 2/2010 |
| JP | 2011-066313 A | 3/2011 |
| JP | 2011-238875 A | 11/2011 |
| WO | 2011/058947 A1 | 5/2011 |
| WO | 2012/042828 A1 | 4/2012 |
| WO | 2012/043502 A1 | 4/2012 |

OTHER PUBLICATIONS

International Search Report for PCT/JP2014/003247 dated Jul. 22, 2014 [PCT/ISA/210].
Written Opinion for PCT/JP2014/003247 dated Jul. 22, 2014 [PCT/ISA/237].

\* cited by examiner

[PROCESS 1]

- 804 INTERLAYER INSULATING FILM
- 803 BARRIER INSULATING FILM
- 802 INTERLAYER INSULATING FILM
- 801 SEMICONDUCTOR SUBSTRATE

805 FIRST WIRING   806 BARRIER METAL

[PROCESS 2]

- 807 BARRIER INSULATING FILM

[PROCESS 3]

808 HARD MASK FILM

[PROCESS 4]

[PROCESS 5]

[PROCESS 6]

809b SECOND ION CONDUCTIVE LAYER

809a FIRST ION CONDUCTIVE LAYER

[PROCESS 7]

812 THIRD ELECTRODE
811 RESISTIVE-CHANGE LAYER
810 SECOND ELECTRODE

[PROCESS 8]

814 HARD MASK FILM

813 HARD MASK FILM

Fig. 8I  [PROCESS 9]
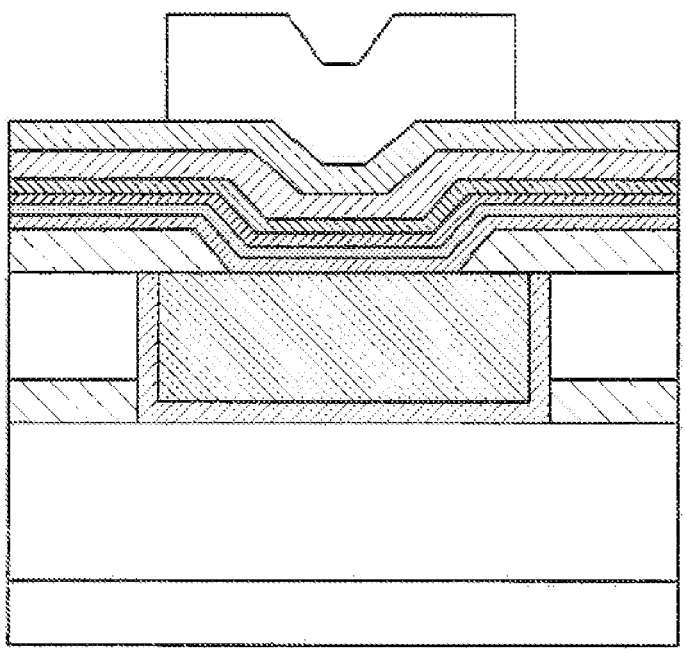
Fig. 8J  [PROCESS 10]
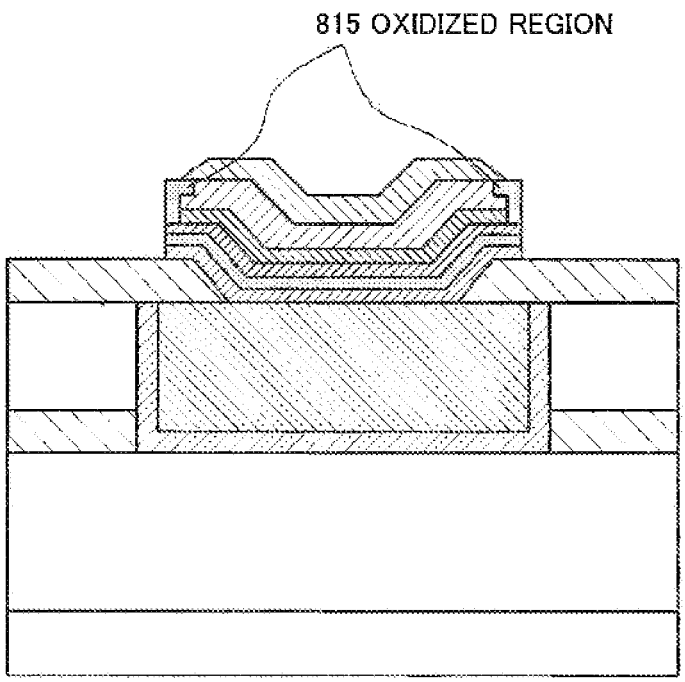

[PROCESS 11]

[PROCESS 12]

- 822 BARRIER INSULATING FILM
- 819 SECOND WIRING
- 821 BARRIER METAL
- 818 INTERLAYER INSULATING FILM
- 817 INTERLAYER INSULATING FILM
- 820 PLUG

[PROCESS 1]

[PROCESS 2]

[PROCESS 3]

[PROCESS 4]

[PROCESS 5]

[PROCESS 6]

1009b SECOND ION CONDUCTIVE LAYER

1009a FIRST ION CONDUCTIVE LAYER

[PROCESS 7]

1012 THIRD ELECTRODE
1011 RESISTIVE-CHANGE LAYER
1010 SECOND ELECTRODE

[PROCESS 8]

1014 HARD MASK FILM
1013 HARD MASK FILM

[PROCESS 9]

[PROCESS 10]   1015 OXIDIZED REGION

[PROCESS 11]

1016 PROTECTIVE INSULATING FILM

[PROCESS 12]

1022 BARRIER INSULATING FILM
1019 SECOND WIRING
1021 BARRIER METAL
1018 INTERLAYER INSULATING FILM
1020 PLUG
1017 INTERLAYER INSULATING FILM

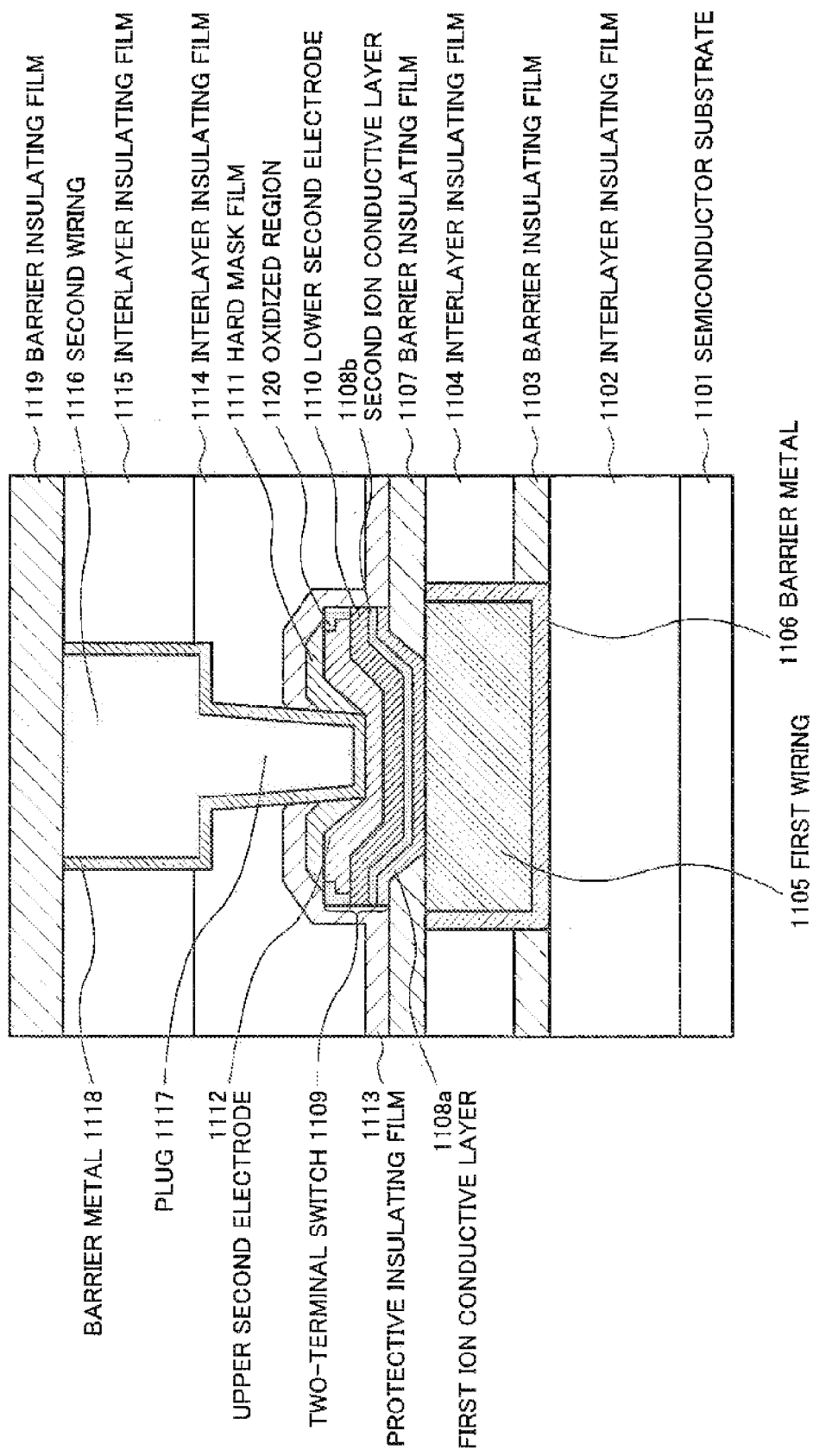

[PROCESS 1]

- 1404 INTERLAYER INSULATING FILM
- 1403 BARRIER INSULATING FILM
- 1402 INTERLAYER INSULATING FILM
- 1401 SEMICONDUCTOR SUBSTRATE

1405 FIRST WIRING    1406 BARRIER METAL

[PROCESS 2]

- 1407 BARRIER INSULATING FILM

[PROCESS 3]

1408 HARD MASK FILM

[PROCESS 4]

[PROCESS 5]

[PROCESS 6]

1409b SECOND ION CONDUCTIVE LAYER

1409a FIRST ION CONDUCTIVE LAYER

[PROCESS 7]

[PROCESS 8]

[PROCESS 9]

[PROCESS 10]

1414 OXIDIZED REGION

[PROCESS 11]

1415 PROTECTIVE INSULATING FILM

[PROCESS 12]

1421 BARRIER INSULATING FILM
1418 SECOND WIRING
1420 BARRIER METAL
1417 INTERLAYER INSULATING FILM
1419 PLUG
1416 INTERLAYER INSULATING FILM

[PROCESS 3]

1608 HARD MASK FILM

[PROCESS 4]

[PROCESS 5]

[PROCESS 6]

1609b SECOND ION CONDUCTIVE LAYER

1609a FIRST ION CONDUCTIVE LAYER

[PROCESS 7]

[PROCESS 8]

[PROCESS 9]

[PROCESS 10]  1614 OXIDIZED REGION

[PROCESS 11]

1615 PROTECTIVE INSULATING FILM

[PROCESS 12]

1621 BARRIER INSULATING FILM
1618 SECOND WIRING
1620 BARRIER METAL
1617 INTERLAYER INSULATING FILM
1619 PLUG
1616 INTERLAYER INSULATING FILM

SWITCHING ELEMENT, SWITCHING ELEMENT MANUFACTURING METHOD, SEMICONDUCTOR DEVICE, AND SEMICONDUCTOR DEVICE MANUFACTURING METHOD

CROSS REFERENCE TO RELATED APPLICATIONS

This application is a National Stage of International Application No. PCT/JP2014/003247 filed Jun. 17, 2014, claiming priority based on Japanese Patent Application No. 2013-134426 filed Jun. 27, 2013, the contents of all of which are incorporated herein by reference in their entirety.

TECHNICAL FIELD

The present invention relates to a switching element which is fabricated using metal precipitation and employed for electronic devices such as programmable logic and memories, and a semiconductor device using the switching element.

BACKGROUND ART

To diversify the function of programmable logic and promote its implementation in, for example, electronic devices, a switch which connects logic cells to each other needs to be downsized to reduce its ON resistance. Switches fabricated using metal precipitation in ion conductive layers which conduct metal ions are known to have smaller sizes and lower ON resistances than other types of semiconductor switches.

Available switches of this type are classified into a two-terminal switch disclosed in PTL 1 and a three-terminal switch disclosed in PTL 2. The two-terminal switch is formed by interposing an ion conductive layer between a first electrode which supplies metal ions and a second electrode which supplies no ions. The two electrodes are switched by metal bridge formation and annihilation in the ion conductive layer. The two-terminal switch has a simple structure and therefore can be fabricated by a simple process with a small element size on the order of nanometers. The three-terminal switch includes integrated second electrodes of two two-terminal switches and therefore ensures high reliability.

As the ion conductive layer, a porous polymer containing silicon, oxygen, and carbon as the main components is desirable. PTL 3 discloses that a porous polymer ion conductive layer can maintain the dielectric breakdown voltage high even upon metal bridge formation and is therefore excellent in operation reliability.

To implement the switching element as a wiring switch for programmable logic, it is necessary to increase the packing density of the switching element by miniaturization and simplify the fabrication process. Since the main wiring material of leading-edge semiconductor devices is copper, a technique for efficiently forming resistive-change elements in copper wiring is desirable.

NPL 1 discloses a technique for integrating a switching element into a semiconductor device using an electrochemical reaction. This technique allows copper wiring on a semiconductor substrate to simultaneously serve as the first electrode of a switching element. With this structure, a process for newly forming a first electrode can be omitted. This obviates the need for a photomask used to form a first electrode, thus limiting the number of photomasks to be added to fabricate a resistive-change element to only two.

In this case, directly forming an ion conductive layer on copper wiring oxidizes the copper wiring surface, leading to a larger leakage current. Therefore, a metal thin film which functions as an oxidized sacrificial layer is sandwiched between the copper wiring and the ion conductive layer. The metal thin film is oxidized by oxygen contained in the ion conductive layer and then partially forms the ion conductive layer. As the second electrode that supplies no ions, platinum or gold that is hard to oxidize or ruthenium that has a given conductivity even after oxidation is used. According to NPL 1, ruthenium suitable for processing is used as the second electrode.

When a switching element which uses a metal bridge and serves as a non-volatile resistive-change element is employed as a wiring switch for programmable logic, holding power is required to hold ON and OFF states for about 10 years without voltage/current application. However, there exists a trade-off between the rewrite current and the holding power in a switching element which uses a metal bridge. For a large write current, the holding power is high because of the formation of a thick metallic bridge; while a thin bridge is formed upon a transition to ON state at a small current for power saving, thus posing a problem involving the holding power of the bridge.

Japanese Patent Application No. 2012-141049 describes a second electrode which contains ruthenium as the main component and is made of an alloy of ruthenium and at least one material selected from titanium, tantalum, aluminum, manganese, zirconium, hafnium, magnesium, cobalt, copper, and zinc. This provides a switching element which achieves both power saving and high reliability.

Japanese Patent Application No. 2013-007349 describes a structure including a bidirectional rectifying element stacked on the second electrode of a three-terminal switch which uses a metal bridge. Since the switching element is kept inactive at the operating voltage of the bidirectional rectifying element or less, switching element selection is easy in a crossbar switch structure forming programmable logic. A general crossbar element structure uses a selection transistor to keep parts other than the selected element inactive, while the use of a built-in rectifying element obviates the need for a selection transistor. This saves the area corresponding to a selection transistor.

CITATION LIST

Patent Literature

[PTL 1] Published Japanese Translation of PCT International Publication for Patent Application No. 2002-536840
[PTL 2] International Publication WO 2012/043502
[PTL 3] International Publication WO 2011/058947

Non Patent Literature

[NPL 1] IEEE TRANSACTION ON ELECTRON DEVICES, vol. 57, pp. 1987-1995, 2010

SUMMARY OF INVENTION

Technical Problem

When a rectifying element serving as a volatile resistive-change element is stacked on a switching element serving as a non-volatile resistive-change element, the rectifying element forms an MIM (Metal-Insulator-Metal) structure which sandwiches a volatile resistive-change layer between the upper electrode of the switching element and the upper electrode of the rectifying element. An element with the MIM structure has a problem that the upper and lower electrodes that sandwich the rectifying element short-circuit because of redeposition of a metal-derived etching product upon etching.

Another problem is that when an alloy electrode containing ruthenium as the main component is used for the upper electrode of the switching element, the use of a normal etching gas makes the etching rate of a barrier insulating film on Cu wiring that must not be etched higher than the alloy etching rate so that the barrier insulating film is etched together during processing of the switching element and the Cu wiring is exposed.

The present invention has been made in consideration of the above-mentioned problems, and aims at providing a switching element having excellent operational stability and a high production yield, and a semiconductor device using the switching element.

Solution to Problem

A switching element according to the present invention includes a non-volatile resistive-change element, a third electrode, and an insulating material. The non-volatile resistive-change element includes a first electrode, a second electrode, and a non-volatile resistive-change layer provided between the first electrode and the second electrode. The third electrode is provided on the second electrode. The insulating material is provided at least on the side surface of the third electrode.

In a method for manufacturing a switching element according to the present invention, the switching element includes a non-volatile resistive-change element, a third electrode, and an oxide. The non-volatile resistive-change element includes a first electrode, a second electrode, and a non-volatile resistive-change layer provided between the first electrode and the second electrode. The third electrode is provided on the second electrode. The oxide is provided at least on the side surface of the third electrode. The method includes performing dry etching on the third electrode using an etching gas possessing oxidizing properties.

A semiconductor device according to the present invention includes a non-volatile resistive-change element and a volatile resistive-change element within a multilayer copper wiring layer on a semiconductor substrate. The multilayer copper wiring layer includes copper wiring and a copper plug. The non-volatile resistive-change element includes a first electrode, a second electrode, and an ion conductive layer provided between the first electrode and the second electrode. The copper wiring serves as the first electrode and includes a barrier insulating film provided on it. The barrier insulating film contains silicon carbonitride. The barrier insulating film includes an opening which reaches the first electrode. The opening includes the ion conductive layer and the second electrode. The ion conductive layer includes a first ion conductive layer in contact with the first electrode and a second ion conductive layer in contact with the second electrode. The first ion conductive layer contains titanium oxide, aluminum oxide, or a stack of titanium oxide and aluminum oxide. The second ion conductive layer includes a polymer film containing silicon, oxygen, and carbon and having a relative dielectric constant of 2.1 (inclusive) to 3.0 (inclusive). The second electrode contains an alloy of ruthenium and tantalum or an alloy of ruthenium and titanium. The volatile resistive-change element includes the second electrode, the third electrode, and a resistive-change layer provided between the second electrode and the third electrode. The opening includes the resistive-change layer and the third electrode. The resistive-change layer contains titanium oxide, aluminum oxide, tantalum oxide, niobium oxide, or a stack of titanium oxide, aluminum oxide, tantalum oxide, and niobium oxide. The third electrode is connected to the copper plug via a barrier metal. The third electrode contains tantalum. The semiconductor device includes an insulating material at least on the side surface of the third electrode.

In a method for manufacturing a semiconductor device according to the present invention, the semiconductor device includes a non-volatile resistive-change element and a volatile resistive-change element within a multilayer copper wiring layer on a semiconductor substrate. The method includes forming a barrier insulating film containing silicon carbonitride on copper wiring serving as a first electrode, forming in the barrier insulating film, an opening which reaches the first electrode, forming in the opening, a first ion conductive layer containing titanium oxide, aluminum oxide, or a stack of titanium oxide and aluminum oxide, forming a polymer film containing silicon, oxygen, and carbon and having a relative dielectric constant of 2.1 (inclusive) to 3.0 (inclusive) on the first ion conductive layer as a second ion conductive layer, forming on the second ion conductive layer, a second electrode containing an alloy of ruthenium and tantalum or an alloy of ruthenium and titanium, forming on the second electrode, a resistive-change layer containing titanium oxide, aluminum oxide, tantalum oxide, niobium oxide, or a stack of titanium oxide, aluminum oxide, tantalum oxide, and niobium oxide, forming a third electrode containing tantalum on the resistive-change layer, forming a hard mask film containing silicon nitride and silicon oxide on the third electrode, forming a photoresist pattern on the hard mask film, forming a hard mask by performing dry etching on the hard mask film by an etching gas containing carbon tetrafluoride, using the photoresist pattern as a mask, and performing dry etching on the third electrode, the resistive-change layer, the second electrode, the second ion conductive layer, and the first ion conductive layer by an etching gas possessing oxidizing property, using the hard mask as a mask.

Advantageous Effects of Invention

The present invention provides a switching element having excellent operational stability and a high production yield, and a semiconductor device using the switching element.

BRIEF DESCRIPTION OF DRAWINGS

FIG. 8I is a schematic sectional view illustrating still another process (process 9) of manufacturing the semiconductor device including the two-terminal switching element according to the first exemplary embodiment of the present invention;

FIG. 8J is a schematic sectional view illustrating still another process (process 10) of manufacturing the semiconductor device including the two-terminal switching element according to the first exemplary embodiment of the present invention;

FIG. 11 is a schematic sectional view illustrating the configuration of a semiconductor device including a two-terminal switching element according to a third exemplary embodiment of the present invention;

DESCRIPTION OF EMBODIMENTS

Exemplary embodiments of the present invention will be described in detail below with reference to the accompanying drawings. The following exemplary embodiments are limited technically preferably in terms of carrying out the present invention, but the scope of the invention is not limited to the following description.

(First Exemplary Embodiment)

Figure 1:
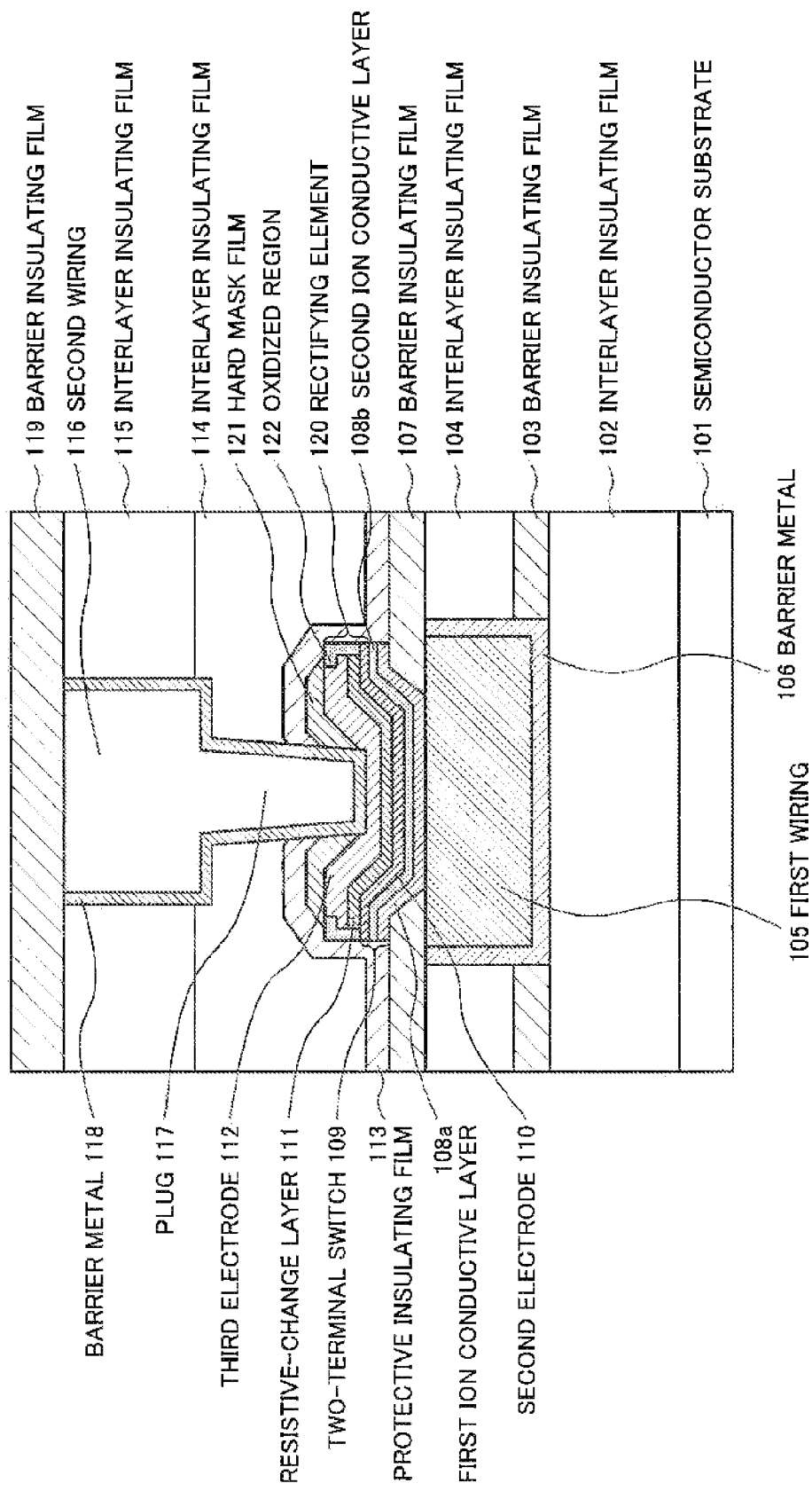
FIG. 1 is a schematic sectional view illustrating the configuration of a semiconductor device including a two-terminal switching element according to a first exemplary embodiment of the present invention.

FIG. 1 is a schematic sectional view illustrating the configuration of a semiconductor device including a two-terminal switching element according to a first exemplary embodiment of the present invention. A multilayer wiring layer on a semiconductor substrate 101 includes a two-terminal switch 109.

The multilayer wiring layer includes, on the semiconductor substrate 101, an insulator stack including an interlayer insulating film 102, a barrier insulating film 103, an interlayer insulating film 104, barrier insulation 107, a protective insulating film 113, interlayer insulating films 114 and 115, and a barrier insulating film 119 stacked in this order. The multilayer wiring layer includes first wiring 105 buried through a barrier metal 106 in a wiring trench formed in the interlayer insulating film 104 and the barrier insulating film 103. The multilayer wiring layer also includes second wiring 116 buried in a wiring trench formed in the interlayer insulating films 115 and 114. Further, a plug 117 is buried in a pilot hole formed in the interlayer insulating film 114, the protective insulating film 113, and a hard mask film 121. The second wiring 116 and the plug 117 are integrated with each other and the side to bottom surfaces of the second wiring and the plug 117 are covered with a barrier metal 118.

In an opening formed in the barrier insulating film 107, a two-terminal switch 109 including a first ion conductive layer 108a, a second ion conductive layer 108b, and a second electrode 110 stacked in this order is formed on the first wiring 105 serving as a first electrode, the wall surface defining the opening, and the barrier insulating film 107. Moreover, a rectifying element 120 is formed by stacking a resistive-change layer 111 and a third electrode 112 on the second electrode 110. Furthermore, the hard mask film 121 is formed on the third electrode 112. The upper to side surfaces of the stack of the first ion conductive layer 108a, the second ion conductive layer 108b, the second electrode 110, the resistive-change layer 111, the third electrode 112, and the hard mask film 121 are covered with the protective insulating film 113.

Enabling the first wiring 105 to serve as the first electrode of the two-terminal switch 109 makes it possible to lower the electrode resistance while achieving fewer processes. As an additional process to the normal copper damascene wiring process, simply adding at least two photomasks allows mounting of a two-terminal switch so as to simultaneously achieve reductions in both resistance and cost of the switching element.

In the two-terminal switch 109, the first ion conductive layer 108a is in contact with the first wiring 105 and the second ion conductive layer 108b is in contact with the second electrode 110, in the region of the opening formed in the barrier insulating film 107. In the rectifying element 120, the resistive-change layer 111 is in contact with the upper part of the second electrode 110 and the third electrode 112 is further in contact with the upper part of the resistive-change layer 111.

The plug 117 is electrically connected to the third electrode 112 via the barrier metal 118 on the third electrode 112. The two-terminal switch 109 undergoes ON/OFF control by voltage application or current supply. For example, ON/OFF control is performed using electromigration of the metal associated with the first wiring 105 into the first ion conductive layer 108a and the second ion conductive layer 108b to maintain the ON and OFF states non-volatile. The rectifying element 120 undergoes ON/OFF control by voltage application and changes to ON state at a voltage having an absolute value smaller than that of the two-terminal switch 109. In this case, the ON state shows volatile behavior.

The semiconductor substrate 101 is a substrate including semiconductor elements. Examples of the semiconductor substrate 101 may include substrates such as a silicon substrate, a single-crystal substrate, an SOI (Silicon on Insulator) substrate, a TFT (Thin Film Transistor) substrate, and a liquid crystal manufacturing substrate.

The interlayer insulating film 102 is an insulating film formed on the semiconductor substrate 1. Examples of the interlayer insulating film 102 may include a silicon oxide film and a low dielectric film (for example, a SiOCH film) having a relative dielectric constant lower than that of a silicon oxide film. The interlayer insulating film 102 may be implemented in a stack of a plurality of insulating films.

The barrier insulating film 103 is an insulating film which has barrier properties and is interposed between the interlayer insulating films 102 and 104. The barrier insulating film 103 serves as an etching stop layer during processing of a wiring trench for the first wiring 105. Examples of the barrier insulating film 103 may include a silicon nitride film, a SiC film, and a silicon carbonitride film. A wiring trench to bury the first wiring 105 is formed in the barrier insulating film 103 such that the first wiring 105 is buried in the wiring trench through the barrier metal 106. The barrier insulating film 103 can also be removed, depending on the selection of the etching conditions of the wiring trench.

The interlayer insulating film 104 is an insulating film formed on the barrier insulating film 103. Examples of the interlayer insulating film 104 may include a silicon oxide film and a low dielectric film (for example, a SiOCH film) having a relative dielectric constant lower than that of a silicon oxide film. The interlayer insulating film 104 may be implemented in a stack of a plurality of insulating films. A wiring trench to bury the first wiring 105 is formed in the interlayer insulating film 104 such that the first wiring 105 is buried in the wiring trench through the barrier metal 106.

The first wiring 105 is wiring buried through the barrier metal 106 in the wiring trench formed in the interlayer insulating film 104 and the barrier insulating film 103. The first wiring 105 serves as the first electrode of the two-terminal switch 109 and is in contact with the first ion conductive layer 108a. The second ion conductive layer 108b has its lower surface in contact with the first ion conductive layer 108a and its upper surface in contact with the second electrode 110. The first wiring 105 is made of a diffusible metal capable of ion conduction in the first ion conductive layer 108a and the second ion conductive layer 108b and can use, for example, copper. The first wiring 105 may also be alloyed with aluminum.

The barrier metal 106 is a conductive film which has barrier properties and covers the wiring side to bottom surfaces to prevent diffusion of the metal associated with the first wiring 105 to the interlayer insulating film 104 and underlying layers. When the first wiring 105 is made of a metal containing, for example, copper as the main component, the barrier metal 106 can use a refractory metal or its nitride, such as tantalum, tantalum nitride, titanium nitride, or tungsten carbonitride, or their stacked film.

The barrier insulating film 107 is formed on the interlayer insulating film 104 including the first wiring 105 to prevent oxidation of the metal (for example, copper) associated with the first wiring 105. The barrier insulating film 107 also prevents diffusion of the metal associated with the first wiring 105 into the interlayer insulating film 114. The barrier insulating film 107 serves as an etching stop layer during processing of the first ion conductive layer 108a, the second ion conductive layer 108b, the second electrode 110, the resistive-change layer 111, and the third electrode 112. Examples of the barrier insulating film 107 may include a silicon carbonitride film, a silicon nitride film, and their stack. The barrier insulating film 107 is preferably made of the same material as those of the protective insulating film 113 and the hard mask film 121.

The first ion conductive layer 108a and the second ion conductive layer 108b are films, the resistances of which undergo a non-volatile change. The first ion conductive layer 108a and the second ion conductive layer 108b can be made of a material, the resistance of which changes due to an action (for example, diffusion or ion conduction) of the metal associated with the first wiring 105 (first electrode). Films capable of ion conduction are used when metal ion precipitation brings about a change in resistance of the two-terminal switch 109.

The second ion conductive layer 108b is formed using the plasma CVD (Chemical Vapor Deposition) method. Supply of RF (Radio Frequency) power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

The first ion conductive layer 108a serves to prevent diffusion of the metal associated with the first wiring 105 into the second ion conductive layer 108b due to heating or a plasma during deposition of the second ion conductive layer 108b. The first ion conductive layer 108a also serves to prevent oxidation of the first wiring 105, the oxidation of which promotes diffusion. The metal of the first ion conductive layer 108a, for example, titanium, aluminum, or their stack, turns into titanium oxide, aluminum oxide, or their stack during deposition of the second ion conductive layer 108b, and forms part of the ion conductive layer. The optimum total thickness of the metal of the first ion conductive layer 108a is 1 nm; the use of thicknesses smaller than 1 nm slightly oxidizes the copper wiring surface while the use of thicknesses larger than 1 nm makes the metal remain partly unoxidized.

The first ion conductive layer 108a and the second ion conductive layer 108b are formed on the surfaces of the first wiring 105, a tapered face defining the opening in the barrier insulating film 107, and the barrier insulating film 107. The outer peripheral portion of the portion connecting the first wiring 105 to the first ion conductive layer 108a is located at least along the tapered face defining the opening in the barrier insulating film 107.

The first ion conductive layer 108a may form a stack of titanium and aluminum or be implemented in single-layered titanium and aluminum films.

The second electrode 110 serves as the upper electrode of the two-terminal switch 109 and is in contact with the second ion conductive layer 108b. The second electrode 110 contains a metal which is less likely to ionize and, in turn, is less likely to diffuse and ionically conduct in the second ion conductive layer 108b than the metal associated with the first wiring 105. Examples include alloys of ruthenium and titanium, tantalum, aluminum, manganese, zirconium, hafnium, magnesium, cobalt, copper, and zinc exhibiting high adhesion strength to the metal associated with the first wiring 105. The ruthenium content is desirably 10% (inclusive) to 80% (inclusive). Ruthenium may be doped with two or more types of metals.

As a metal with which ruthenium is doped in the second electrode 110, a metal having a standard Gibbs energy higher in the negative direction than that of ruthenium is desirably selected. Titanium, tantalum, aluminum, manganese, zirconium, hafnium, magnesium, cobalt, copper, and zinc having a standard Gibbs energy higher in the negative direction than that of ruthenium are more likely to cause spontaneous chemical reactions than ruthenium. Hence, the use of an alloy of ruthenium as the second electrode 110 may improve the adhesion strength to a metal bridge formed by the metal associated with the first wiring 105.

When, however, the second electrode 110 is formed using only a metal with which ruthenium is doped, the obtained electrode has a standard Gibbs energy equal to or higher in the negative direction than that of the metal associated with the first wiring 105. An ON to OFF transition progresses upon oxidation (dissolution) of the metal bridge. When the standard Gibbs energy of the second electrode 110 is higher in the negative direction than that of the metal associated with the first wiring 105, a transition to OFF state is impossible because oxidation of the second electrode 110 progresses more than oxidation of the metal bridge formed using the metal associated with the first wiring 105. Therefore, the second electrode 110 needs to be made of an alloy of ruthenium having a standard Gibbs energy lower in the negative direction than that of copper.

The rectifying element 120 changes to ON state at a voltage having an absolute value smaller than that of the voltage at which the two-terminal switch 109 changes to ON or OFF state. The ON state is volatile and a transition to OFF state takes place upon a drop in voltage. The two-terminal switch 109 performs no switching operation at a voltage which does not change the rectifying element 120 to ON state.

The resistive-change layer 111 is an insulating film, the resistance of which undergoes a volatile change, and is implemented in a single-layered metal oxide film or a stack of metal oxide films. The resistive-change layer 111 is implemented in, for example, single-layered tantalum oxide, titanium oxide, niobium oxide, and aluminum oxide films, or their stack. The resistive-change layer 111 is formed as a metal oxide by metal deposition and exposure to an oxygen plasma. Alternatively, a metal oxide is formed by depositing a metal within a chamber charged with oxygen. The resistive-change layer 111 may be formed by the co-sputtering method for simultaneously sputtering tantalum, titanium, niobium, and aluminum within the same chamber and then be oxidized with an oxygen plasma. Similarly, oxygen may be introduced during deposition by the co-sputtering method to form a metal oxide film.

The third electrode 112 serves as the upper electrode of the rectifying element 120 and is formed on the resistive-change layer 111. The third electrode 112 serves to protect the stacked structure of the rectifying element 120 in the resistive-change layer 111 and an underlying layer, and the stacked structure of the two-terminal switch 109. More specifically, the resistive-change layer 111 can restrain damage to the stacked structure of the rectifying element 120 in the resistive-change layer 111 and an underlying layer, and the stacked structure of the two-terminal switch 109 during the process, to maintain given switching characteristics of the two-terminal switch 109 and the rectifying element 120. The third electrode 112 can use, for example, tantalum, titanium, tungsten, or their nitrides.

The hard mask film 121 serves both as a hard mask film and a passivation film in etching the third electrode 112, the resistive-change layer 111, the second electrode 110, the second ion conductive layer 108b, and the first ion conductive layer 108a. Examples of the hard mask film 121 may include a silicon nitride film. The hard mask film 121 is preferably made of the same material as those of the protective insulating film 113 and the barrier insulating film 107. More specifically, surrounding the two-terminal switch 109 and the rectifying element 120 by the same material makes it possible to integrate the material interfaces together, thereby preventing entrance of, for example, moisture from the outside and further preventing desorption from the two-terminal switch 109 and the rectifying element 120.

The two-terminal switch 109 and the rectifying element 120 are etched using the hard mask film 121 as an etching mask. The second electrode 110 implemented in an alloy electrode containing ruthenium as the main component is etched by charging oxygen, nitrogen, and chlorine into a chamber as etching gases. An oxidized region 122 serving as an insulator is formed on the upper portion and side surface of the third electrode 112 and the side surface of the resistive-change layer 111 by oxygen that is one of the etching gases. The side surfaces mean herein the peripheral portions of the third electrode 112 and the resistive-change layer 111.

The protective insulating film 113 is an insulating film which functions to prevent desorption of oxygen from the first ion conductive layer 108a, the second ion conductive layer 108b, and the resistive-change layer 111 while inflicting no damage on the two-terminal switch 109 and the rectifying element 120. Examples of the protective insulating film 113 may include a silicon nitride film and a silicon carbonitride film. The protective insulating film 113 is preferably made of the same material as those of the hard mask film 121 and the barrier insulating film 107. In the case of the same material, the protective insulating film 113 can be integrated with the barrier insulating film 107 and the hard mask film 121 to improve the adhesion strength of the interfaces and more reliably protect the two-terminal switch 109 and the rectifying element 120.

The interlayer insulating film 114 is an insulating film formed on the protective insulating film 113. Examples of the interlayer insulating film 114 may include a silicon oxide film, a SiOC film, and a low dielectric film (for example, a SiOCH film) having a relative dielectric constant lower than that of a silicon oxide film. The interlayer insulating film 114 may be implemented in a stack of a plurality of insulating films. The interlayer insulating film 114 may be made of the same material as that of the interlayer insulating film 104. A pilot hole to bury the plug 117 is formed in the interlayer insulating film 114 such that the plug 117 is buried in the pilot hole through the barrier metal 118.

The interlayer insulating film 115 is an insulating film formed on the interlayer insulating film 114. Examples of the interlayer insulating film 115 may include a silicon oxide film, a SiOC film, and a low dielectric film (for example, a SiOCH film) having a relative dielectric constant lower than that of a silicon oxide film. The interlayer insulating film 115 may be implemented in a stack of a plurality of insulating films. The interlayer insulating film 115 may be made of the same material as that of the interlayer insulating film 114. A wiring trench to bury the second wiring 116 is formed in the interlayer insulating film 115 such that the second wiring 116 is buried in the wiring trench through the barrier metal 118.

The second wiring 116 is wiring buried through the barrier metal 118 in the wiring trench formed in the interlayer insulating films 115 and 114. The second wiring 116 is integrated with the plug 117. The plug 117 is buried through the barrier metal 118 in the pilot hole formed in the interlayer insulating film 114, the protective insulating film 113, and the hard mask film 121. The plug 117 is electrically connected to the third electrode 112 via the barrier metal 118. The second wiring 116 and the plug 117 can use, for example, copper.

The barrier metal 118 is a conductive film which has barrier properties and covers the side to bottom surfaces of the second wiring 116 and the plug 117 to prevent diffusion of the metal associated with the second wiring 116 (including the plug 117) to the interlayer insulating films 115 and 114 and underlying layers. When the second wiring 116 and the plug 117 are made of a metal containing, for example, copper as the main component, the barrier metal 118 can use a refractory metal or its nitride, such as tantalum, tantalum nitride, titanium nitride, or tungsten carbonitride, or their stacked film. The barrier metal 118 is preferably made of the same material as that of the third electrode 112. When the barrier metal 118 has, for example, a stack of tantalum nitride (lower layer)/tantalum (upper layer), tantalum nitride employed as the lower layer material is preferably used for the third electrode 112.

The barrier insulating film 119 is an insulating film which is formed on the interlayer insulating film 115 including the second wiring 116, and serves to prevent oxidation of the metal (for example, copper) associated with the second wiring 116 and prevent diffusion of the metal associated with the second wiring 116 to upper layers. Examples of the barrier insulating film 119 may include a silicon carbonitride film, a silicon nitride film, and their stack.

(Etching)

Etching of the two-terminal switch and the rectifying element illustrated in FIG. 1 will be described below with reference to FIG. 1.

Although oxygen is generally employed as an etching gas for ruthenium that is one of substances that constitute an alloy used for the second electrode 110, oxygen reacts with tantalum or titanium acting as a doping metal so as to form tantalum oxide or titanium oxide, leading to an etching rate too low to perform etching. Although the second electrode 110 can be processed for chlorine substances ($Cl_2$ and $BCl_3$) or fluorine substances ($CF_4$ and $CHF_3$) serving as etching gases for titanium or tantalum, the wiring layer may be exposed after switching element processing, because of the high etching rate of the barrier insulating film 107.

Figure 2:
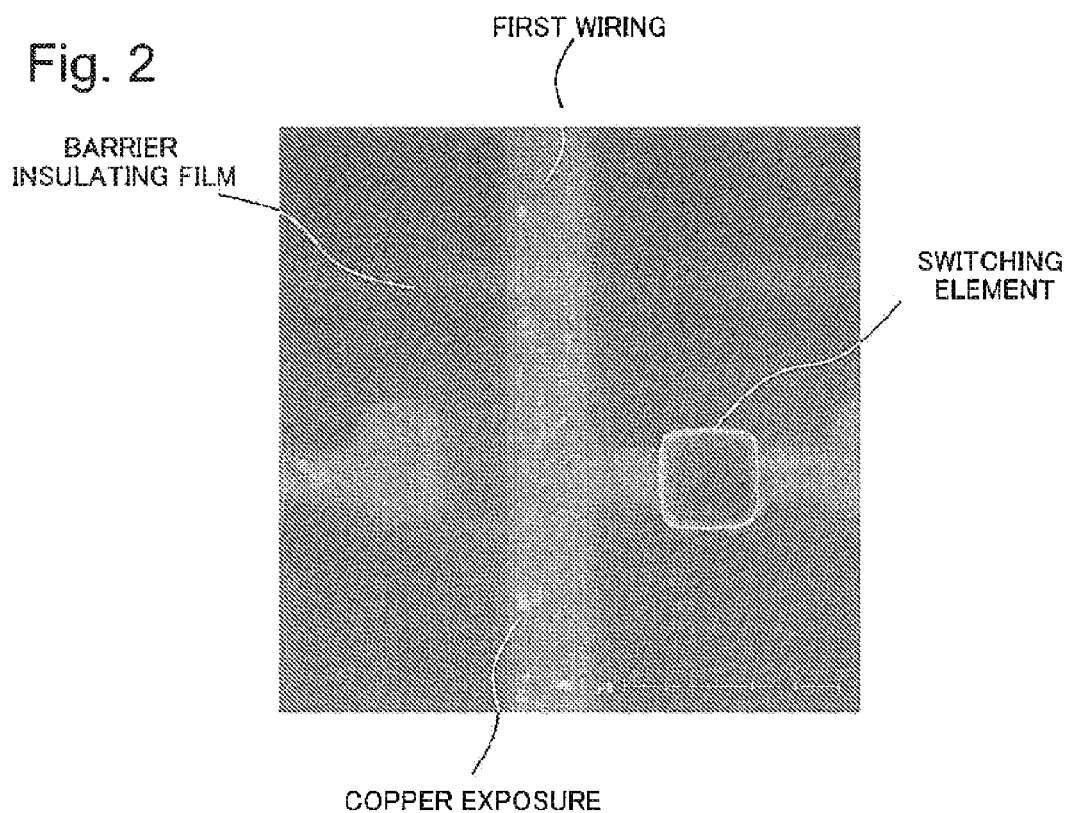
FIG. 2 is a scanning electron microscope image of a two-terminal switching element when viewed from the top, according to a Comparative Example to the first exemplary embodiment of the present invention.

FIG. 2 illustrates a scanning electron microscope image (to be simply referred to as an SEM image hereinafter) as seen from the top, when 200-sccm $Cl_2$ and 100-sccm $BCl_3$ that are chlorine substances and 160-sccm nitrogen were charged into a chamber and etching was performed, according to a Comparative Example to this exemplary embodiment. At this time, the source power was 200 W, the bias power was 800 W, and the pressure in the chamber was 10 mTorr. Referring to FIG. 2, the first wiring 105 located under the barrier insulating film 107 is partially exposed. In this state, the copper that constitutes the first wiring 105 diffuses into the protective insulating film 113 and the interlayer insulating film 114, thus increasing the leakage current between adjacent plugs 117.

To process an alloy electrode containing ruthenium as the main component and ensure a given etching selectivity to the barrier insulating film, oxygen, chlorine, and nitrogen are used as etching gases. For etching gases of a chlorine substance and nitrogen, the ratio of the etching rate of a silicon carbonitride film which forms the barrier insulating film 107 to that of an alloy of 75% ruthenium and 25% tantalum which forms the second electrode 110 was 12.8 to 1. In contrast to this, the use of etching gases of oxygen, chlorine, and nitrogen reduced this ratio to a minimum of 0.94 to 1.

Figure 3:
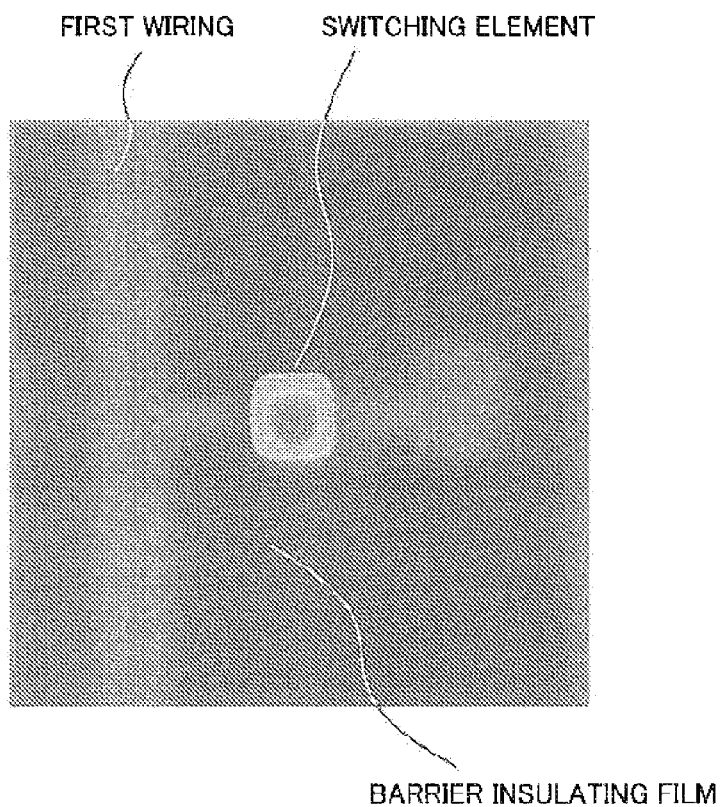
FIG. 3 is a scanning electron microscope image of the two-terminal switching element when viewed from the top, according to the first exemplary embodiment of the present invention.

FIG. 3 illustrates an SEM image as seen from the top, when 100-sccm oxygen, 50-sccm chlorine, and 50-sccm nitrogen were charged into a chamber and etching was performed, according to this exemplary embodiment. At this time, the source power was 900 W, the bias power was 900 W, and the pressure in the chamber was 4 mTorr. The two-terminal switch 109 and the rectifying element 120 can be processed without exposing the first wiring 105 located under the barrier insulating film 107.

Introducing oxygen oxidizes an etching product deposited on the upper surface of the third electrode 112 and the side surfaces of the third electrode 112 and the resistive-change layer 111 exposed due to degeneration of the hard mask film 121 during etching. This makes it possible to prevent breakdowns resulting from short-circuiting between the third electrode 112 and the second electrode 110 due to redeposition of a metal-derived etching product.

Figure 4:
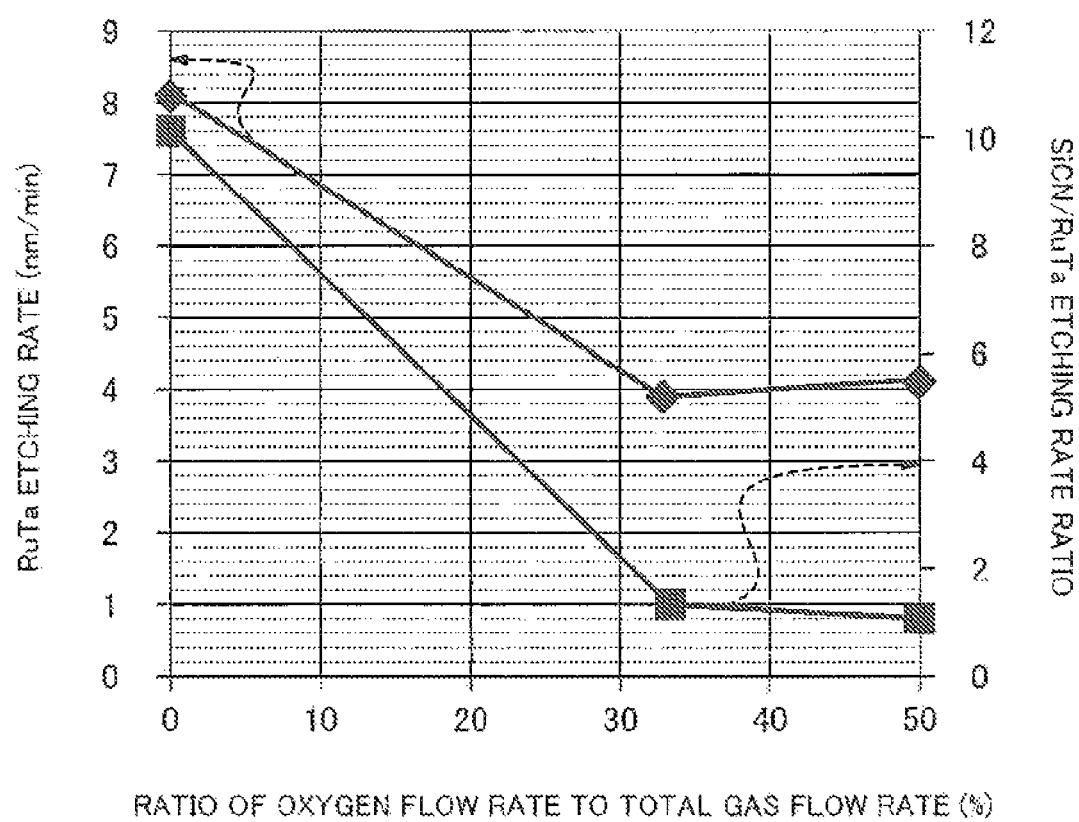
FIG. 4 is a graph showing the etching characteristics of the two-terminal switching element according to the first exemplary embodiment of the present invention.

FIG. 4 illustrates the etching rate of an alloy of 75% ruthenium and 25% tantalum and the etching rate ratio between the alloy and the silicon carbonitride as functions of the ratio of the oxygen flow rate to the total gas flow rate when the source power was 900 W, the bias power was 160 W, and the pressure in the chamber was 4 mTorr. The etching rate ratio decreased with an increase in ratio of oxygen. The etching rate of the alloy electrode decreased until the ratio of the oxygen flow rate reached 33% but thereafter increased until the ratio of the oxygen flow rate reached 50%. This tendency reveals that the appropriate oxygen flow rate is about 50%.

Figure 5:
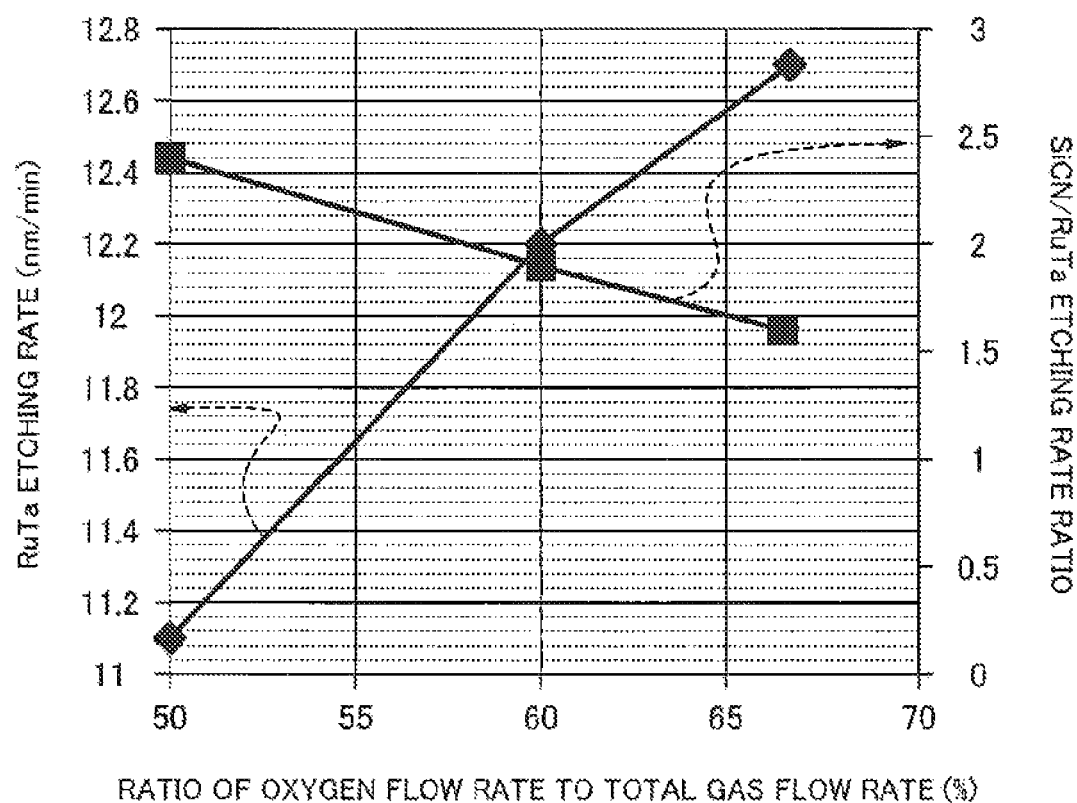
FIG. 5 is another graph showing the etching characteristics of the two-terminal switching element according to the first exemplary embodiment of the present invention.

FIG. 5 illustrates the etching rate of an alloy of 75% ruthenium and 25% tantalum and the etching rate ratio between the alloy and the silicon carbonitride as functions of the ratio of the oxygen flow rate to the total gas flow rate when the source power was 900 W, the bias power was 900 W, and the pressure in the chamber was 4 mTorr. Compared to the result shown in FIG. 3, the etching rate of the alloy electrode increased because the bias power was set higher. This occurred because setting the bias power higher led to a larger amount of ion incidence of the etching gas on the etching object. As can be seen from FIG. 5, when the ratio of the oxygen flow rate to the total gas flow rate exceeds 50%, the etching rate of the alloy increases while the etching rate ratio of the alloy to the silicon carbonitride decreases, with an increase in ratio of the oxygen flow rate.

Chlorine is used to decompose base metal components, such as tantalum and titanium, of the alloy electrode, although too much chlorine raises the etching rate of the silicon carbonitride in excess of a given threshold. Oxygen accelerates decomposition of ruthenium and discharge of an etching product. Nitrogen serves to dilute the entire etching gas to keep the etching rate of a barrier insulating film made of a nitride low, although too much nitrogen lowers the etching rate of the alloy electrode in excess of a given threshold. As can be seen from the results illustrated in FIGS. 4 and 5, the chlorine:nitrogen:oxygen ratio of the etching gas is desirably 15 to 25%:15% to 25%:50% to 70%.

The second ion conductive layer 108b and the first ion conductive layer 108a are also processed during etching of the second electrode 110.

(Switching Operation)

Figure 6:
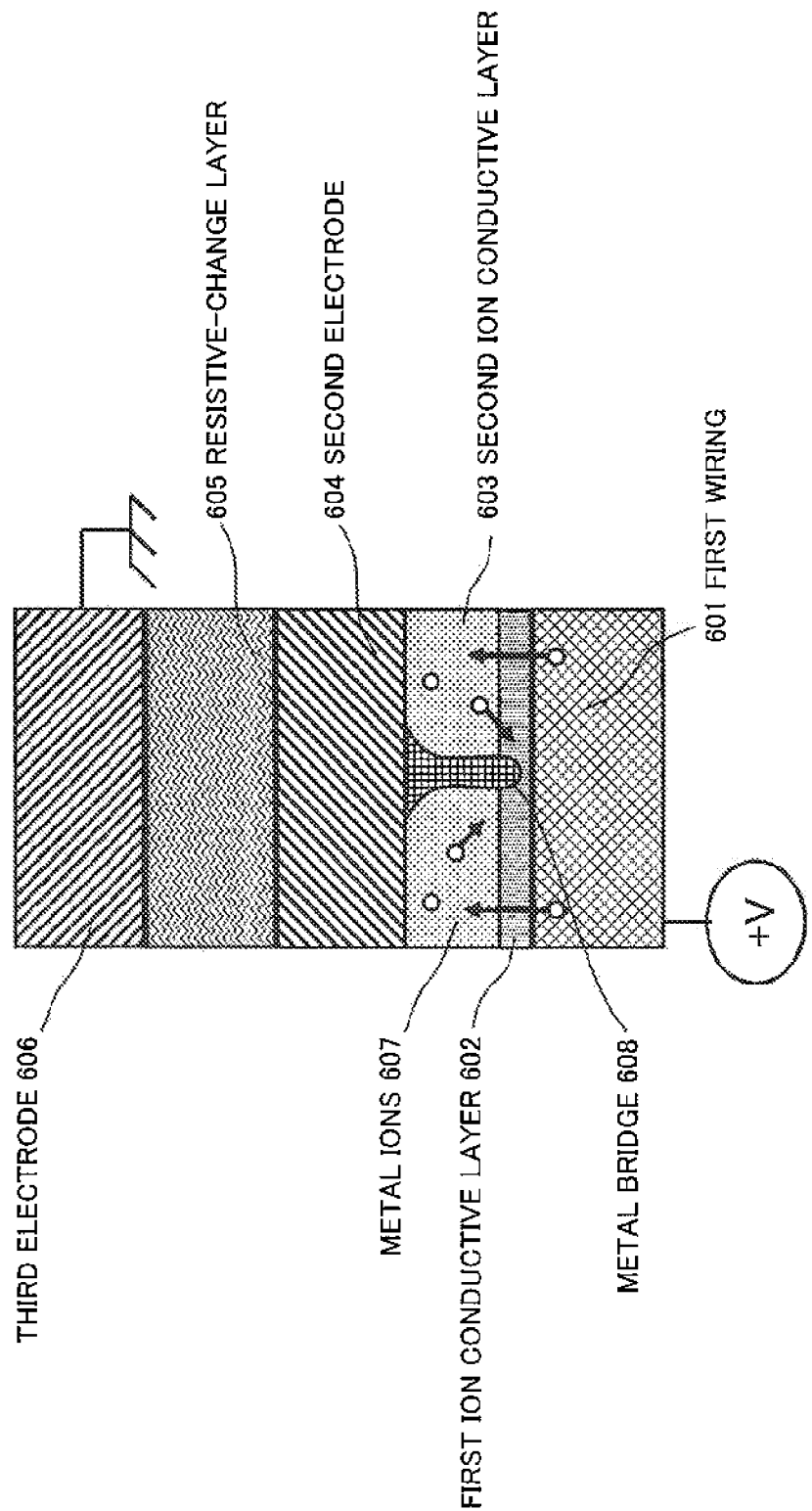
FIG. 6 is a schematic view illustrating the switching operation of the two-terminal switching element according to the first exemplary embodiment of the present invention.
Figure 7:
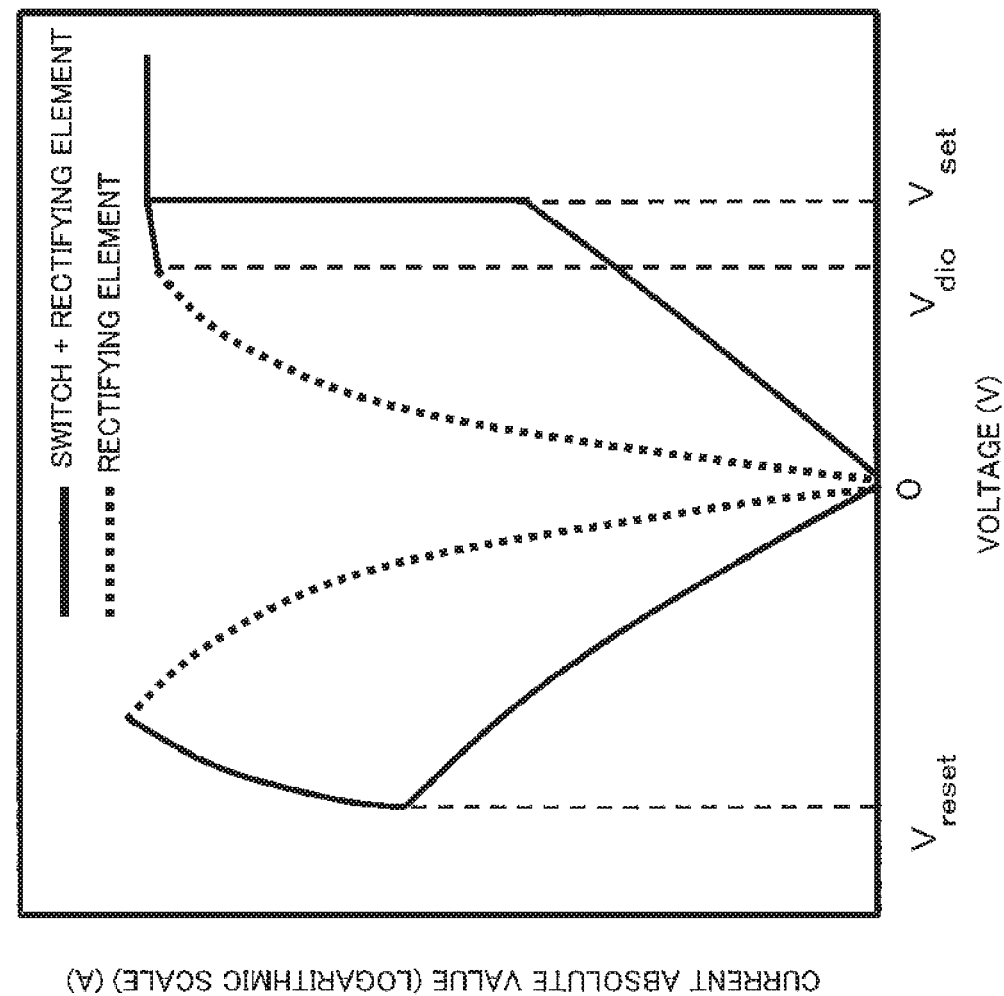
FIG. 7 is a graph showing the switching characteristics of the two-terminal switching element according to the first exemplary embodiment of the present invention.

The operation of the two-terminal switch illustrated in FIG. 1 will be described below with reference to FIGS. 6 and 7. FIG. 6 schematically illustrates the switching characteristics of the two-terminal switch and the rectifying element according to this exemplary embodiment.

A positive voltage is applied to first wiring 601 and a third electrode 606 is grounded. The voltage is applied upon being distributed to the two-terminal switch and the rectifying element in accordance with respective resistance values. As the applied voltage rises in the positive direction, the rectifying element changes to volatile ON state at $V_{dio}$ in FIG. 7. On the side of voltages higher than $V_{dio}$, most of the voltage is applied to the two-terminal switch so that copper which is ionized by an electrochemical reaction and leaves the first wiring 601 migrates into a first ion conductive layer 602 and a second ion conductive layer 603, and the ionized copper receives electrons from a second electrode 604 and begins to precipitate as copper. The precipitated copper acts as a metal bridge 608 to connect the first wiring 601 to the second electrode 604, resulting in a transition to ON state at $V_{set}$. In the process of returning the voltage to zero from $V_{set}$, a current curve corresponding to the current-voltage characteristics of the rectifying element is observed.

When the first wiring 601 is grounded and a positive voltage is applied to the third electrode 606, that is, as the voltage applied to the first wiring 601 rises in the negative direction, a current curve corresponding to the current-voltage characteristics of the rectifying element is observed. Applying a negative voltage promotes dissolution of the metal bridge 608 so that the metal bridge 608 connecting the first wiring 601 to the second electrode 604 extinguishes, resulting in a transition to OFF state at $V_{reset}$.

At this time, the copper that has constituted the metal bridge 608 is recovered to the first wiring 601.

(Manufacturing Method)

A method for manufacturing a semiconductor device including a switching element according to this exemplary embodiment will be described next with reference to the accompanying drawings. FIGS. 8A to 8L are process sectional views schematically illustrating a method for manufacturing a semiconductor device including a switching element according to this exemplary embodiment.

Figure 8A:
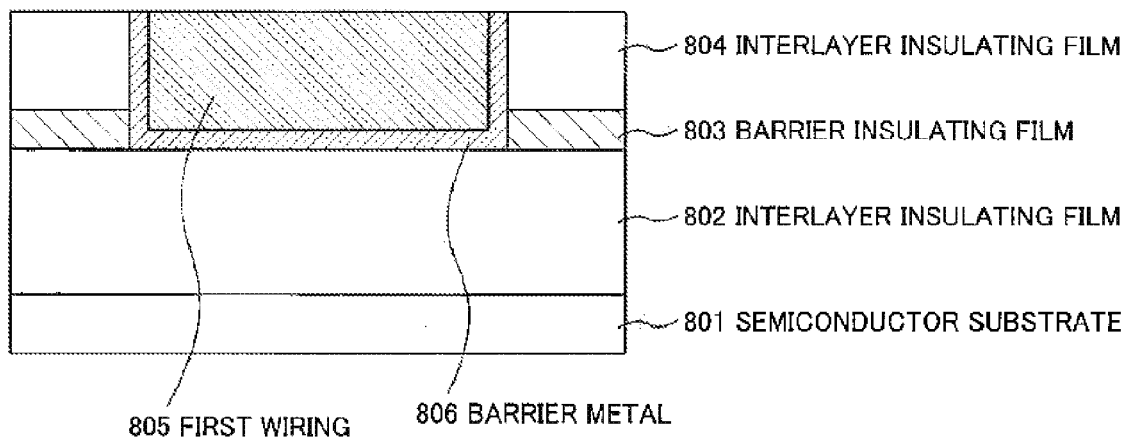
FIG. 8A is a schematic sectional view illustrating a process (process 1) of manufacturing a semiconductor device including a two-terminal switching element according to the first exemplary embodiment of the present invention.

[Process 1] (FIG. 8A)

An interlayer insulating film 802 (for example, a 300-nm thick silicon oxide film) is deposited on a semiconductor substrate 801 (for example, a substrate including semiconductor elements). A barrier insulating film 803 (for example, a 30-nm thick silicon nitride film) is also deposited on the interlayer insulating film 802. An interlayer insulating film 804 (for example, a stack of a 150-nm thick SiCHO film and a 100-nm thick silicon oxide film) is moreover deposited on the barrier insulating film 803. A wiring trench is formed in the interlayer insulating film 804 and the barrier insulating film 803 using the lithography method (including photoresist formation, dry etching, and photoresist removal). First wiring 805 (for example, copper) is buried in the wiring trench through a barrier metal 806 (for example, 5-nm/5-nm thick tantalum nitride/tantalum films).

Interlayer insulating films 802 and 804 can be formed by the plasma CVD method. First wiring 805 is formed in the following way: a barrier metal 806 (for example, a stacked film of tantalum nitride/tantalum) is formed by the PVD (Physical Vapor Deposition) method, a copper seed is formed by the PVD method, and the copper is buried in the wiring trench by the electroplating method. The first wiring 805 can be formed by performing a heat treatment at temperatures of 200° C. or more and removing excess copper except in the wiring trench by the CMP (Chemical Mechanical Polishing) method.

A general technique in the technical field of the art can be employed as such a series of methods for forming copper wiring. The CMP method means herein a method for polishing and planarizing projections and recesses on a wafer surface, which are produced during a multilayer wiring formation process, by bringing them into contact with a polishing pad rotated while supplying a polishing solution to the wafer surface. With the CMP method, planarization is performed by polishing excess copper buried in a trench to form buried wiring (damascene wiring) or polishing an interlayer insulating film.

Figure 8B:
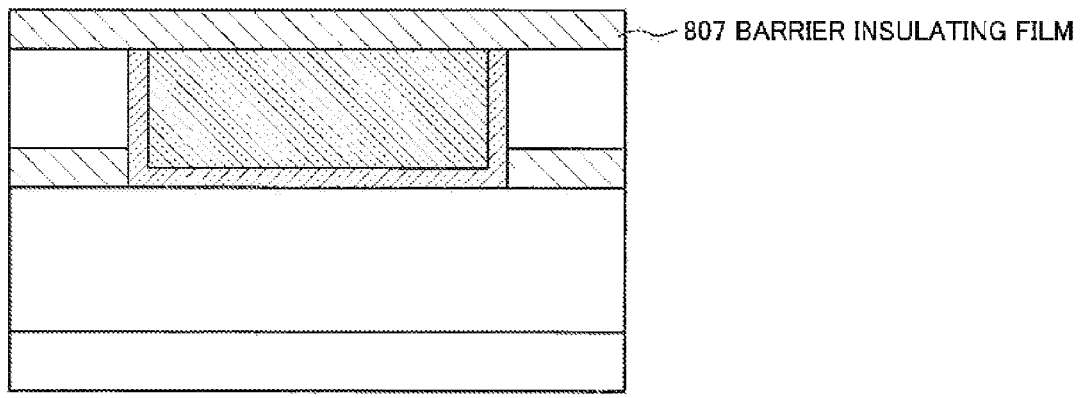
FIG. 8B is a schematic sectional view illustrating another process (process 2) of manufacturing the semiconductor device including the two-terminal switching element according to the first exemplary embodiment of the present invention.

[Process 2] (FIG. 8B)

A barrier insulating film 807 (for example, a 30-nm thick silicon nitride or silicon carbonitride film) is formed on the interlayer insulating film 804 including the first wiring 805. The barrier insulating film 807 can be formed by the plasma CVD method. The thickness of the barrier insulating film 807 is preferably about 10 nm to 50 nm.

Figure 8C:
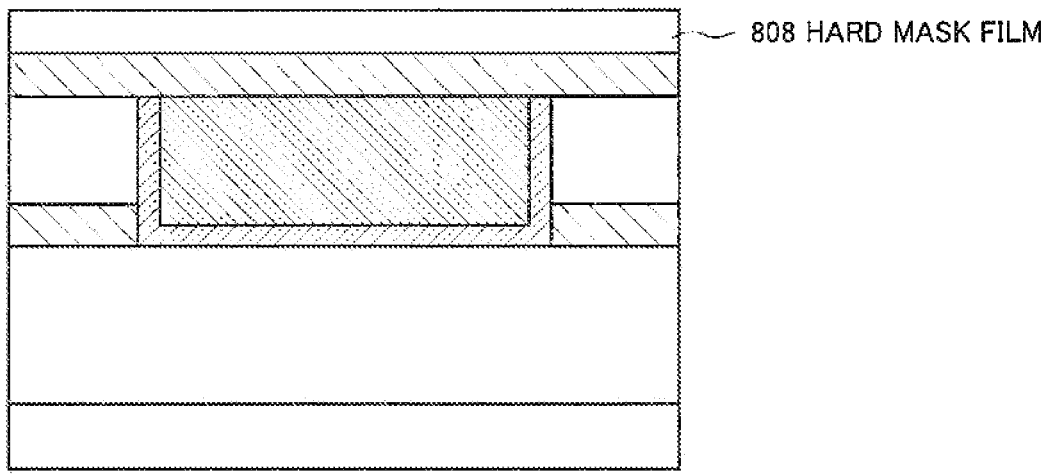
FIG. 8C is a schematic sectional view illustrating still another process (process 3) of manufacturing the semiconductor device including the two-terminal switching element according to the first exemplary embodiment of the present invention.

[Process 3] (FIG. 8C)

A hard mask film 808 (for example, a 40-nm thick silicon oxide film) is formed on the barrier insulating film 807. Note that in terms of maintaining a high etching selectivity in dry etching, the hard mask film 808 is preferably made of a material different from that of the barrier insulating film 807 and may either be an insulating or conductive film. Examples of the hard mask film 808 may include a silicon oxide film, a silicon nitride film, titanium nitride, titanium, tantalum, and tantalum nitride, as well as a stack of silicon nitride/silicon oxide films.

Figure 8D:
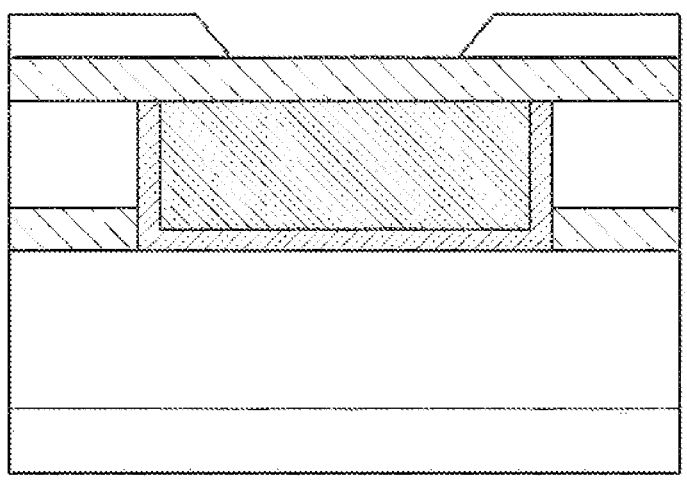
FIG. 8D is a schematic sectional view illustrating still another process (process 4) of manufacturing the semiconductor device including the two-terminal switching element according to the first exemplary embodiment of the present invention.

[Process 4] (FIG. 8D)

An opening pattern is formed in the hard mask film 808 by patterning the hard mask film 808 with an opening using a photoresist (not illustrated), and performing dry etching using the photoresist as a mask. The photoresist is then stripped by, for example, oxygen plasma ashing. At this time, dry etching need not always be stopped on the upper surface of the barrier insulating film 807 and may have reached into the barrier insulating film 807.

Figure 8E:
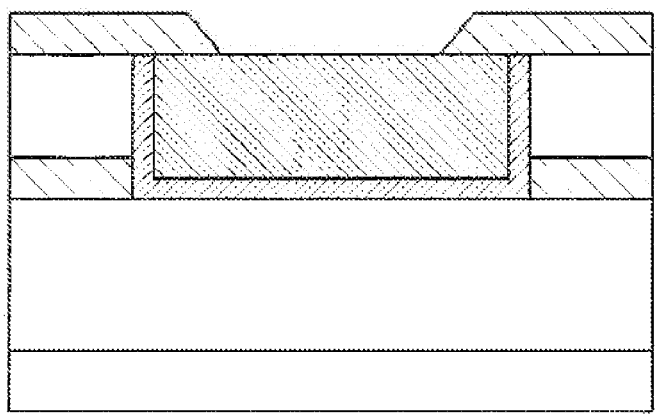
FIG. 8E is a schematic sectional view illustrating still another process (process 5) of manufacturing the semiconductor device including the two-terminal switching element according to the first exemplary embodiment of the present invention.

[Process 5] (FIG. 8E)

The barrier insulating film 807 exposed from the opening in the hard mask film 808 is etched back (processed by dry etching) using the hard mask film 808 as a mask to form an opening in the barrier insulating film 807 so that the first wiring 805 is exposed from the opening in the barrier insulating film 807. Etching back the barrier insulating film 807 makes it possible to form the wall surface defining the opening in the barrier insulating film 807 into a tapered face, using reactive dry etching. Reactive dry etching can use a gas containing fluorocarbon as an etching gas.

The hard mask film 808 is preferably removed completely during an etch-back operation but may remain intact in the case of an insulating material. The shape of the opening in the barrier insulating film 807 can be a circle having a diameter of 30 nm to 500 nm. The oxide on the surface of the first wiring 805 is removed by RF (Radio Frequency; high frequency) etching that uses a non-reactive gas. Helium or argon can be used as the non-reactive gas.

Figure 8F:
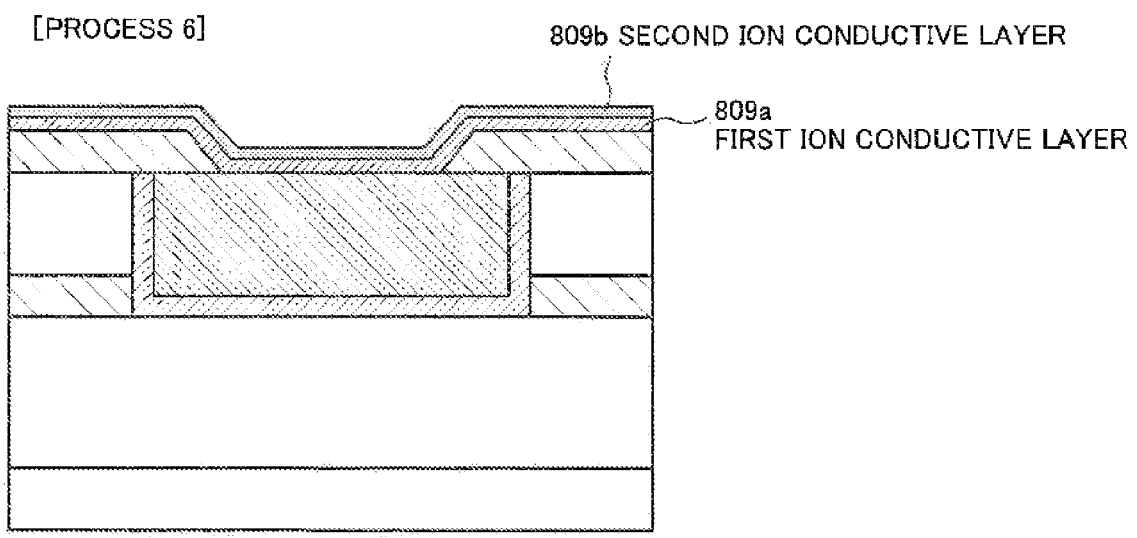
FIG. 8F is a schematic sectional view illustrating still another process (process 6) of manufacturing the semiconductor device including the two-terminal switching element according to the first exemplary embodiment of the present invention.

[Process 6] (FIG. 8F)

Titanium and aluminum are deposited by 0.5 nm or less in this order on the barrier insulating film 807 including the first wiring 805. Titanium and aluminum can be formed using the PVD or CVD method. A SIOCH polymer film containing silicon, oxygen, carbon, and hydrogen is formed as a second ion conductive layer 809$b$ by plasma CVD. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

Titanium and aluminum are exposed to a source of a SIOCH polymer film containing oxygen during the formation of the second ion conductive layer 809$b$ and thereby automatically oxidize into oxides, which form a first ion conductive layer 809$a$ and part of the second ion conductive layer 809$b$. The portions defining the opening in the barrier insulating film 807 have moisture and the like adhering to them upon an organic stripping process and are, therefore, preferably degassed by a heat treatment under reduced pressure at temperatures of about 250° C. to 350° C. before deposition of the first ion conductive layer 809$a$.

Figure 8G:
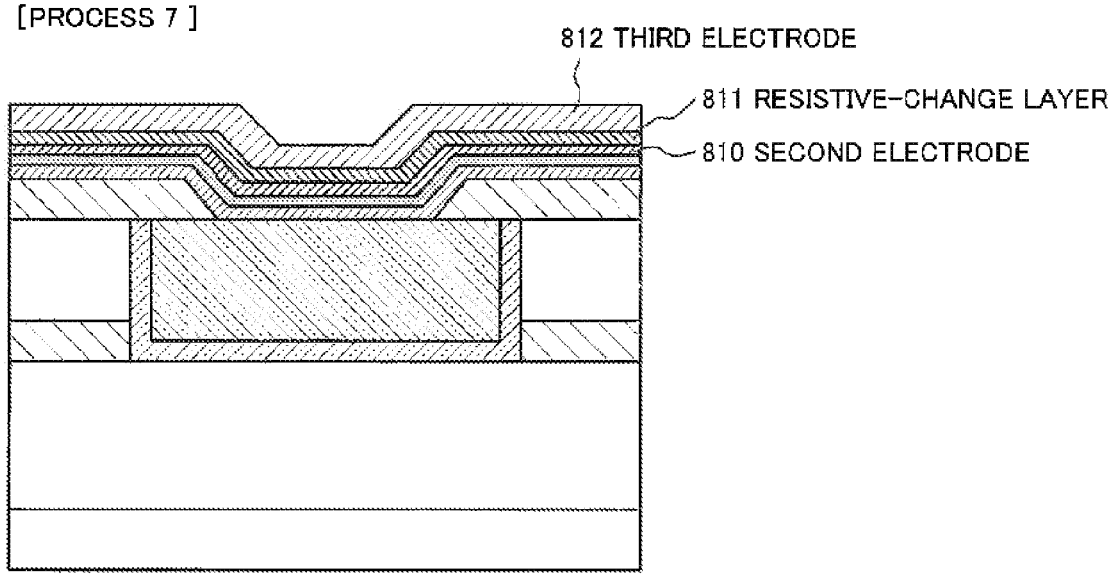
FIG. 8G is a schematic sectional view illustrating still another process (process 7) of manufacturing the semiconductor device including the two-terminal switching element according to the first exemplary embodiment of the present invention.

[Process 7] (FIG. 8G)

A 5-nm thick film made of an alloy of ruthenium and tantalum is formed on the second ion conductive layer 809$b$ as a second electrode 810 by the co-sputtering method. At this time, ruthenium and tantalum targets are present in the same chamber and simultaneously sputtered to deposit an alloy film. A power of 150 W is supplied to the ruthenium target and a power of 50 W is supplied to the tantalum target to obtain a ruthenium content of 75%.

A resistive-change layer 811 (for example, a 5-nm thick tantalum oxide film), the resistance of which undergoes a volatile change, is deposited on the second electrode 810 and a third electrode 812 (for example, a 25-nm thick tantalum film) is further formed. The resistive-change layer 811 is formed as a metal oxide and may be formed using either the plasma oxidation method for sputtering a metal and oxidizing it by exposure to an oxygen plasma, or the reactive sputtering method for introducing oxygen during sputtering.

Figure 8H:
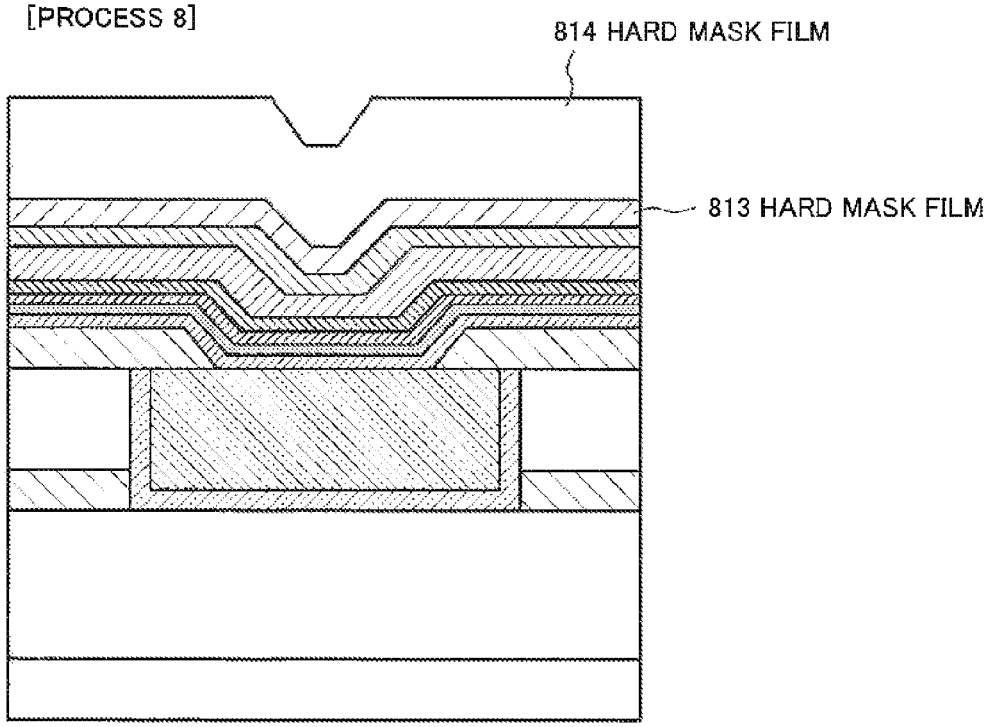
FIG. 8H is a schematic sectional view illustrating still another process (process 8) of manufacturing the semiconductor device including the two-terminal switching element according to the first exemplary embodiment of the present invention.

[Process 8] (FIG. 8H)

A hard mask film 813 (for example, a 30-nm thick silicon nitride or silicon carbonitride film) and a hard mask film 814 (for example, a 100-nm thick silicon oxide film) are stacked on the third electrode 812 in this order. The hard mask films 813 and 814 can be deposited using the plasma CVD method. The hard mask films 813 and 814 can be formed using the general plasma CVD method in the technical field of the art.

The hard mask films 813 and 814 are preferably different types of films and can be implemented using, for example, a silicon carbonitride film for the hard mask film 813 and a silicon oxide film for the hard mask film 814. In this case, the hard mask film 813 is preferably made of the same material as those of a protective insulating film and a barrier insulating film (to be described later). More specifically, surrounding the entire resistive-change element by the same material makes it possible to integrate the material interfaces together, thereby preventing entrance of, for example, moisture from the outside and further preventing desorption from the resistive-change element.

[Process 9] (FIG. 8I)

A photoresist (not illustrated) for forming a two-terminal switch and a rectifying element by patterning is formed on the hard mask film 814 and used as a mask to perform dry etching of the hard mask film 814 until the hard mask film 813 becomes exposed. The photoresist is then removed by oxygen plasma ashing and organic stripping.

[Process 10] (FIG. 8J)

Dry etching is continuously performed on the hard mask film 813, the third electrode 812, the resistive-change layer 811, the second electrode 810, the second ion conductive layer 809b, and the first ion conductive layer 809a using the hard mask film 814 as a mask. At this time, the hard mask film 814 is preferably removed completely during an etch-back operation but may remain intact. When, for example, the third electrode 812 is made of tantalum and the resistive-change layer 811 is made of tantalum oxide, they can be processed using chlorine-based RIE (Reactive Ion Etching). When the second electrode 810 is made of an alloy of ruthenium and tantalum, it is desirably processed using a gas mixture of chlorine, nitrogen, and oxygen at a chlorine:nitrogen:oxygen ratio of, for example, 25%:25%:50%.

The second ion conductive layer 809b and the first ion conductive layer 809a under the second electrode 810 can also be etched using the same gas as that used for the second electrode. As a result, dry etching can be stopped on the lower, barrier insulating film 807. The use of such a hard mask RIE method allows the resistive-change element portion to be processed without exposure to oxygen plasma ashing for resist removal.

When an oxidation process is performed using an oxygen plasma after processing, oxygen plasma irradiation is possible independently of the resist stripping time. By oxygen used during etching of layers under the second electrode 810, a metal-derived etching product deposited on the side surface and part of the upper surface of the third electrode 812 and the side surface of the resistive-change layer 811 exposed due to degeneration of the hard mask film 813 oxidizes into an oxidized region 815.

Figure 8K:
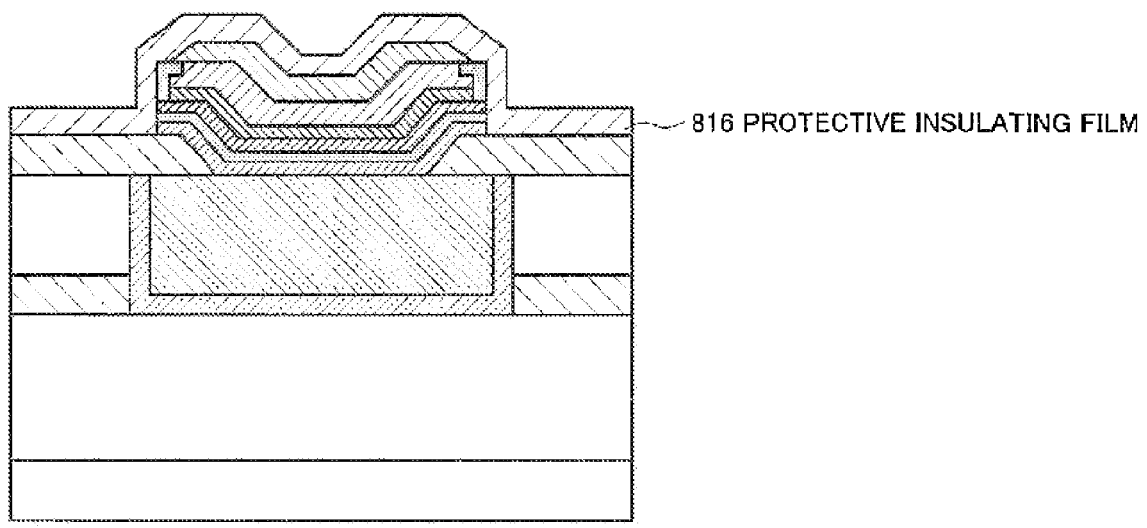
FIG. 8K is a schematic sectional view illustrating still another process (process 11) of manufacturing the semiconductor device including the two-terminal switching element according to the first exemplary embodiment of the present invention.

[Process 11] (FIG. 8K)

A protective insulating film 816 (for example, a 20-nm thick silicon nitride or silicon carbonitride film) is deposited on the hard mask film 813, the third electrode 812, the resistive-change layer 811, the second electrode 810, the second ion conductive layer 809b, the first ion conductive layer 809a, and the barrier insulating film 807. The protective insulating film 816 can be deposited by the plasma CVD method. Before deposition, the reactive chamber needs to be maintained under reduced pressure, and this involves oxygen desorption from the side surfaces of the second ion conductive layer 809b and the first ion conductive layer 809a and increases the leakage current of these ion conductive layers. To suppress this effect, the deposition temperature of the protective insulating film 816 is preferably set to 250° C. or less. Further, no reductive gas is preferably used in terms of exposure to a deposition gas under reduced pressure before deposition. A silicon nitride film formed using a $SiH_4/N_2$ gas mixture at a substrate temperature of 200° C. by a high-density plasma, for example, is preferably employed.

Figure 8L:
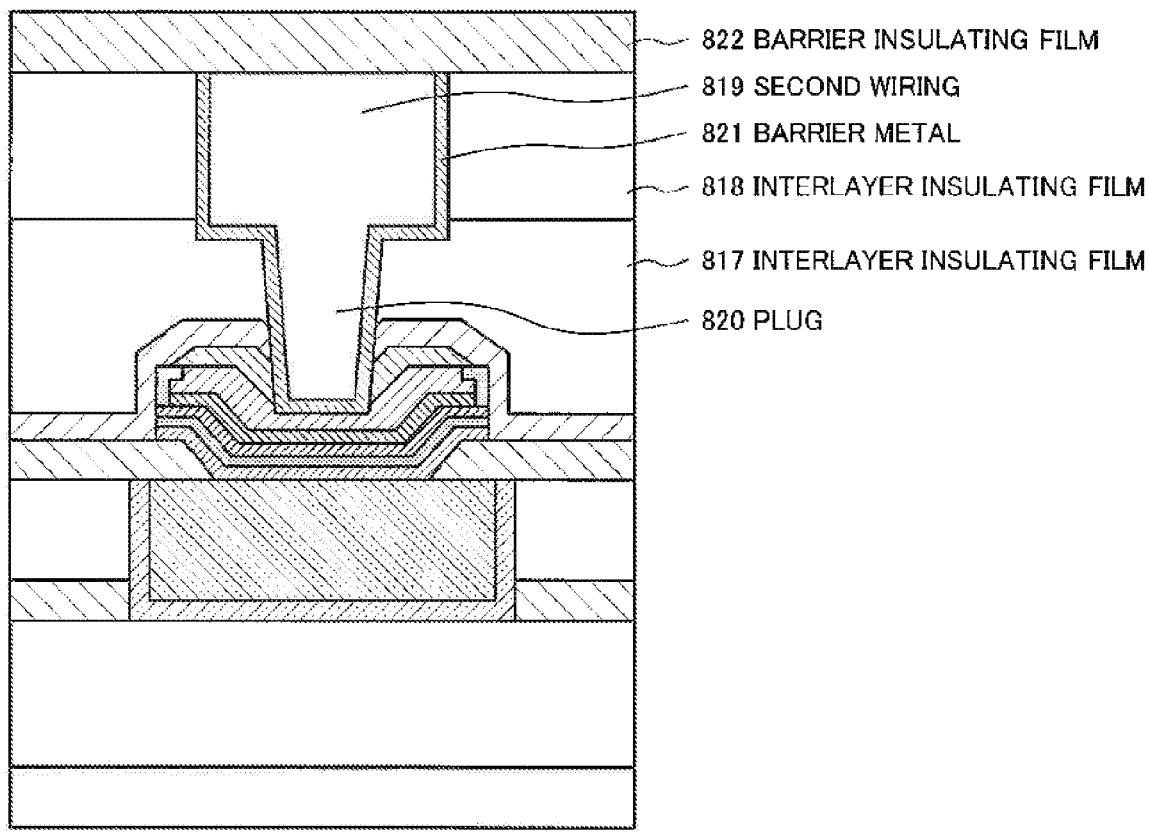
FIG. 8L is a schematic sectional view illustrating still another process (process 12) of manufacturing the two-terminal switching element according to the first exemplary embodiment of the present invention.

[Process 12] (FIG. 8L)

An interlayer insulating film 817 (for example, a silicon oxide film) and an interlayer insulating film 818 (for example, a stack of a 150-nm thick SiCHO film and a 150-nm thick silicon oxide film) are deposited on the protective insulating film 816 in this order. A pilot hole for a plug 820 is formed and a wiring trench for second wiring 819 is further formed. A copper dual damascene wiring process is used to simultaneously form second wiring 819 (for example, copper) and a plug 820 (for example, copper) in the wiring trench and the pilot hole, respectively, through a barrier metal 821 (for example, tantalum nitride/tantalum). A barrier insulating film 822 (for example, a silicon nitride film) is deposited on the interlayer insulating film 818 including the second wiring 819.

The second wiring 819 can be formed using a process similar to that used in forming lower layer wiring. At this time, the use of the same material for both the barrier metal 821 and the third electrode 812 makes it possible to reduce the contact resistance between the plug 820 and the third electrode 812 to improve the element performance. The interlayer insulating films 817 and 818 can be formed by the plasma CVD method. To eliminate any step formed by the two-terminal switch and the rectifying element, the interlayer insulating film 817 may be formed at a desired thickness (for example, 110 nm) by being thickly deposited and then etched and planarized by CMP.

According to this exemplary embodiment, short-circuiting of a rectifying element having an MIM structure stacked on a switching element using a metal bridge is prevented. Further, exposure of Cu wiring is prevented by suppressing etching of the barrier insulating film. These features attain a switching element, a switching element manufacturing method, a semiconductor device, and a semiconductor device manufacturing method having excellent operational stability and a high production yield.

In other words, this exemplary embodiment provides a switching element having excellent operational stability and a high production yield, and a semiconductor device using the switching element.

(Second Exemplary Embodiment)

Figure 9:
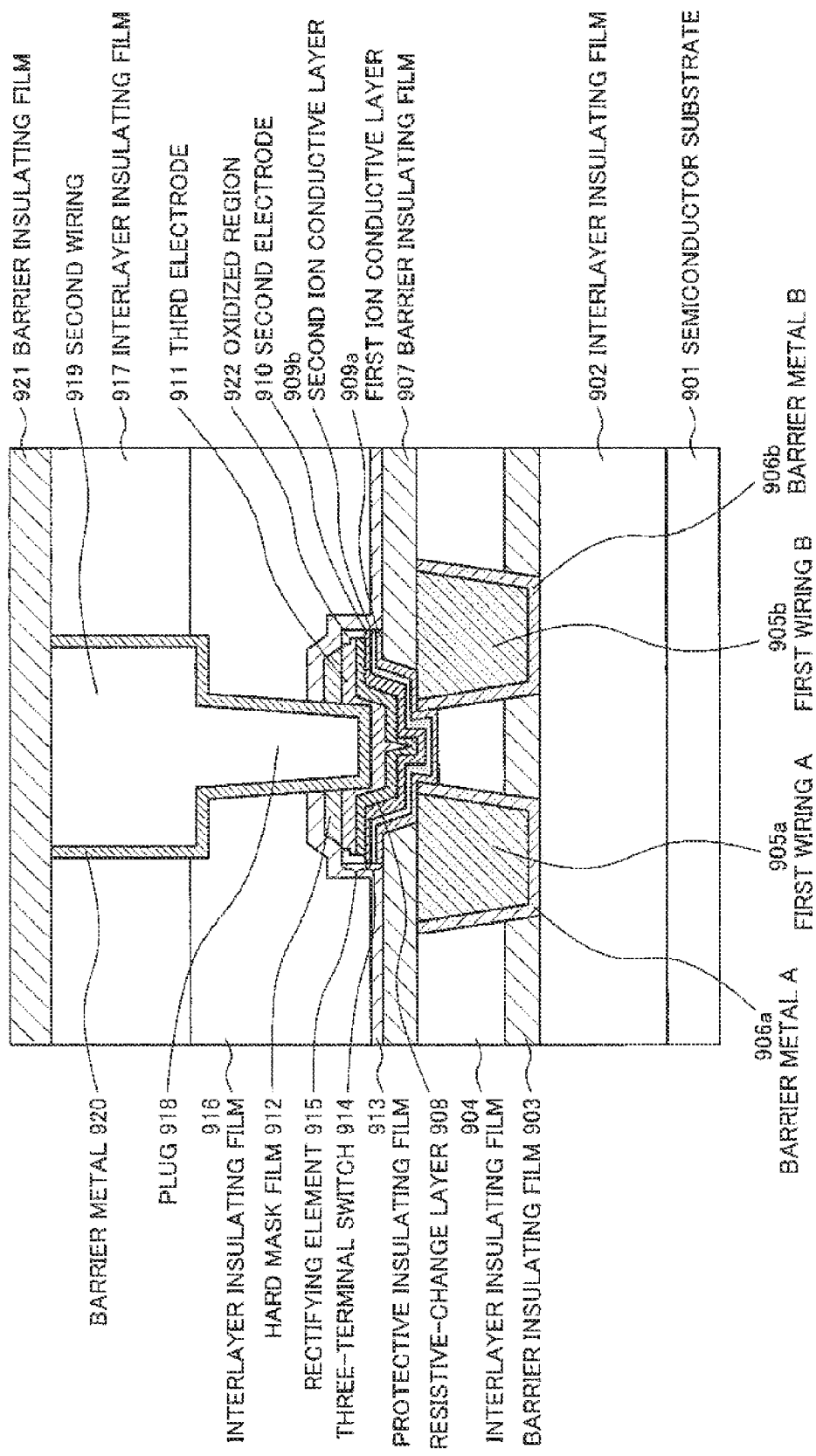
FIG. 9 is a schematic sectional view illustrating the configuration of a semiconductor device including a three-terminal switching element according to a second exemplary embodiment of the present invention.

FIG. 9 is a schematic sectional view illustrating the configuration of a semiconductor device including a three-terminal switching element according to a second exemplary embodiment of the present invention. A multilayer wiring layer on a semiconductor substrate 901 includes a three-terminal switch 914.

The multilayer wiring layer includes, on the semiconductor substrate 901, an insulator stack including an interlayer insulating film 902, a barrier insulating film 903, an interlayer insulating film 904, a barrier insulating film 907, a protective insulating film 913, interlayer insulating films 916 and 917, and a barrier insulating film 921 stacked in this order. The multilayer wiring layer includes first wiring A 905a and first wiring B 905b buried through a barrier metal A 906a and a barrier metal B 906b in wiring trenches formed in the interlayer insulating film 904 and the barrier insulating film 903. The multilayer wiring layer also includes second wiring 919 buried in a wiring trench formed in the interlayer insulating films 916 and 917. Further, a plug 918 is buried in a pilot hole formed in the interlayer insulating film 916, the protective insulating film 913, and a hard mask film 912. The second wiring 919 and the plug 918 are integrated with each other. The side to bottom surfaces of the second wiring 919 and the plug 918 are covered with a barrier metal 920.

In an opening formed in the barrier insulating film 907, a first ion conductive layer 909a, a second ion conductive layer 909b, and a second electrode 910 are formed on the first wiring A 905a and the first wiring B 905b serving as a first electrode, the wall surface defining the opening in the barrier insulating film 907, and the barrier insulating film 907. The first ion conductive layer 909a, the second ion conductive layer 909b, and the second electrode 910 form a three-terminal switch 914. A rectifying element 915 is formed by stacking a resistive-change layer 908 and a third electrode 911 on the second electrode 910. The hard mask film 912 is formed on the third electrode 911. The upper to side surfaces of the stack of the first ion conductive layer 909a, the second ion conductive layer 909b, the second electrode 910, the resistive-change layer 908, the third electrode 911, and the hard mask film 912 are covered with the protective insulating film 913.

Enabling the first wiring A 905a and the first wiring B 905b to serve as the first electrode of the three-terminal switch 914 makes it possible to lower the electrode resistance while achieving fewer processes. As an additional process to the normal copper damascene wiring process, simply adding at least two photomasks allows mounting of a three-terminal switch so as to simultaneously achieve reductions in both resistance and cost of the element.

In the three-terminal switch 914, the first ion conductive layer 909a is in contact with the first wiring A 905a and the first wiring B 905b and the second ion conductive layer 909b is in contact with the second electrode 910, in the region of the opening formed in the barrier insulating film 907.

In the rectifying element 915, the resistive-change layer 908 is in contact with the upper part of the second electrode 910 and the third electrode 911 is further in contact with the upper part of the resistive-change layer 908.

The plug 918 is electrically connected to the third electrode 911 via the barrier metal 920 on the third electrode 911. The three-terminal switch 914 undergoes ON/OFF control by voltage application or current supply. For example, ON/OFF control is performed using electromigration of the metal associated with the first wiring A 905a and the first wiring B 905b into the first ion conductive layer 909a and the second ion conductive layer 909b to maintain the ON and OFF states non-volatile. The rectifying element 915 undergoes ON/OFF control by voltage application and changes to ON state at a voltage having an absolute value smaller than that of the three-terminal switch 914. In this case, the ON state shows volatile behavior.

The semiconductor substrate 901 is a substrate including semiconductor elements. Examples of the semiconductor substrate 101 may include substrates such as a silicon substrate, a single-crystal substrate, an SOI substrate, a TFT substrate, and a liquid crystal manufacturing substrate.

The interlayer insulating film 902 is an insulating film formed on the semiconductor substrate 901. Examples of the interlayer insulating film 902 may include a silicon oxide film and a low dielectric film (for example, a SiOCH film) having a relative dielectric constant lower than that of a silicon oxide film. The interlayer insulating film 902 may be implemented in a stack of a plurality of insulating films.

The barrier insulating film 903 is an insulating film which has barrier properties and is interposed between the interlayer insulating films 902 and 904. The barrier insulating film 903 serves as an etching stop layer during processing of wiring trenches for the first wiring A 905a and the first wiring B 905b. Examples of the barrier insulating film 903 may include a silicon nitride film, a SiC film, and a silicon carbonitride film. Wiring trenches to bury the first wiring A 905a and the first wiring B 905b are formed in the barrier insulating film 903 such that the first wiring A 905a and the first wiring B 905b are buried in the wiring trenches through the barrier metal A 906a and the barrier metal B 906b. The barrier insulating film 903 can also be removed, depending on the selection of the etching conditions of the wiring trenches.

The interlayer insulating film 904 is an insulating film formed on the barrier insulating film 903. Examples of the interlayer insulating film 904 may include a silicon oxide film and a low dielectric film (for example, a SiOCH film) having a relative dielectric constant lower than that of a silicon oxide film. The interlayer insulating film 904 may be implemented in a stack of a plurality of insulating films. Wiring trenches to bury the first wiring A 905a and the first wiring B 905b are formed in the interlayer insulating film 904. The first wiring A 905a and the first wiring B 905b are buried in the wiring trenches through the barrier metal A 906a and the barrier metal B 906b.

The first wiring A 905a and the first wiring B 905b are wiring buried through the barrier metal A 906a and the barrier metal B 906b in the wiring trenches formed in the interlayer insulating film 904 and the barrier insulating film 903. The first wiring A 905a and the first wiring B 905b serve as the first electrode of the three-terminal switch 914 and are in contact with the first ion conductive layer 909a. The second ion conductive layer 909b has its lower surface in contact with the first ion conductive layer 909a and its upper surface in contact with the second electrode 910. The first wiring A 905a and the first wiring B 905b are made of a diffusible metal capable of ion conduction in the first ion conductive layer 909a and the second ion conductive layer 909b and can use, for example, copper. The first wiring A 905a and the first wiring B 905b may also be alloyed with aluminum.

The barrier metal A 906a and the barrier metal B 906b are conductive films which have barrier properties and cover the wiring side to bottom surfaces to prevent diffusion of the metal associated with the first wiring A 905a and the first wiring B 905b to the interlayer insulating film 904 and underlying layers. When the first wiring A 905a and the first wiring B 905b are made of a metal containing, for example, copper as the main component, the barrier metal A 906a and the barrier metal B 906b can use a refractory metal, its nitride, or their stacked film. Examples of the refractory metal or its nitride may include tantalum, tantalum nitride, titanium nitride, and tungsten carbonitride.

The barrier insulating film 907 is formed on the interlayer insulating film 904 including the first wiring A 905a and the first wiring B 905b to prevent oxidation of the metal (for example, copper) associated with the first wiring A 905a and the first wiring B 905b. The barrier insulating film 907 also prevents diffusion of the metal associated with the first wiring A 905a and the first wiring B 905b into the interlayer insulating film 916. The barrier insulating film 907 serves as an etching stop layer during processing of the first ion conductive layer 909a, the second ion conductive layer 909b, the second electrode 910, the resistive-change layer 908, and the third electrode 911. Examples of the barrier insulating film 907 may include a silicon carbonitride film, a silicon nitride film, and their stack. The barrier insulating film 907 is preferably made of the same material as those of the protective insulating film 913 and the hard mask film 912.

The first ion conductive layer 909a and the second ion conductive layer 909b are films, the resistances of which undergo a non-volatile change. The first ion conductive layer 909a and the second ion conductive layer 909b can be made of a material, the resistance of which changes due to an action (for example, diffusion or ion conduction) of the metal associated with the first wiring A 905*a* and the first wiring B 905*b* (first electrode). Films capable of ion conduction are used when metal ion precipitation brings about a change in resistance of the three-terminal switch 914.

The second ion conductive layer 909*b* is formed using the plasma CVD method. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

The first ion conductive layer 909*a* serves to prevent diffusion of the metal associated with the first wiring A 905*a* and the first wiring B 905*b* into the second ion conductive layer 909*b* due to heating or a plasma during deposition of the second ion conductive layer 909*b*. The first ion conductive layer 909*a* also serves to prevent oxidation of the first wiring A 905*a* and the first wiring B 905*b*, the oxidation of which promotes diffusion. The metal of the first ion conductive layer 909*a*, for example, titanium, aluminum, or their stack, turns into titanium oxide, aluminum oxide, or their stack during deposition of the second ion conductive layer 909*b*, and forms part of the ion conductive layer. The optimum total thickness of the metal of the first ion conductive layer 909*a* is 1 nm; the use of thicknesses smaller than 1 nm slightly oxidizes the copper wiring surface while the use of thicknesses larger than 1 nm makes the metal remain partly unoxidized.

The first ion conductive layer 909*a* and the second ion conductive layer 909*b* are formed on the first wiring A 905*a* and the first wiring B 905*b*, a tapered face defining the opening in the barrier insulating film 907, and the barrier insulating film 907. In the first ion conductive layer 909*a*, the outer peripheral portion of the portion connecting the first wiring A 905*a* and the first wiring B 905*b* to the first ion conductive layer 909*a* is located at least along the tapered face defining the opening in the barrier insulating film 907.

The first ion conductive layer 909*a* may form a stack of titanium and aluminum or be implemented in single-layered titanium and aluminum films.

The second electrode 910 serves as the upper electrode of the three-terminal switch 914 and is in contact with the second ion conductive layer 909*b*. The second electrode 910 uses a metal which is less likely to ionize and, in turn, is less likely to diffuse and ionically conduct in the second ion conductive layer 909*b* than the metal associated with the first wiring A 905*a* and the first wiring B 905*b*. Examples include alloys of ruthenium and titanium, tantalum, aluminum, manganese, zirconium, hafnium, magnesium, cobalt, copper, and zinc exhibiting high adhesion strength to the metal associated with the first wiring A 905*a* and the first wiring B 905*b*. The ruthenium content is desirably 10% (inclusive) to 80% (inclusive). Ruthenium may be doped with two or more types of metals.

As a metal with which ruthenium is doped in the second electrode 910, a metal having a standard Gibbs energy higher in the negative direction than that of ruthenium is desirably selected. Titanium, tantalum, aluminum, manganese, zirconium, hafnium, magnesium, cobalt, copper, and zinc having a standard Gibbs energy higher in the negative direction than that of ruthenium are more likely to cause spontaneous chemical reactions than ruthenium. Hence, the use of an alloy of ruthenium as the second electrode 910 may improve the adhesion strength to a metal bridge formed by the metal associated with the first wiring A 905*a* and the first wiring B 905*b*.

When, however, the second electrode 910 is formed using only a doping metal, the obtained electrode has a standard Gibbs energy equal to or higher in the negative direction than that of the metal associated with the first wiring A 905*a* and the first wiring B 905*b*. An ON to OFF transition progresses upon oxidation (dissolution) of the metal bridge. When the standard Gibbs energy of the second electrode 910 is higher in the negative direction than that of the metal associated with the first wiring A 905*a* and the first wiring B 905*b*, a transition to OFF state is impossible because oxidation of the second electrode 910 progresses more than oxidation of the metal bridge formed using the metal associated with the first wiring A 905*a* and the first wiring B 905*b*. Therefore, the second electrode 910 needs to be made of an alloy of ruthenium having a standard Gibbs energy lower in the negative direction than that of copper.

The rectifying element 915 changes to ON state at a voltage having an absolute value smaller than that of the voltage at which the three-terminal switch 914 changes to ON or OFF state. The ON state is volatile and a transition to OFF state takes place upon a drop in voltage. The three-terminal switch 914 performs no switching operation at a voltage which does not change the rectifying element 915 to ON state.

The resistive-change layer 908 is an insulating film, the resistance of which undergoes a volatile change, and is implemented in a single-layered metal oxide film or a stack of metal oxide films. The resistive-change layer 908 is implemented in, for example, single-layered tantalum oxide, titanium oxide, niobium oxide, and aluminum oxide films, or their stack. The resistive-change layer 908 is formed as a metal oxide by metal deposition and exposure to an oxygen plasma or as a metal oxide by depositing a metal within a chamber charged with oxygen. The resistive-change layer 908 may be formed by the co-sputtering method for simultaneously sputtering tantalum, titanium, niobium, and aluminum within the same chamber and then be oxidized with an oxygen plasma. Similarly, oxygen may be introduced during deposition by the co-sputtering method to form a metal oxide film.

The third electrode 911 serves as the upper electrode of the rectifying element 915 and is formed on the resistive-change layer 908. The third electrode 911 serves to protect the stacked structure of the rectifying element 915 in the resistive-change layer 908 and an underlying layer, and the stacked structure of the three-terminal switch 914. More specifically, the resistive-change layer 908 can restrain damage to the stacked structure of the rectifying element 915 in the resistive-change layer 908 and an underlying layer, and the stacked structure of the three-terminal switch 914 during the process, to maintain given switching characteristics of the three-terminal switch 914 and the rectifying element 911. The third electrode 911 can use, for example, tantalum, titanium, tungsten, or their nitrides.

The hard mask film 912 serves both as a hard mask film and a passivation film in etching the third electrode 911, the resistive-change layer 908, the second electrode 910, the second ion conductive layer 909*b*, and the first ion conductive layer 909*a*. Examples of the hard mask film 912 may include a silicon nitride film. The hard mask film 912 is preferably made of the same material as those of the protective insulating film 913 and the barrier insulating film 907. More specifically, surrounding the three-terminal switch 914 and the rectifying element 915 by the same material makes it possible to integrate the material interfaces together, thereby preventing entrance of, for example, moisture from the outside and further preventing desorption from the three-terminal switch 914 and the rectifying element 915.

The three-terminal switch 914 and the rectifying element 915 are etched using the hard mask film 912 as an etching mask. The second electrode 910 implemented in an alloy electrode containing ruthenium as the main component is etched by charging oxygen, nitrogen, and chlorine into a chamber as etching gases. An oxidized region 922 serving as an insulator is formed on the upper portion and side surface of the third electrode 911 and the side surface of the resistive-change layer 908 by oxygen that is one of the etching gases. The side surfaces mean herein the peripheral portions of the third electrode 911 and the resistive-change layer 908.

The protective insulating film 913 is an insulating film which functions to prevent desorption of oxygen from the first ion conductive layer 909a, the second ion conductive layer 909b, and the resistive-change layer 908 while inflicting no damage on the three-terminal switch 914 and the rectifying element 915. Examples of the protective insulating film 913 may include a silicon nitride film and a silicon carbonitride film. The protective insulating film 913 is preferably made of the same material as those of the hard mask film 912 and the barrier insulating film 907. In the case of the same material, the protective insulating film 913 can be integrated with the barrier insulating film 907 and the hard mask film 912 to improve the adhesion strength of the interfaces and more reliably protect the three-terminal switch 914 and the rectifying element 915.

The interlayer insulating film 916 is an insulating film formed on the protective insulating film 913. Examples of the interlayer insulating film 916 may include a silicon oxide film, a SiOC film, and a low dielectric film (for example, a SiOCH film) having a relative dielectric constant lower than that of a silicon oxide film. The interlayer insulating film 916 may be implemented in a stack of a plurality of insulating films. The interlayer insulating film 916 may be made of the same material as that of the interlayer insulating film 904. A pilot hole to bury the plug 918 is formed in the interlayer insulating film 916 such that the plug 918 is buried in the pilot hole through the barrier metal 920.

The interlayer insulating film 917 is an insulating film formed on the interlayer insulating film 916. Examples of the interlayer insulating film 917 may include a silicon oxide film, a SiOC film, and a low dielectric film (for example, a SiOCH film) having a relative dielectric constant lower than that of a silicon oxide film. The interlayer insulating film 917 may be implemented in a stack of a plurality of insulating films. The interlayer insulating film 917 may be made of the same material as that of the interlayer insulating film 916. A wiring trench to bury the second wiring 919 is formed in the interlayer insulating film 917 such that the second wiring 919 is buried in the wiring trench through the barrier metal 920.

The second wiring 919 is wiring buried through the barrier metal 920 in the wiring trench formed in the interlayer insulating films 917 and 916. The second wiring 919 is integrated with the plug 918. The plug 918 is buried through the barrier metal 920 in the pilot hole formed in the interlayer insulating film 916, the protective insulating film 913, and the hard mask film 912. The plug 918 is electrically connected to the third electrode 911 via the barrier metal 920. The second wiring 919 and the plug 918 can use, for example, copper.

The barrier metal 920 is a conductive film which has barrier properties and covers the side to bottom surfaces of the second wiring 919 and the plug 918 to prevent diffusion of the metal associated with the second wiring 919 (including the plug 918) to the interlayer insulating films 916 and 917 and underlying layers. When the second wiring 919 and the plug 918 are made of a metal containing, for example, copper as the main component, the barrier metal 920 can use a refractory metal or its nitride, such as tantalum, tantalum nitride, titanium nitride, or tungsten carbonitride, or their stacked film. The barrier metal 920 is preferably made of the same material as that of the third electrode 911. When the barrier metal 920 has, for example, a stack of tantalum nitride (lower layer)/tantalum (upper layer), tantalum nitride employed as the lower layer material is preferably used for the third electrode 911.

The barrier insulating film 921 is an insulating film which is formed on the interlayer insulating film 917 including the second wiring 919, and serves to prevent oxidation of the metal (for example, copper) associated with the second wiring 919 and prevent diffusion of the metal associated with the second wiring 919 to upper layers. Examples of the barrier insulating film 921 may include a silicon carbonitride film, a silicon nitride film, and their stack.

(Etching)

Etching of the three-terminal switch and the rectifying element illustrated in FIG. 9 according to this exemplary embodiment will be described below. The three-terminal switch and the rectifying element illustrated in FIG. 9 are etched by the same method as the etching method described in the first exemplary embodiment.

(Switching Operation)

The operation of the three-terminal switch illustrated in FIG. 9 according to this exemplary embodiment will be described below with reference to FIG. 6. The three-terminal switch illustrated in FIG. 9 according to this exemplary embodiment is implemented using two, two-terminal switches which share the second electrode 604, the resistive-change layer 605, and the third electrode 606 shown in FIG. 6 according to the first exemplary embodiment. Thus, the operation of each two-terminal switch is the same as in the switching operation method described in the first exemplary embodiment. During the operation of one two-terminal switch, the first wiring 601 of another two-terminal switch is floating.

An arrangement equipped with no rectifying element requires a selection transistor which selects a two-terminal switch to be operated, whereas the use of a rectifying element makes it difficult to apply a voltage to an inactive two-terminal switch and therefore obviates the need for a selection transistor.

(Manufacturing Method)

A method for manufacturing a semiconductor device including a switching element according to this exemplary embodiment will be described next with reference to the accompanying drawings. FIGS. 10A to 10L are process sectional views schematically illustrating a method for manufacturing a semiconductor device including a switching element according to this exemplary embodiment.

Figure 10A:
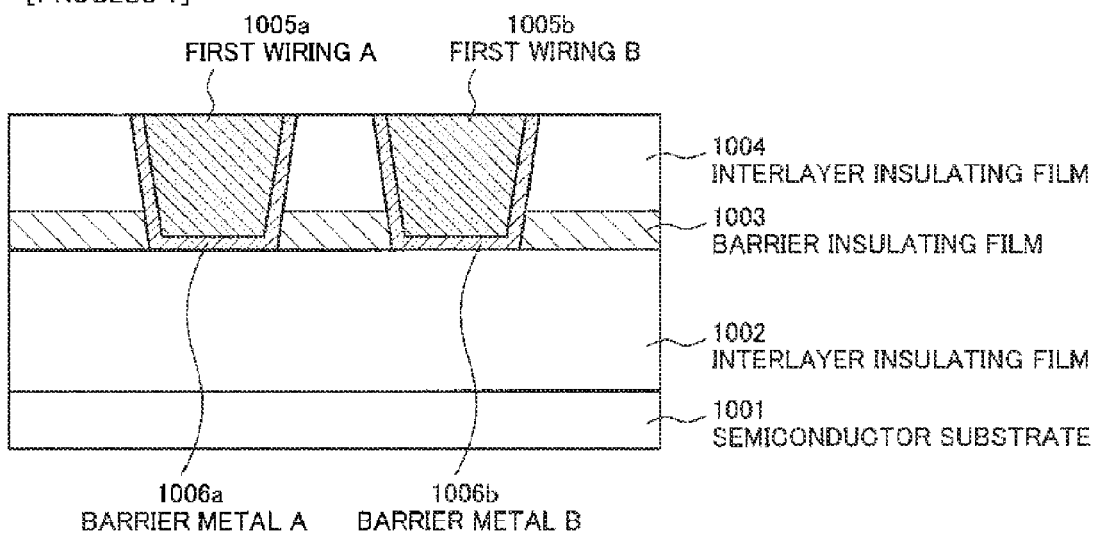
FIG. 10A is a schematic sectional view illustrating a process (process 1) of manufacturing a semiconductor device including a three-terminal switching element according to the second exemplary embodiment of the present invention.

[Process 1] (FIG. 10A)

An interlayer insulating film 1002 (for example, a 300-nm thick silicon oxide film) is deposited on a semiconductor substrate 1001 (for example, a substrate including semiconductor elements). A barrier insulating film 1003 (for example, a 30-nm thick silicon nitride film) is also deposited on the interlayer insulating film 1002. An interlayer insulating film 1004 (for example, a stack of a 150-nm thick SiCHO film and a 100-nm thick silicon oxide film) is moreover deposited on the barrier insulating film 1003. Wiring trenches are formed in the interlayer insulating film 1004 and the barrier insulating film 1003 using the lithography method (including photoresist formation, dry etching, and photoresist removal). First wiring A 1005a and first wiring B 1005b (for example, copper) are buried in the wiring trenches through a barrier metal A 1006a and a barrier metal B 1006b (for example, 5-nm/5-nm thick tantalum nitride/tantalum films).

Interlayer insulating films 1002 and 1004 can be formed by the plasma CVD method. First wiring A 1005a and first wiring B 1005b are formed in the following way: a barrier metal A 1006a and a barrier metal B 1006b (for example, a stacked film of tantalum nitride/tantalum) are formed by the PVD method, and copper seeds are formed by the PVD method. The first wiring A 1005a and the first wiring B 1005b can be formed by burying the copper in the wiring trenches by the electroplating method, performing a heat treatment at temperatures of 200° C. or more, and removing excess copper except in the wiring trenches by the CMP method.

Figure 10B:
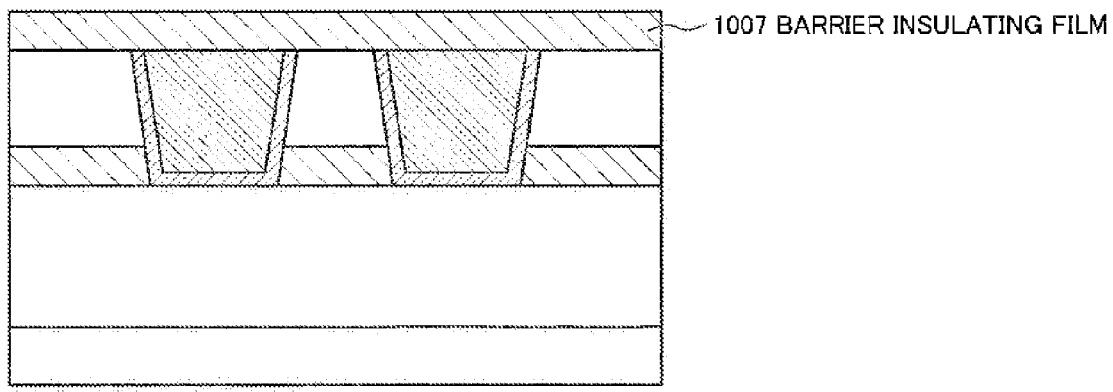
FIG. 10B is a schematic sectional view illustrating another process (process 2) of manufacturing the semiconductor device including the three-terminal switching element according to the second exemplary embodiment of the present invention.

[Process 2] (FIG. 10B)

A barrier insulating film 1007 (for example, a 30-nm thick silicon nitride or silicon carbonitride film) is formed on the interlayer insulating film 1004 including the first wiring A 1005a and the first wiring B 1005b. The barrier insulating film 1007 can be formed by the plasma CVD method. The thickness of the barrier insulating film 1007 is preferably about 10 nm to 50 nm.

Figure 10C:
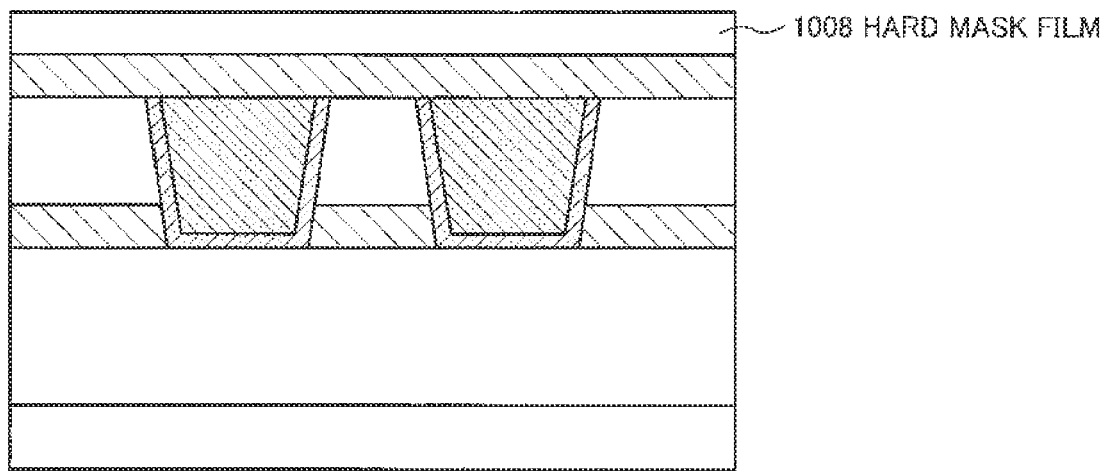
FIG. 10C is a schematic sectional view illustrating still another process (process 3) of manufacturing the semiconductor device including the three-terminal switching element according to the second exemplary embodiment of the present invention.

[Process 3] (FIG. 10C)

A hard mask film 1008 (for example, a 40-nm thick silicon oxide film) is formed on the barrier insulating film 1007. Note that in terms of maintaining a high etching selectivity in dry etching, the hard mask film 1008 is preferably made of a material different from that of the barrier insulating film 1007 and may either be an insulating or conductive film. Examples of the hard mask film 1008 may include a silicon oxide film, a silicon nitride film, titanium nitride, titanium, tantalum, and tantalum nitride, as well as a stack of silicon nitride/silicon oxide films.

Figure 10D:
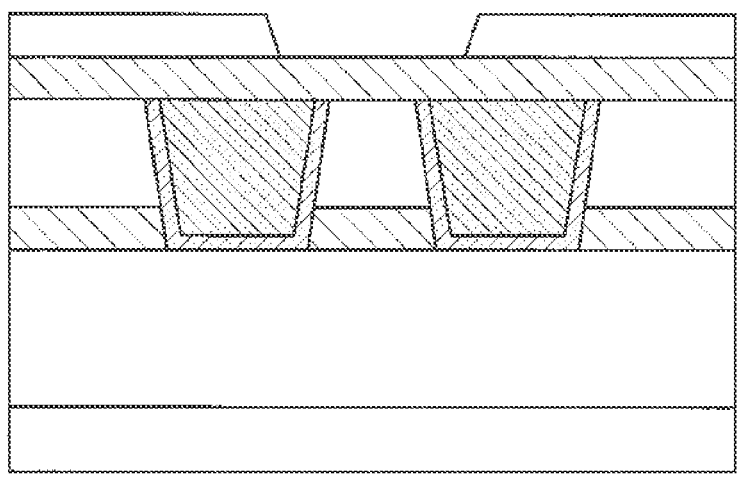
FIG. 10D is a schematic sectional view illustrating still another process (process 4) of manufacturing the semiconductor device including the three-terminal switching element according to the second exemplary embodiment of the present invention.

[Process 4] (FIG. 10D)

An opening pattern is formed in the hard mask film 1008 by patterning the hard mask film 1008 with an opening using a photoresist (not illustrated), and performing dry etching using the photoresist as a mask. The photoresist is then stripped by, for example, oxygen plasma ashing. At this time, dry etching need not always be stopped on the upper surface of the barrier insulating film 1007 and may have reached into the barrier insulating film 1007.

Figure 10E:
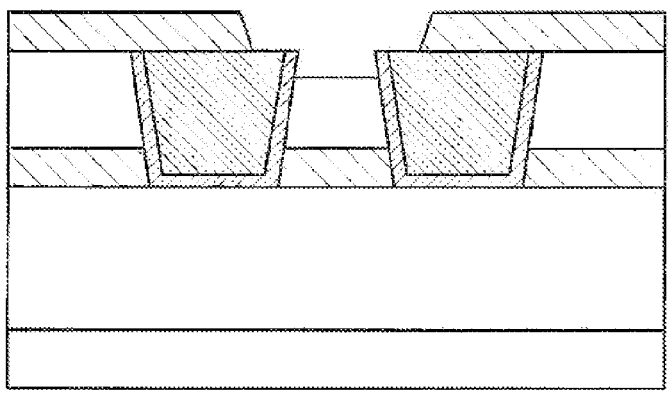
FIG. 10E is a schematic sectional view illustrating still another process (process 5) of manufacturing the semiconductor device including the three-terminal switching element according to the second exemplary embodiment of the present invention.

[Process 5] (FIG. 10E)

The barrier insulating film 1007 exposed from the opening in the hard mask film 1008 is etched back (processed by dry etching) using the hard mask film 1008 as a mask to form an opening in the barrier insulating film 1007. The first wiring A 1005a and the first wiring B 1005b are exposed from the opening in the barrier insulating film 1007. Etching back the barrier insulating film 1007 makes it possible to form the wall surface defining the opening in the barrier insulating film 1007 into a tapered face, using reactive dry etching. Reactive dry etching can use a gas containing fluorocarbon as an etching gas.

The hard mask film 1008 is preferably removed completely during an etch-back operation but may remain intact in the case of an insulating material. The shape of the opening in the barrier insulating film 1007 can be a circle having a diameter of 100 nm to 500 nm. The oxide on the surfaces of the first wiring A 1005a and the first wiring B 1005b is removed by RF etching that uses a non-reactive gas. Helium or argon can be used as the non-reactive gas.

Figure 10F:
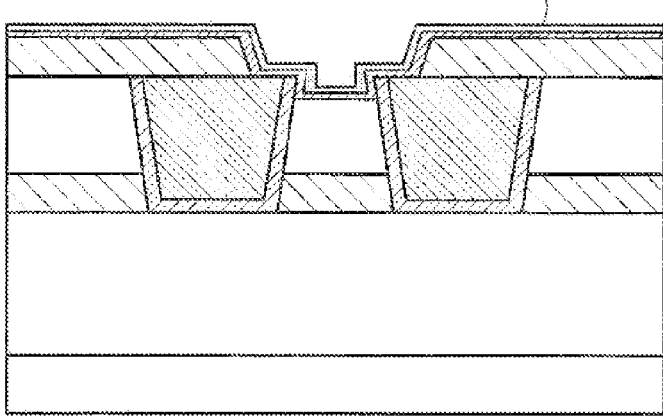
FIG. 10F is a schematic sectional view illustrating still another process (process 6) of manufacturing the semiconductor device including the three-terminal switching element according to the second exemplary embodiment of the present invention.

[Process 6] (FIG. 10F)

Titanium and aluminum are deposited by 0.5 nm or less in this order on the barrier insulating film 1007 including the first wiring A 1005a and the first wiring B 1005b. Titanium and aluminum can be formed using the PVD or CVD method. A SIOCH polymer film containing silicon, oxygen, carbon, and hydrogen is formed as a second ion conductive layer 1009b by plasma CVD. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

Titanium and aluminum are exposed to a source of a SIOCH polymer film containing oxygen during the formation of the second ion conductive layer 1009b and thereby automatically oxidize into oxides, which form a first ion conductive layer 1009a and part of the second ion conductive layer 1009b. The portions defining the opening in the barrier insulating film 1007 have moisture and the like adhering to them upon an organic stripping process and are, therefore, preferably degassed by a heat treatment under reduced pressure at temperatures of about 250° C. to 350° C. before deposition of the first ion conductive layer 1009a.

Figure 10G:
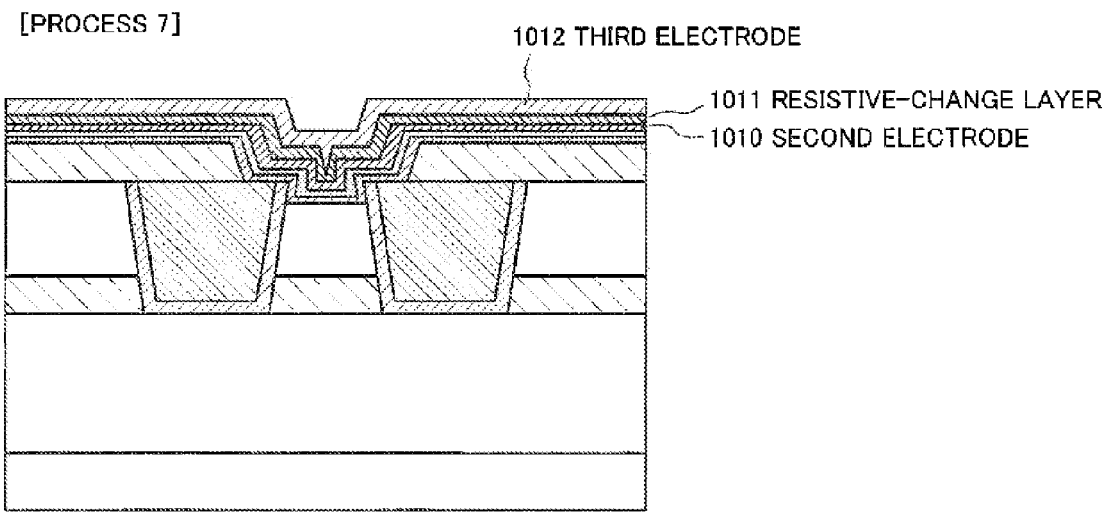
FIG. 10G is a schematic sectional view illustrating still another process (process 7) of manufacturing the semiconductor device including the three-terminal switching element according to the second exemplary embodiment of the present invention.

[Process 7] (FIG. 10G)

A 5-nm thick film made of an alloy of ruthenium and tantalum is formed on the second ion conductive layer 1009b as a second electrode 1010 by the co-sputtering method. At this time, ruthenium and tantalum targets are present in the same chamber and simultaneously sputtered to deposit an alloy film. A power of 150 W is supplied to the ruthenium target and a power of 50 W is supplied to the tantalum target to obtain a ruthenium content of 75%.

A resistive-change layer 1011 (for example, a 5-nm thick tantalum oxide film), the resistance of which undergoes a volatile change, is deposited on the second electrode 1010 and a third electrode 1012 (for example, a 25-nm thick tantalum film) is further formed. The resistive-change layer 1011 is formed as a metal oxide and may be formed using either the plasma oxidation method for sputtering a metal and oxidizing it by exposure to an oxygen plasma, or the reactive sputtering method for introducing oxygen during sputtering.

Figure 10H:
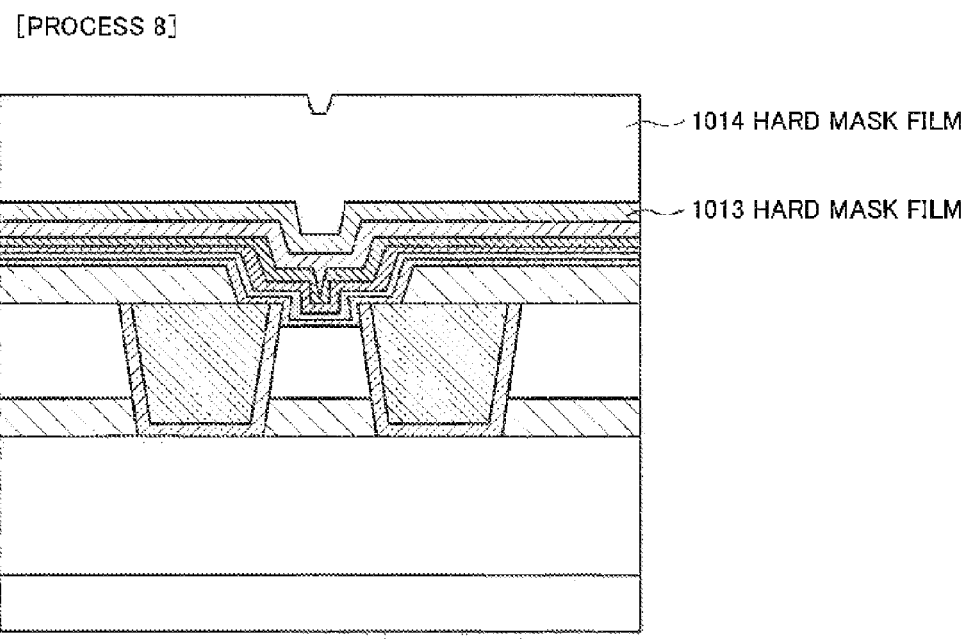
FIG. 10H is a schematic sectional view illustrating still another process (process 8) of manufacturing the semiconductor device including the three-terminal switching element according to the second exemplary embodiment of the present invention.

[Process 8] (FIG. 10H)

A hard mask film 1013 (for example, a 30-nm thick silicon nitride or silicon carbonitride film) and a hard mask film 1014 (for example, a 100-nm thick silicon oxide film) are stacked on the third electrode 1012 in this order. The hard mask films 1013 and 1014 can be deposited using the plasma CVD method. The hard mask films 1013 and 1014 can be formed using the general plasma CVD method in the technical field of the art.

The hard mask films 1013 and 1014 are preferably different types of films and can be implemented using, for example, a silicon carbonitride film for the hard mask film 1013 and a silicon oxide film for the hard mask film 1014. In this case, the hard mask film 1013 is preferably made of the same material as those of a protective insulating film and a barrier insulating film (to be described later). More specifically, surrounding the entire resistive-change element by the same material makes it possible to integrate the material interfaces together, thereby preventing entrance of, for example, moisture from the outside and further preventing desorption from the resistive-change element.

Figure 10I:
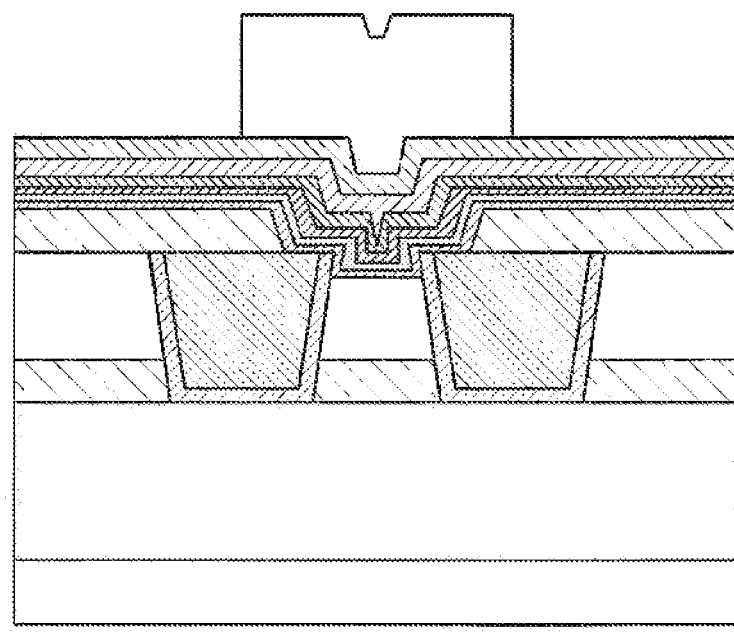
FIG. 10I is a schematic sectional view illustrating still another process (process 9) of manufacturing the semiconductor device including the three-terminal switching element according to the second exemplary embodiment of the present invention.

[Process 9] (FIG. 10I)

A photoresist (not illustrated) for forming a three-terminal switch and a rectifying element by patterning is formed on the hard mask film 1014 and used as a mask to perform dry etching of the hard mask film 1014 until the hard mask film 1013 becomes exposed. The photoresist is then removed by oxygen plasma ashing and organic stripping.

Figure 10J:
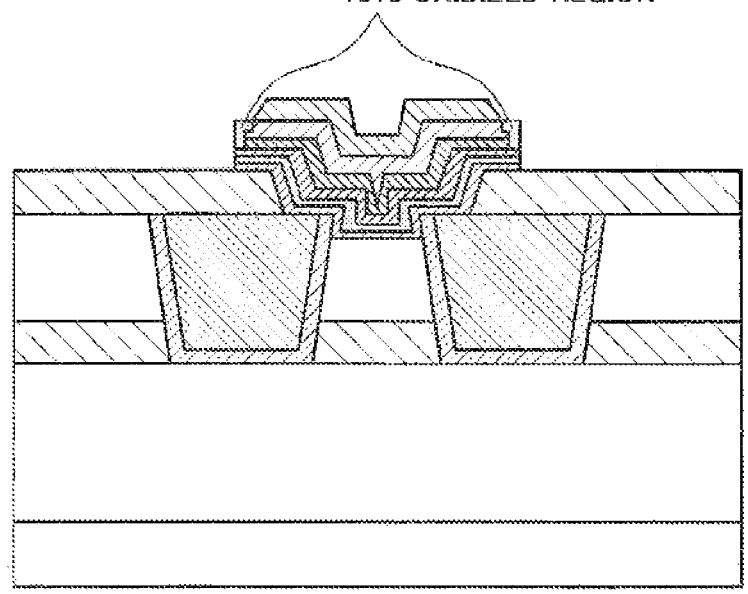
FIG. 10J is a schematic sectional view illustrating still another process (process 10) of manufacturing the semiconductor device including the three-terminal switching element according to the second exemplary embodiment of the present invention.

[Process 10] (FIG. 10J)

Dry etching is continuously performed on the hard mask film 1013, the third electrode 1012, the resistive-change layer 1011, the second electrode 1010, the second ion conductive layer 1009b, and the first ion conductive layer 1009a using the hard mask film 1014 as a mask. At this time, the hard mask film 1014 is preferably removed completely during an etch-back operation but may remain intact. When, for example, the third electrode 1012 is made of tantalum and the resistive-change layer 1011 is made of tantalum oxide, they can be processed using chlorine-based RIE. When the second electrode 1010 is made of an alloy of ruthenium and tantalum, it is desirably processed using a gas mixture of chlorine, nitrogen, and oxygen at a chlorine:nitrogen:oxygen ratio of, for example, 25%:25%:50%.

The second ion conductive layer 1009b and the first ion conductive layer 1009a under the second electrode 1010 can also be etched using the same gas as that used for the second electrode. As a result, dry etching can be stopped on the lower, barrier insulating film 1007. The use of such a hard mask RIE method allows the resistive-change element portion to be processed without exposure to oxygen plasma ashing for resist removal.

When an oxidation process is performed using an oxygen plasma after processing, oxygen plasma irradiation is possible independently of the resist stripping time. By oxygen used during etching of layers under the second electrode 1010, a metal-derived etching product deposited on the side surface and part of the upper surface of the third electrode 1012 and the side surface of the resistive-change layer 1011 exposed due to degeneration of the hard mask film 1013 oxidizes into an oxidized region 1015.

Figure 10K:
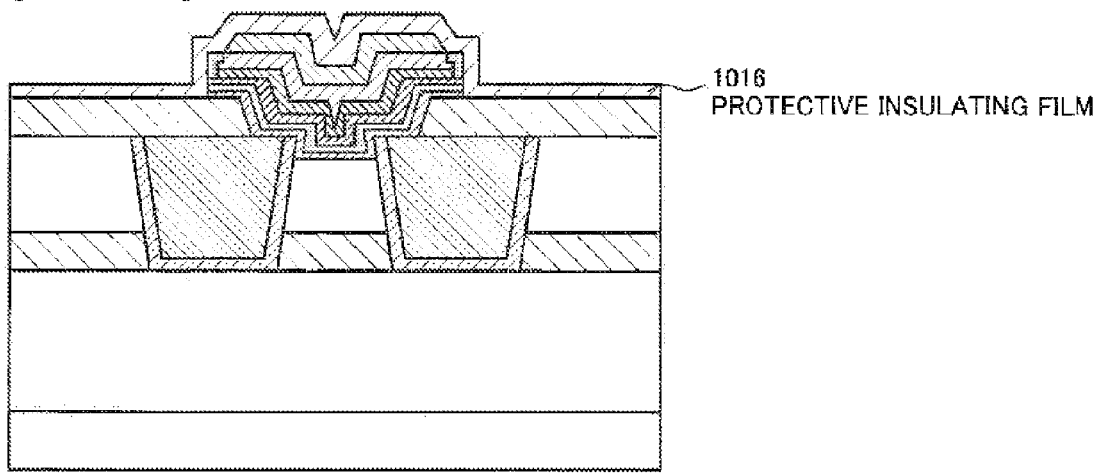
FIG. 10K is a schematic sectional view illustrating still another process (process 11) of manufacturing the semiconductor device including the three-terminal switching element according to the second exemplary embodiment of the present invention.

[Process 11] (FIG. 10K)

A protective insulating film 1016 (for example, a 20-nm thick silicon nitride or silicon carbonitride film) is deposited on the hard mask film 1013, the third electrode 1012, and the barrier insulating film 1007. The protective insulating film 1016 can be deposited by the plasma CVD method. Before deposition, the reactive chamber needs to be maintained under reduced pressure, and this involves oxygen desorption from the side surfaces of the second ion conductive layer 1009b and the first ion conductive layer 1009a and increases the leakage current of these ion conductive layers. To suppress this effect, the deposition temperature of the protective insulating film 1016 is preferably set to 250° C. or less. Further, no reductive gas is preferably used in terms of exposure to a deposition gas under reduced pressure before deposition. A silicon nitride film formed using a $SiH_4/N_2$ gas mixture at a substrate temperature of 200° C. by a high-density plasma, for example, is preferably employed.

Figure 10L:
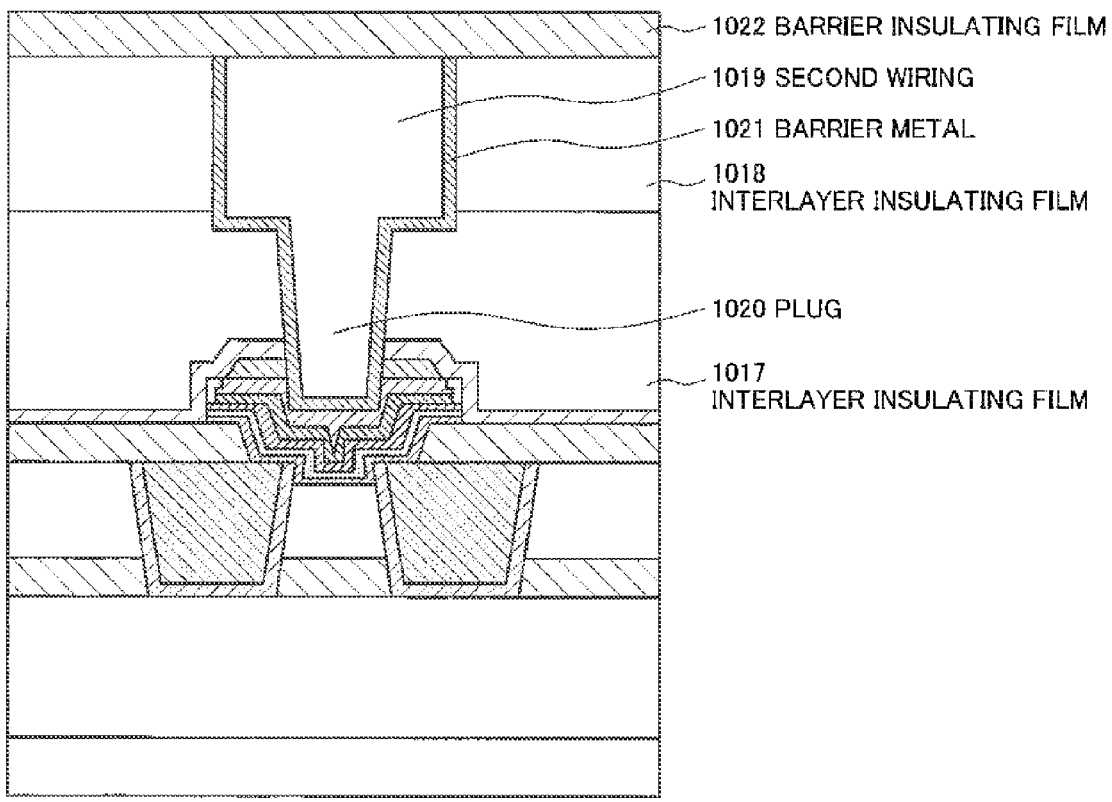
FIG. 10L is a schematic sectional view illustrating still another process (process 12) of manufacturing the semiconductor device including the three-terminal switching element according to the second exemplary embodiment of the present invention.

[Process 12] (FIG. 10L)

An interlayer insulating film 1017 (for example, a silicon oxide film) and an interlayer insulating film 1018 (for example, a stack of a 150-nm thick SiCHO film and a 150-nm thick silicon oxide film) are deposited on the protective insulating film 1016 in this order. A pilot hole for a plug 1020 is formed and a wiring trench for second wiring 1019 is further formed. A copper dual damascene wiring process is used to simultaneously form second wiring 1019 (for example, copper) and a plug 1020 (for example, copper) in the wiring trench and the pilot hole, respectively, through a barrier metal 1021 (for example, tantalum nitride/tantalum). A barrier insulating film 1022 (for example, a silicon nitride film) is deposited on the interlayer insulating film 1018 including the second wiring 1019.

The second wiring 1019 can be formed using a process similar to that used in forming lower layer wiring. At this time, the use of the same material for both the barrier metal 1021 and the third electrode 1012 makes it possible to reduce the contact resistance between the plug 1020 and the third electrode 1012 to improve the element performance. The interlayer insulating films 1017 and 1018 can be formed by the plasma CVD method. To eliminate any step formed by the two-terminal switch and the rectifying element, the interlayer insulating film 1017 may be formed at a desired thickness (for example, 110 nm) by being thickly deposited and then etched and planarized by CMP.

According to this exemplary embodiment, short-circuiting of a rectifying element having an MIM structure stacked on a switching element using a metal bridge is prevented. Further, exposure of Cu wiring is prevented by suppressing etching of the barrier insulating film. These features attain a switching element, a switching element manufacturing method, a semiconductor device, and a semiconductor device manufacturing method having excellent operational stability and a high production yield.

In other words, this exemplary embodiment provides a switching element having excellent operational stability and a high production yield, and a semiconductor device using the switching element.

(Third Exemplary Embodiment)

FIG. 11 is a schematic sectional view illustrating the configuration of a semiconductor device including a two-terminal switching element according to a third exemplary embodiment of the present invention. A multilayer wiring layer on a semiconductor substrate 1101 includes a two-terminal switch 1109.

The multilayer wiring layer includes, on the semiconductor substrate 1101, an insulator stack including an interlayer insulating film 1102, a barrier insulating film 1103, an interlayer insulating film 1104, a barrier insulating film 1107, a protective insulating film 1113, interlayer insulating films 1114 and 1115, and a barrier insulating film 1119 stacked in this order. The multilayer wiring layer includes first wiring 1105 buried through a barrier metal 1106 in a wiring trench formed in the interlayer insulating film 1104 and the barrier insulating film 1103. The multilayer wiring layer also includes second wiring 1116 buried in a wiring trench formed in the interlayer insulating films 1115 and 1114. Further, a plug 1117 is buried in a pilot hole formed in the interlayer insulating film 1114, the protective insulating film 1113, and a hard mask film 1111. The second wiring 1116 and the plug 1117 are integrated with each other. The side to bottom surfaces of the second wiring and the plug 1117 are covered with a barrier metal 1118.

In an opening formed in the barrier insulating film 1107, a first ion conductive layer 1108a, a second ion conductive layer 1108b, a lower second electrode 1110, and an upper second electrode 1112 are formed on the first wiring 1105, the wall surface defining the opening in the barrier insulating film 1107, and the barrier insulating film 1107. The first ion conductive layer 1108a, the second ion conductive layer 1108b, the lower second electrode 1110, and the upper second electrode 1112 are stacked in this order to form a two-terminal switch 1109. The hard mask film 1111 is formed on the upper second electrode 1112. The upper to side surfaces of the stack of the first ion conductive layer 1108a, the second ion conductive layer 1108b, the lower second electrode 1110, the upper second electrode 1112, and the hard mask film 1111 are covered with the protective insulating film 1113.

Enabling the first wiring 1105 to serve as the first electrode of the two-terminal switch 1109 makes it possible to lower the electrode resistance while achieving fewer processes. As an additional process to the normal copper damascene wiring process, simply adding at least two photomasks allows mounting of a two-terminal switch so as to simultaneously achieve reductions in both resistance and cost of the element.

In the two-terminal switch 1109, the first ion conductive layer 1108a is in contact with the first wiring 1105 and the second ion conductive layer 1108b is in contact with the lower second electrode 1110, in the region of the opening formed in the barrier insulating film 1107.

The plug 1117 is electrically connected to the upper second electrode 1112 via the barrier metal 1118 on the upper second electrode 1112. The two-terminal switch 1109 undergoes ON/OFF control by voltage application or current supply. For example, ON/OFF control is performed using electromigration of the metal associated with the first wiring 1105 into the first ion conductive layer 1108a and the second ion conductive layer 1108b to maintain the ON and OFF states non-volatile.

The semiconductor substrate 1101 is a substrate including semiconductor elements. Examples of the semiconductor substrate 1101 may include substrates such as a silicon substrate, a single-crystal substrate, an SOI substrate, a TFT substrate, and a liquid crystal manufacturing substrate.

The interlayer insulating film 1102 is an insulating film formed on the semiconductor substrate 1101. Examples of the interlayer insulating film 1102 may include a silicon oxide film and a low dielectric film (for example, a SiOCH film) having a relative dielectric constant lower than that of a silicon oxide film. The interlayer insulating film 1102 may be implemented in a stack of a plurality of insulating films.

The barrier insulating film 1103 is an insulating film which has barrier properties and is interposed between the interlayer insulating films 1102 and 1104. The barrier insulating film 1103 serves as an etching stop layer during processing of a wiring trench for the first wiring 1105. Examples of the barrier insulating film 1103 may include a silicon nitride film, a SiC film, and a silicon carbonitride film. A wiring trench to bury the first wiring 1105 is formed in the barrier insulating film 1103 such that the first wiring 1105 is buried in the wiring trench through the barrier metal 1106. The barrier insulating film 1103 can also be removed, depending on the selection of the etching conditions of the wiring trench.

The interlayer insulating film 1104 is an insulating film formed on the barrier insulating film 1103. Examples of the interlayer insulating film 1104 may include a silicon oxide film and a low dielectric film (for example, a SiOCH film) having a relative dielectric constant lower than that of a silicon oxide film. The interlayer insulating film 1104 may be implemented in a stack of a plurality of insulating films. A wiring trench to bury the first wiring 1105 is formed in the interlayer insulating film 1104 such that the first wiring 1105 is buried in the wiring trench through the barrier metal 1106.

The first wiring 1105 is wiring buried through the barrier metal 1106 in the wiring trench formed in the interlayer insulating film 1104 and the barrier insulating film 1103. The first wiring 1105 serves as the first electrode of the two-terminal switch 1109 and is in direct contact with the first ion conductive layer 1108a. The second ion conductive layer 1108b has its lower surface in direct contact with the first ion conductive layer 1108a and its upper surface in direct contact with the lower second electrode 1110. The first wiring 1105 is made of a diffusible metal capable of ion conduction in the first ion conductive layer 1108a and the second ion conductive layer 1108b and can use, for example, copper. The first wiring 1105 may also be alloyed with aluminum.

The barrier metal 1106 is a conductive film which has barrier properties and covers the wiring side to bottom surfaces to prevent diffusion of the metal associated with the first wiring 1105 to the interlayer insulating film 1104 and underlying layers. When the first wiring 1105 is made of a metal containing, for example, copper as the main component, the barrier metal 1106 can use a refractory metal or its nitride, such as tantalum, tantalum nitride, titanium nitride, or tungsten carbonitride, or their stacked film.

The barrier insulating film 1107 is formed on the interlayer insulating film 1104 including the first wiring 1105 to prevent oxidation of the metal (for example, copper) associated with the first wiring 1105. The barrier insulating film 1107 also prevents diffusion of the metal associated with the first wiring 1105 into the interlayer insulating film 1114. The barrier insulating film 1107 serves as an etching stop layer during processing of the first ion conductive layer 1108a, the second ion conductive layer 1108b, the lower second electrode 1110, and the upper second electrode 1112. Examples of the barrier insulating film 1107 may include a silicon carbonitride film, a silicon nitride film, and their stack. The barrier insulating film 1107 is preferably made of the same material as those of the protective insulating film 1113 and the hard mask film 1111.

The first ion conductive layer 1108a and the second ion conductive layer 1108b are films, the resistances of which undergo a non-volatile change. The first ion conductive layer 1108a and the second ion conductive layer 1108b can be made of a material, the resistance of which changes due to an action (for example, diffusion or ion conduction) of the metal associated with the first wiring 1105 (first electrode). Films capable of ion conduction are used when metal ion precipitation brings about a change in resistance of the two-terminal switch 1109.

The second ion conductive layer 1108b is formed using the plasma CVD method. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

The first ion conductive layer 1108a serves to prevent diffusion of the metal associated with the first wiring 1105 into the second ion conductive layer 1108b due to heating or a plasma during deposition of the second ion conductive layer 1108b. The first ion conductive layer 1108a also serves to prevent oxidation of the first wiring 1105, the oxidation of which promotes diffusion. The metal of the first ion conductive layer 1108a, for example, titanium, aluminum, or their stack, turns into titanium oxide, aluminum oxide, or their stack during deposition of the second ion conductive layer 1108b, and forms part of the ion conductive layer. The optimum total thickness of the metal of the first ion conductive layer 1108a is 1 nm; the use of thicknesses smaller than 1 nm slightly oxidizes the copper wiring surface while the use of thicknesses larger than 1 nm makes the metal remain partly unoxidized.

The first ion conductive layer 1108a and the second ion conductive layer 1108b are formed on the first wiring 1105, a tapered face defining the opening in the barrier insulating film 1107, and the barrier insulating film 1107. In the first ion conductive layer 1108a, the outer peripheral portion of the portion connecting the first wiring 1105 to the first ion conductive layer 1108a is located at least along the tapered face defining the opening in the barrier insulating film 1107.

The first ion conductive layer 1108a may form a stack of titanium and aluminum or be implemented in single-layered titanium and aluminum films.

The lower second electrode 1110 serves as the upper electrode of the two-terminal switch 1109 and is in contact with the second ion conductive layer 1108b. The lower second electrode 1110 uses a metal which is less likely to ionize and, in turn, is less likely to diffuse and ionically conduct in the second ion conductive layer 1108b than the metal associated with the first wiring 1105. Examples include alloys of ruthenium and titanium, tantalum, aluminum, manganese, zirconium, hafnium, magnesium, cobalt, copper, and zinc exhibiting high adhesion strength to the metal associated with the first wiring 1105. The ruthenium content is desirably 10% (inclusive) to 80% (inclusive). Ruthenium may be doped with two or more types of metals.

As a metal with which ruthenium is doped in the lower second electrode 1110, a metal having a standard Gibbs energy higher in the negative direction than that of ruthenium is desirably selected. Titanium, tantalum, aluminum, manganese, zirconium, hafnium, magnesium, cobalt, copper, and zinc having a standard Gibbs energy higher in the negative direction than that of ruthenium are more likely to cause spontaneous chemical reactions than ruthenium. Hence, the use of an alloy of ruthenium as the lower second electrode 1110 may improve the adhesion strength to a metal bridge formed by the metal associated with the first wiring 1105.

When, however, the lower second electrode 1110 is formed using only a metal with which ruthenium is doped, the obtained electrode has a standard Gibbs energy equal to or higher in the negative direction than that of the metal associated with the first wiring 1105. An ON to OFF transition progresses upon oxidation (dissolution) of the metal bridge. When the standard Gibbs energy of the lower second electrode 1110 is higher in the negative direction than that of the metal associated with the first wiring 1105, a transition to OFF state is impossible because oxidation of the lower second electrode 1110 progresses more than oxidation of the metal bridge formed using the metal associated with the first wiring 1105. Therefore, the lower second electrode 1110 needs to be made of an alloy of ruthenium having a standard Gibbs energy lower in the negative direction than that of copper.

The upper second electrode 1112 serves to protect the stacked structure of the two-terminal switch 1109 in the lower second electrode 1110 and an underlying layer. More specifically, the upper second electrode 1112 can restrain damage to the stacked structure of the two-terminal switch 1109 to maintain given switching characteristics of the two-terminal switch 1109. The upper second electrode 1112 can use, for example, tantalum, titanium, tungsten, or their nitrides.

The hard mask film 1111 serves both as a hard mask film and a passivation film in etching the upper second electrode 1112, the lower second electrode 1110, the second ion conductive layer 1108b, and the first ion conductive layer 1108a. Examples of the hard mask film 1111 may include a silicon nitride film. The hard mask film 1111 is preferably made of the same material as those of the protective insulating film 1113 and the barrier insulating film 1107. More specifically, surrounding the two-terminal switch 1109 by the same material makes it possible to integrate the material interfaces together, thereby preventing entrance of, for example, moisture from the outside and further preventing desorption from the two-terminal switch 1109.

The two-terminal switch 1109 is etched using the hard mask film 1111 as an etching mask. The lower second electrode 1110 implemented in an alloy electrode containing ruthenium as the main component is etched by charging oxygen, nitrogen, and chlorine into a chamber as etching gases. An oxidized region 1120 serving as an insulator is formed on the upper portion and side surface of the upper second electrode 1112 by oxygen that is one of the etching gases. The side surface means herein the peripheral portion of the upper second electrode 1112.

The protective insulating film 1113 is an insulating film which functions to prevent desorption of oxygen from the first ion conductive layer 1108a and the second ion conductive layer 1108b while inflicting no damage on the two-terminal switch 1109 and the rectifying element 1120. Examples of the protective insulating film 1113 may include a silicon nitride film and a silicon carbonitride film. The protective insulating film 1113 is preferably made of the same material as those of the hard mask film 1111 and the barrier insulating film 1107. In the case of the same material, the protective insulating film 1113 can be integrated with the barrier insulating film 1107 and the hard mask film 1111 to improve the adhesion strength of the interfaces and more reliably protect the two-terminal switch 1109.

The interlayer insulating film 1114 is an insulating film formed on the protective insulating film 1113. Examples of the interlayer insulating film 1114 may include a silicon oxide film, a SiOC film, and a low dielectric film (for example, a SiOCH film) having a relative dielectric constant lower than that of a silicon oxide film. The interlayer insulating film 1114 may be implemented in a stack of a plurality of insulating films. The interlayer insulating film 1114 may be made of the same material as that of the interlayer insulating film 1104. A pilot hole to bury the plug 1117 is formed in the interlayer insulating film 1114 such that the plug 1117 is buried in the pilot hole through the barrier metal 1118.

The interlayer insulating film 1115 is an insulating film formed on the interlayer insulating film 1114. Examples of the interlayer insulating film 1115 may include a silicon oxide film, a SiOC film, and a low dielectric film (for example, a SiOCH film) having a relative dielectric constant lower than that of a silicon oxide film. The interlayer insulating film 1115 may be implemented in a stack of a plurality of insulating films. The interlayer insulating film 1115 may be made of the same material as that of the interlayer insulating film 1114. A wiring trench to bury the second wiring 1116 is formed in the interlayer insulating film 1115 such that the second wiring 1116 is buried in the wiring trench through the barrier metal 1118.

The second wiring 1116 is wiring buried through the barrier metal 1118 in the wiring trench formed in the interlayer insulating films 1115 and 1114. The second wiring 1116 is integrated with the plug 1117. The plug 1117 is buried through the barrier metal 1118 in the pilot hole formed in the interlayer insulating film 1114, the protective insulating film 1113, and the hard mask film 1111. The plug 1117 is electrically connected to the upper second electrode 1112 via the barrier metal 1118. The second wiring 1116 and the plug 1117 can use, for example, copper.

The barrier metal 1118 is a conductive film which has barrier properties and covers the side to bottom surfaces of the second wiring 1116 and the plug 1117 to prevent diffusion of the metal associated with the second wiring 1116 (including the plug 1117) to the interlayer insulating films 1115 and 1114 and underlying layers. When the second wiring 1116 and the plug 1117 are made of a metal containing, for example, copper as the main component, the barrier metal 1118 can use a refractory metal or its nitride, such as tantalum, tantalum nitride, titanium nitride, or tungsten carbonitride, or their stacked film. The barrier metal 1118 is preferably made of the same material as that of the upper second electrode 1112. When the barrier metal 1118 has, for example, a stack of tantalum nitride (lower layer)/tantalum (upper layer), tantalum nitride employed as the lower layer material is preferably used for the upper second electrode 1112.

The barrier insulating film 1119 is an insulating film which is formed on the interlayer insulating film 1115 including the second wiring 1116, and serves to prevent oxidation of the metal (for example, copper) associated with the second wiring 1116 and prevent diffusion of the metal associated with the second wiring 1116 to upper layers. Examples of the barrier insulating film 1119 may include a silicon carbonitride film, a silicon nitride film, and their stack.

(Etching)

Etching of the two-terminal switch illustrated in FIG. 11 will be described below with reference to FIG. 11.

Although oxygen is generally employed as an etching gas for ruthenium that is one of substances that constitute an alloy used for the lower second electrode 1110, oxygen reacts with tantalum or titanium acting as a doping metal so as to form tantalum oxide or titanium oxide, leading to an etching rate too low to perform etching. Although the lower second electrode 1110 can be processed for chlorine substances ($Cl_2$ and $BCl_3$) or fluorine substances ($CF_4$ and $CHF_3$) serving as etching gases for titanium or tantalum, the wiring layer may be exposed after switching element processing, because of the high etching rate of the barrier insulating film 1107. In this state, the copper that constitutes the first wiring 1105 diffuses into the protective insulating film 1113 and the interlayer insulating film 1114, thus increasing the leakage current between adjacent plugs 1117.

To process an alloy electrode containing ruthenium as the main component and ensure a given etching selectivity to the barrier insulating film, oxygen, chlorine, and nitrogen are used as etching gases. For etching gases of a chlorine substance and nitrogen, the ratio of the etching rate of a silicon carbonitride film which forms the barrier insulating film 1107 to that of an alloy of 75% ruthenium and 25% tantalum which forms the lower second electrode 1110 was 12.8 to 1. In contrast to this, the use of etching gases of oxygen, chlorine, and nitrogen reduced this ratio to a minimum of 0.94 to 1. The two-terminal switch 1109 can be processed without exposing the first wiring 1105 located under the barrier insulating film 1107 when 100-sccm oxygen, 50-sccm chlorine, and 50-sccm nitrogen were charged into a chamber and etching was performed. At this time, the source power was 900 W, the bias power was 900 W, and the pressure in the chamber was 4 mTorr. Introducing oxygen oxidizes an etching product deposited on the upper and side surfaces of the upper second electrode 1112 exposed due to degeneration of the hard mask film 1111 during etching.

Chlorine is used to decompose base metal components, such as tantalum and titanium, of the alloy electrode, although too much chlorine raises the etching rate of the silicon carbonitride in excess of a given threshold. Oxygen accelerates decomposition of ruthenium and discharge of an etching product. Nitrogen serves to dilute the entire etching gas to keep the etching rate of a barrier insulating film made of a nitride low, although too much nitrogen lowers the etching rate of the alloy electrode in excess of a given threshold. The chlorine:nitrogen:oxygen ratio of the etching gas is desirably 15 to 25%:15% to 25%:50% to 70%.

The second ion conductive layer 1108b and the first ion conductive layer 1108a are also processed during etching of the lower second electrode 1110.

(Switching Operation)

Figure 12:
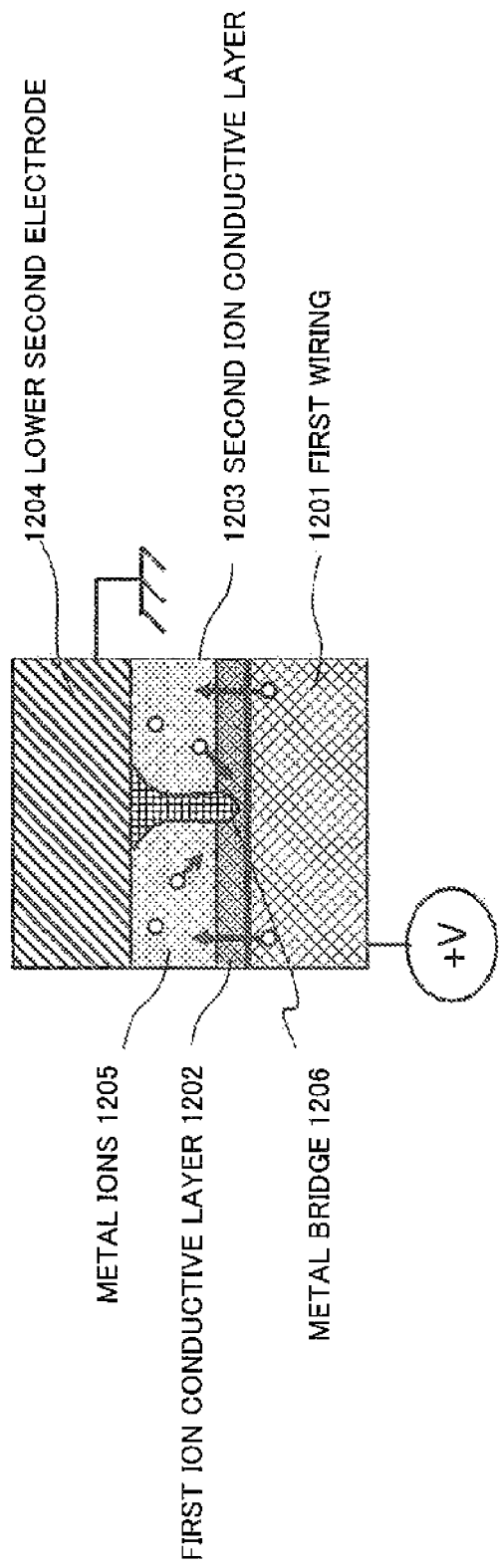
FIG. 12 is a schematic view illustrating the switching operation of the two-terminal switching element according to the third exemplary embodiment of the present invention.
Figure 13:
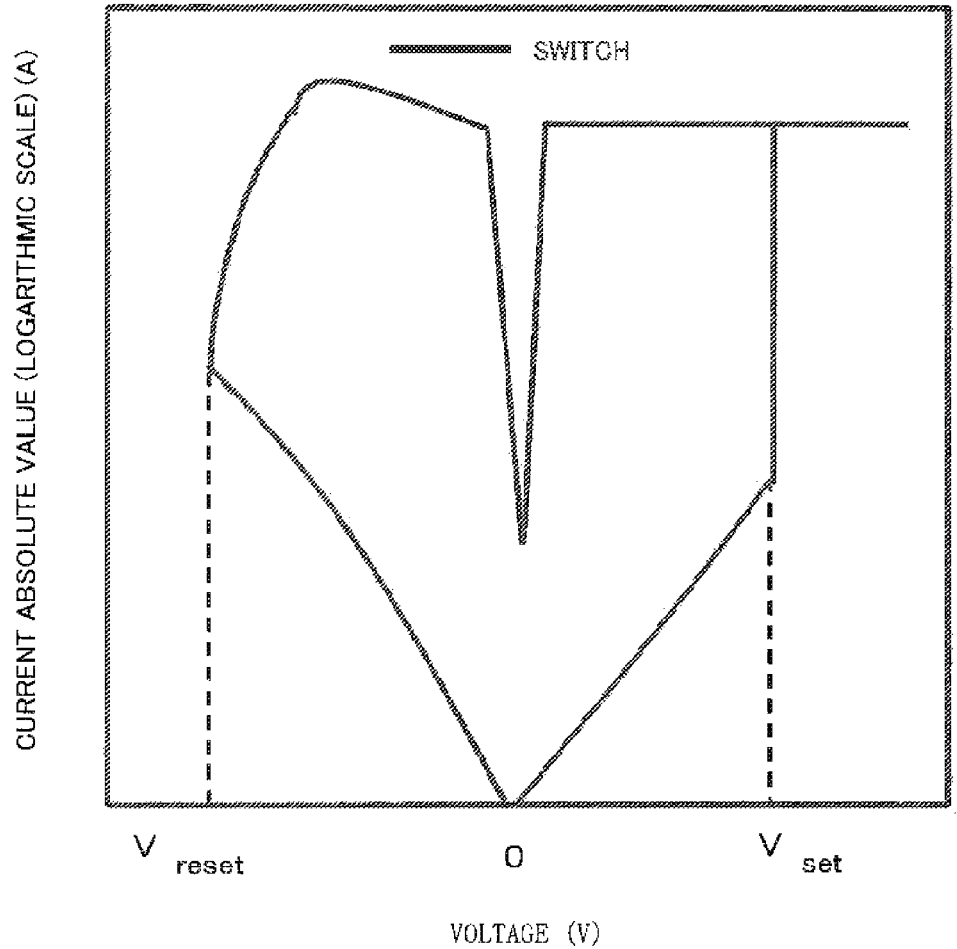
FIG. 13 is a graph showing the switching characteristics of the two-terminal switching element and a rectifying element according to the third exemplary embodiment of the present invention.

The operation of the two-terminal switch illustrated in FIG. 11 will be described below with reference to FIGS. 12 and 13. FIG. 12 schematically illustrates the switching characteristics of the two-terminal switch according to this exemplary embodiment. FIG. 13 is a graph showing the switching characteristics of the two-terminal switching element and a rectifying element according to this exemplary embodiment.

A positive voltage is applied to first wiring 1201 and a lower second electrode 1204 is grounded. The voltage is applied to the two-terminal switch. As the applied voltage rises in the positive direction, copper (metal ions 1205) which is ionized by an electrochemical reaction and leaves the first wiring 1201 migrates into a first ion conductive layer 1202 and a second ion conductive layer 1203. The ionized copper receives electrons from the lower second electrode 1204 and begins to precipitate as copper. The precipitated copper acts as a metal bridge 1206 to connect the first wiring 1201 to the lower second electrode 1204, resulting in a transition to ON state at $V_{set}$.

When the first wiring 1201 is grounded and a positive voltage is applied to the lower second electrode 1204, that is, as the voltage applied to the first wiring 1201 rises in the negative direction, dissolution of the metal bridge 1206 progresses so that the metal bridge 1206 connecting the first wiring 1201 to the lower second electrode 1204 extinguishes, resulting in a transition to OFF state at $V_{reset}$. At this time, the copper that has constituted the metal bridge 1206 is recovered to the first wiring 1201.

(Manufacturing Method)

A method for manufacturing a semiconductor device including a switching element according to this exemplary embodiment will be described next with reference to the accompanying drawings. FIGS. 14A to 14L are process sectional views schematically illustrating a method for manufacturing a semiconductor device including a switching element according to this exemplary embodiment.

Figure 14A:
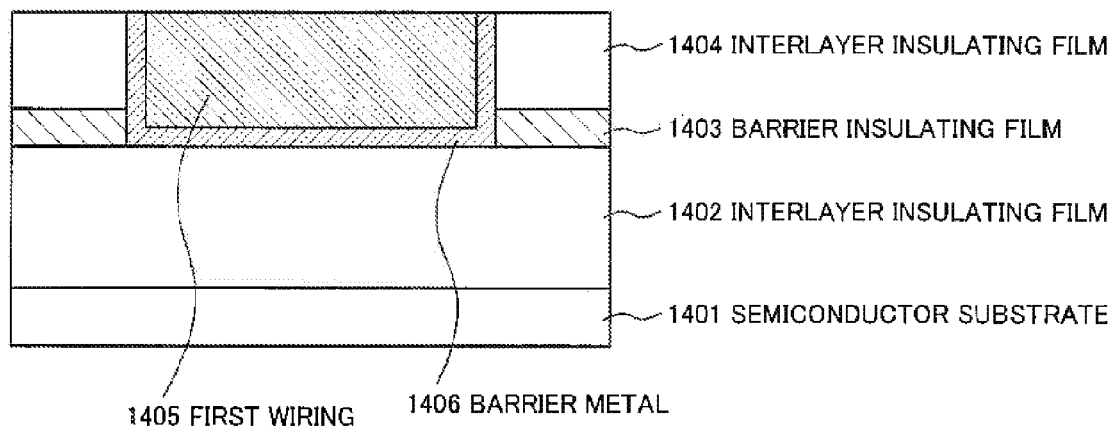
FIG. 14A is a schematic sectional view illustrating a process (process 1) of manufacturing a semiconductor device including a two-terminal switching element according to the third exemplary embodiment of the present invention.

[Process 1] (FIG. 14A)

An interlayer insulating film 1402 (for example, a 300-nm thick silicon oxide film) is deposited on a semiconductor substrate 1401 (for example, a substrate including semiconductor elements). A barrier insulating film 1403 (for example, a 30-nm thick silicon nitride film) is also deposited on the interlayer insulating film 1402. An interlayer insulating film 1404 (for example, a stack of a 150-nm thick SiCHO film and a 100-nm thick silicon oxide film) is moreover deposited on the barrier insulating film 1403. A wiring trench is formed in the interlayer insulating film 1404 and the barrier insulating film 1403 using the lithography method (including photoresist formation, dry etching, and photoresist removal). First wiring 1405 (for example, copper) is buried in the wiring trench through a barrier metal 1406 (for example, 5-nm/5-nm thick tantalum nitride/tantalum films).

Interlayer insulating films 1402 and 1404 can be formed by the plasma CVD method. First wiring 1405 is formed in the following way: a barrier metal 1406 (for example, a stacked film of tantalum nitride/tantalum) is formed by the PVD method, a copper seed is formed by the PVD method, and the copper is buried in the wiring trench by the electroplating method. The first wiring 1405 can be formed by performing a heat treatment at temperatures of 200° C. or more and removing excess copper except in the wiring trench by the CMP method.

Figure 14B:
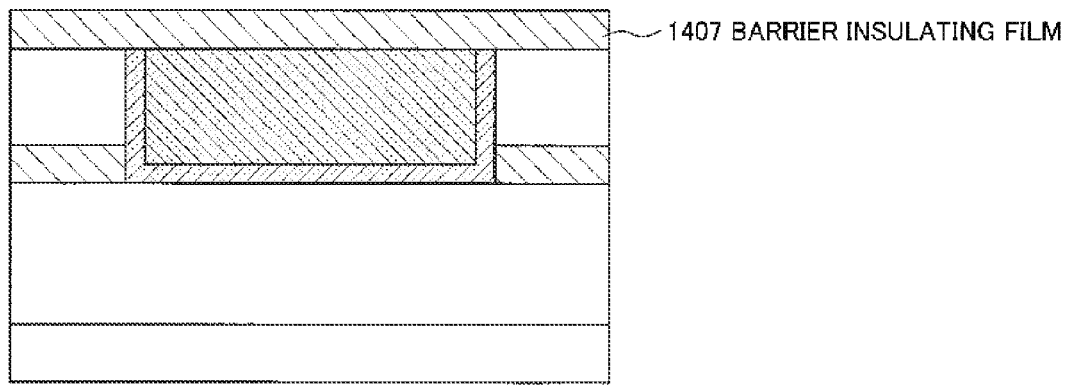
FIG. 14B is a schematic sectional view illustrating another process (process 2) of manufacturing the semiconductor device including the two-terminal switching element according to the third exemplary embodiment of the present invention.

[Process 2] (FIG. 14B)

A barrier insulating film 1407 (for example, a 30-nm thick silicon nitride or silicon carbonitride film) is formed on the interlayer insulating film 1404 including the first wiring 1405. The barrier insulating film 1407 can be formed by the plasma CVD method. The thickness of the barrier insulating film 1407 is preferably about 10 nm to 50 nm.

Figure 14C:
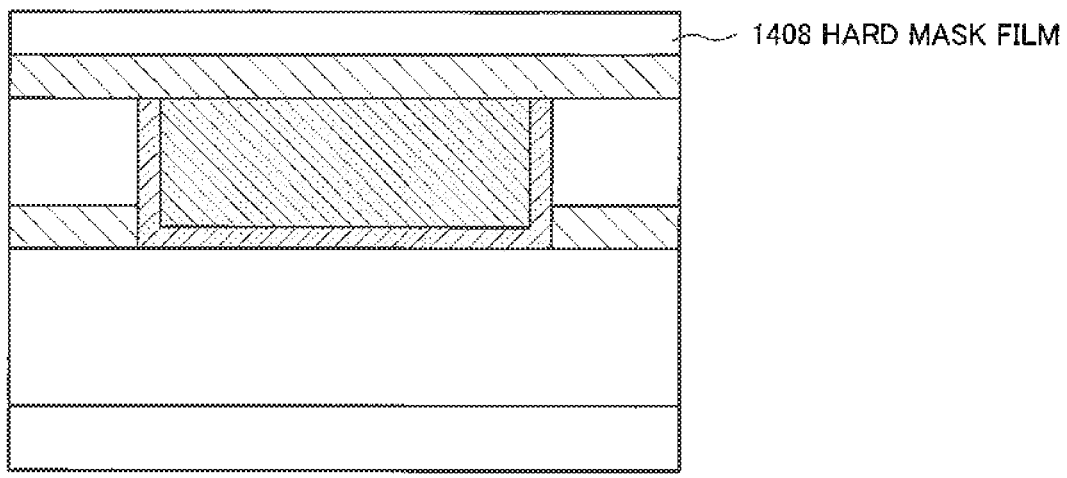
FIG. 14C is a schematic sectional view illustrating still another process (process 3) of manufacturing the semiconductor device including the two-terminal switching element according to the third exemplary embodiment of the present invention.

[Process 3] (FIG. 14C)

A hard mask film 1408 (for example, a 40-nm thick silicon oxide film) is formed on the barrier insulating film 1407. Note that in terms of maintaining a high etching selectivity in dry etching, the hard mask film 1408 is preferably made of a material different from that of the barrier insulating film 1407 and may either be an insulating or conductive film. Examples of the hard mask film 1408 may include a silicon oxide film, a silicon nitride film, titanium nitride, titanium, tantalum, and tantalum nitride, as well as a stack of silicon nitride/silicon oxide films.

Figure 14D:
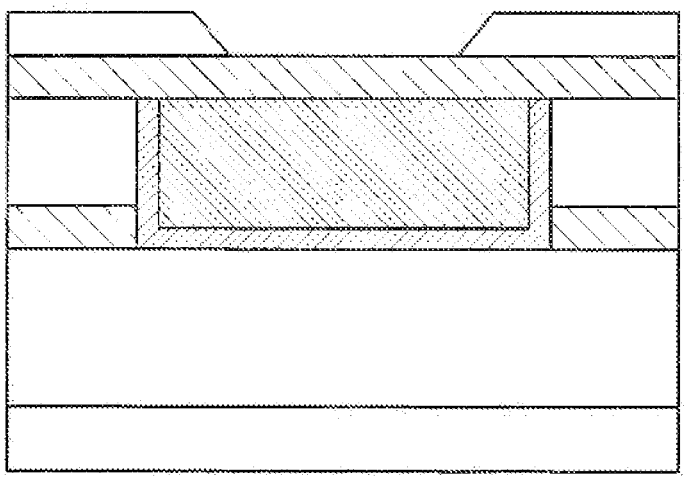
FIG. 14D is a schematic sectional view illustrating still another process (process 4) of manufacturing the semiconductor device including the two-terminal switching element according to the third exemplary embodiment of the present invention.

[Process 4] (FIG. 14D)

An opening pattern is formed in the hard mask film 1408 by patterning the hard mask film 1408 with an opening using a photoresist (not illustrated), and performing dry etching using the photoresist as a mask. The photoresist is then stripped by, for example, oxygen plasma ashing. At this time, dry etching need not always be stopped on the upper surface of the barrier insulating film 1407 and may have reached into the barrier insulating film 1407.

Figure 14E:
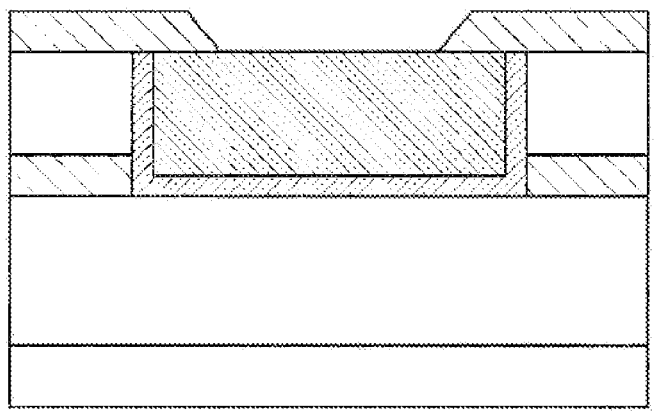
FIG. 14E is a schematic sectional view illustrating still another process (process 5) of manufacturing the semiconductor device including the two-terminal switching element according to the third exemplary embodiment of the present invention.

[Process 5] (FIG. 14E)

The barrier insulating film 1407 exposed from the opening in the hard mask film 1408 is etched back (processed by dry etching) using the hard mask film 1408 as a mask to form an opening in the barrier insulating film 1407. With this operation, the first wiring 1405 is exposed from the opening in the barrier insulating film 1407. Etching back the barrier insulating film 1407 makes it possible to form the wall surface defining the opening in the barrier insulating film 1407 into a tapered face, using reactive dry etching. Reactive dry etching can use a gas containing fluorocarbon as an etching gas.

The hard mask film 1408 is preferably removed completely during an etch-back operation but may remain intact in the case of an insulating material. The shape of the opening in the barrier insulating film 1407 can be a circle having a diameter of 30 nm to 500 nm. The oxide on the surface of the first wiring 1405 is removed by RF etching that uses a non-reactive gas. Helium or argon can be used as the non-reactive gas.

Figure 14F:
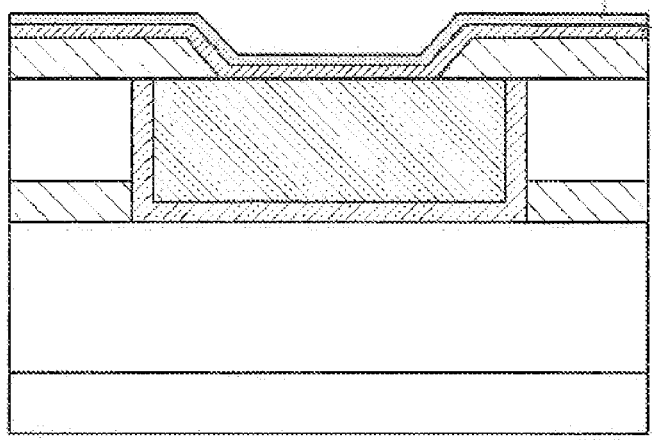
FIG. 14F is a schematic sectional view illustrating still another process (process 6) of manufacturing the semiconductor device including the two-terminal switching element according to the third exemplary embodiment of the present invention.

[Process 6] (FIG. 14F)

Titanium and aluminum are deposited by 0.5 nm or less in this order on the barrier insulating film 1407 including the first wiring 1405. Titanium and aluminum can be formed using the PVD or CVD method. A SIOCH polymer film containing silicon, oxygen, carbon, and hydrogen is formed as a second ion conductive layer 1409b by plasma CVD. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

Titanium and aluminum are exposed to a source of a SIOCH polymer film containing oxygen during the formation of the second ion conductive layer 1409b and thereby automatically oxidize into oxides, which form a first ion conductive layer 1409a and part of the second ion conductive layer 1409b. The portions defining the opening in the barrier insulating film 1407 have moisture and the like adhering to them upon an organic stripping process and are, therefore, preferably degassed by a heat treatment under reduced pressure at temperatures of about 250° C. to 350° C. before deposition of the first ion conductive layer 1409a.

Figure 14G:
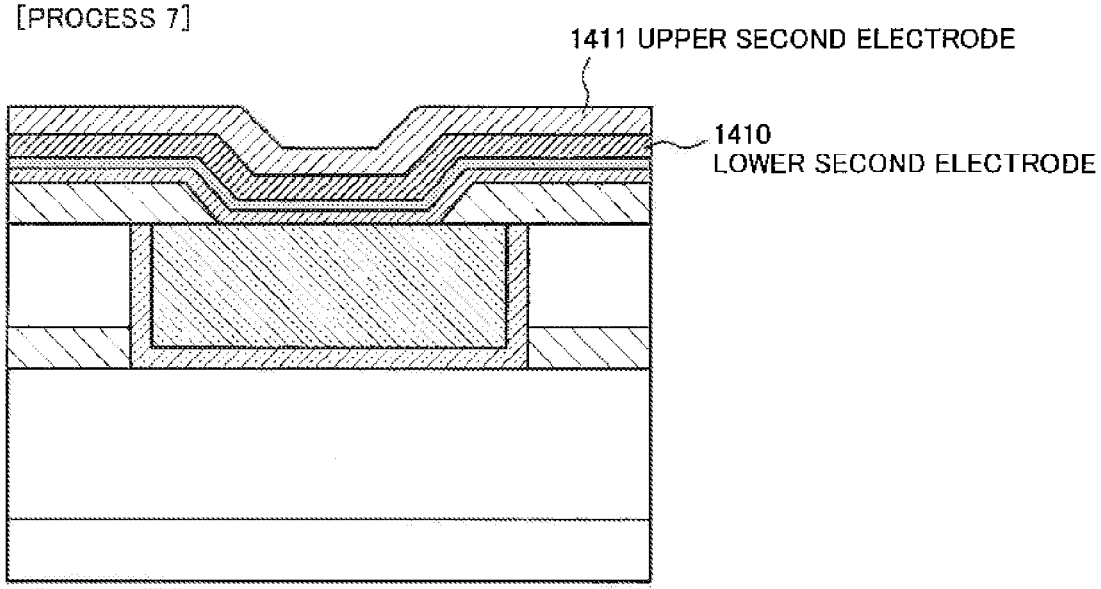
FIG. 14G is a schematic sectional view illustrating still another process (process 7) of manufacturing the semiconductor device including the two-terminal switching element according to the third exemplary embodiment of the present invention.

[Process 7] (FIG. 14G)

A 10-nm thick film made of an alloy of ruthenium and tantalum is formed on the second ion conductive layer 1409b as a lower second electrode 1410 by the co-sputtering method. At this time, ruthenium and tantalum targets are present in the same chamber and simultaneously sputtered to deposit an alloy film. A power of 150 W is supplied to the ruthenium target and a power of 50 W is supplied to the tantalum target to obtain a ruthenium content of 75%. An upper second electrode 1411 (for example, a 25-nm thick tantalum film) is further formed on the lower second electrode 1410.

Figure 14H:
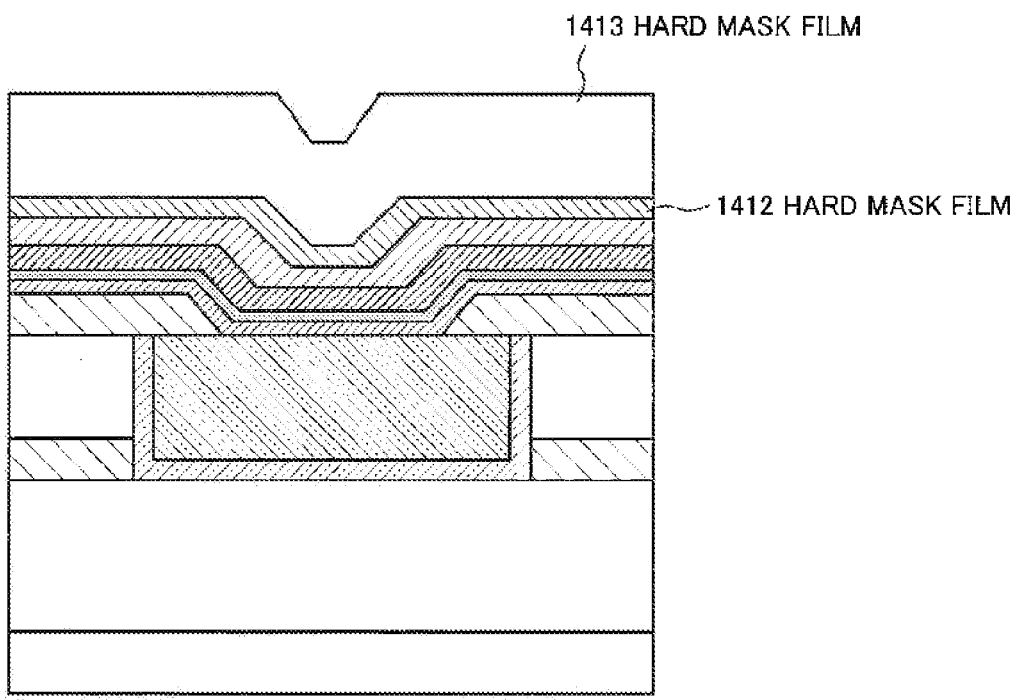
FIG. 14H is a schematic sectional view illustrating still another process (process 8) of manufacturing the semiconductor device including the two-terminal switching element according to the third exemplary embodiment of the present invention.

[Process 8] (FIG. 14H)

A hard mask film 1412 (for example, a 30-nm thick silicon nitride or silicon carbonitride film) and a hard mask film 1413 (for example, a 100-nm thick silicon oxide film) are stacked on the upper second electrode 1411 in this order. The hard mask films 1412 and 1413 can be deposited using the plasma CVD method. The hard mask films 1412 and 1413 can be formed using the general plasma CVD method in the technical field of the art.

The hard mask films 1412 and 1413 are preferably different types of films and can be implemented using, for example, a silicon carbonitride film for the hard mask film 1412 and a silicon oxide film for the hard mask film 1413. In this case, the hard mask film 1412 is preferably made of the same material as those of a protective insulating film and a barrier insulating film (to be described later). More specifically, surrounding the entire resistive-change element by the same material makes it possible to integrate the material interfaces together, thereby preventing entrance of, for example, moisture from the outside and further preventing desorption from the resistive-change element.

Figure 14I:
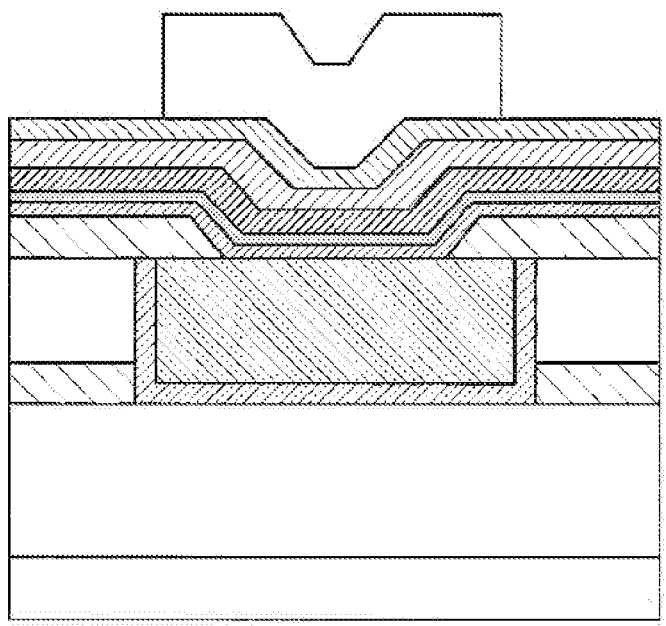
FIG. 14I is a schematic sectional view illustrating still another process (process 9) of manufacturing the semiconductor device including the two-terminal switching element according to the third exemplary embodiment of the present invention.

[Process 9] (FIG. 14I)

A photoresist (not illustrated) for forming a two-terminal switch by patterning is formed on the hard mask film 1413. Dry etching of the hard mask film 1413 is performed using the photoresist as a mask until the hard mask film 1412 becomes exposed. The photoresist is then removed by oxygen plasma ashing and organic stripping.

Figure 14J:
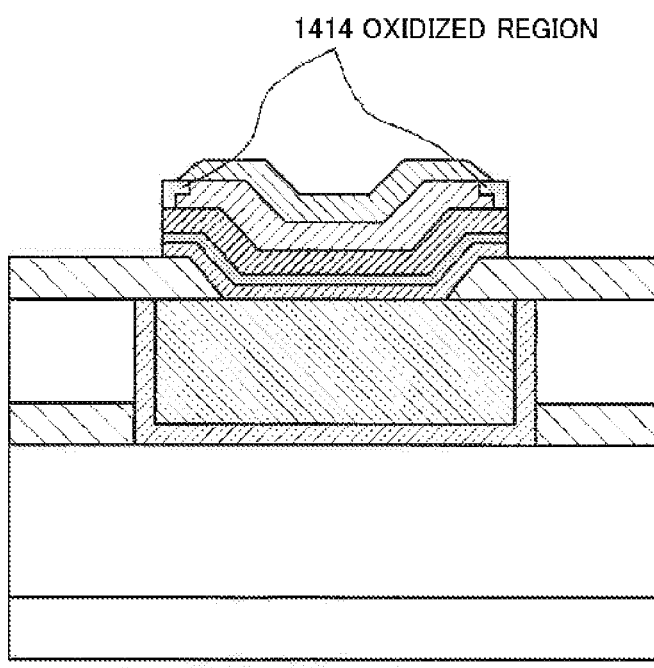
FIG. 14J is a schematic sectional view illustrating still another process (process 10) of manufacturing the semiconductor device including the two-terminal switching element according to the third exemplary embodiment of the present invention.

[Process 10] (FIG. 14J)

Dry etching is continuously performed on the hard mask film 1412, the upper second electrode 1411, the lower second electrode 1410, the second ion conductive layer 1409b, and the first ion conductive layer 1409a using the hard mask film 1413 as a mask. At this time, the hard mask film 1413 is preferably removed completely during an etch-back operation but may remain intact. When, for example, the upper second electrode 1411 is made of tantalum, it can be processed using chlorine-based RIE. When the lower second electrode 1410 is made of an alloy of ruthenium and tantalum, it is desirably processed using a gas mixture of chlorine, nitrogen, and oxygen at a chlorine:nitrogen:oxygen ratio of, for example, 25%:25%:50%.

The second ion conductive layer 1409b and the first ion conductive layer 1409a under the lower second electrode 1410 can also be etched using the same gas as that used for the second electrode. As a result, dry etching can be stopped on the lower, barrier insulating film 1407. The use of such a hard mask RIE method allows the resistive-change element portion to be processed without exposure to oxygen plasma ashing for resist removal.

When an oxidation process is performed using an oxygen plasma after processing, oxygen plasma irradiation is possible independently of the resist stripping time. By oxygen used during etching of layers under the lower second electrode 1410, the side surface and part of the upper surface of the upper second electrode 1411 exposed due to degeneration of the hard mask film 1412 oxidize into an oxidized region 1414.

Figure 14K:
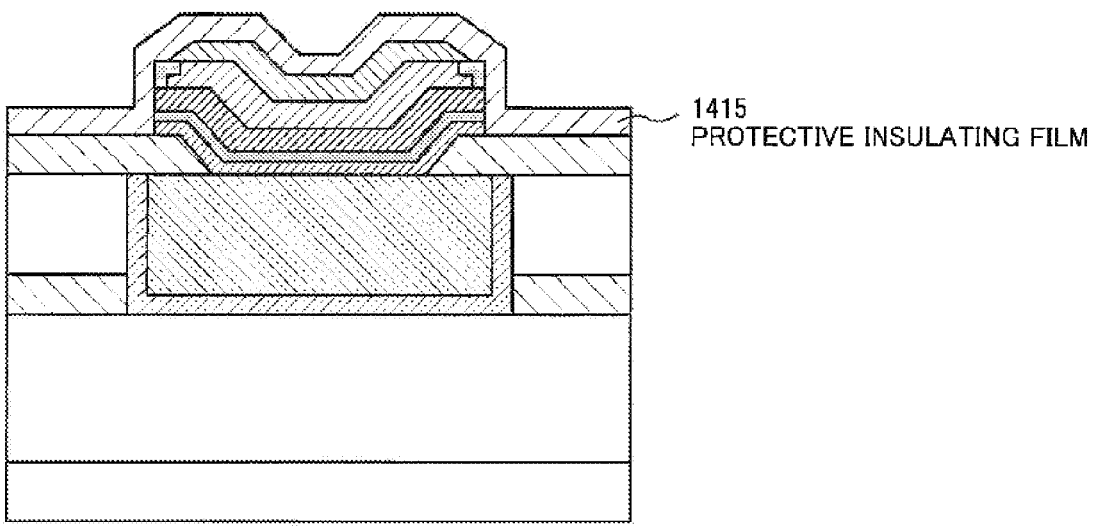
FIG. 14K is a schematic sectional view illustrating still another process (process 11) of manufacturing the semiconductor device including the two-terminal switching element according to the third exemplary embodiment of the present invention.

[Process 11] (FIG. 14K)

A protective insulating film 1415 (for example, a 20-nm thick silicon nitride or silicon carbonitride film) is deposited on the hard mask film 1412, the upper second electrode 1411, the lower second electrode 1410, the second ion conductive layer 1409b, the first ion conductive layer 1409a, and the barrier insulating film 1407. The protective insulating film 1415 can be deposited by the plasma CVD method. Before deposition, the reactive chamber needs to be maintained under reduced pressure, and this involves oxygen desorption from the side surfaces of the second ion conductive layer 1409b and the first ion conductive layer 1409a and increases the leakage current of these ion conductive layers. To suppress this effect, the deposition temperature of the protective insulating film 1415 is preferably set to 250° C. or less. Further, no reductive gas is preferably used in terms of exposure to a deposition gas under reduced pressure before deposition. A silicon nitride film formed using a SiH$_4$/N$_2$ gas mixture at a substrate temperature of 200° C. by a high-density plasma, for example, is preferably employed.

Figure 14L:
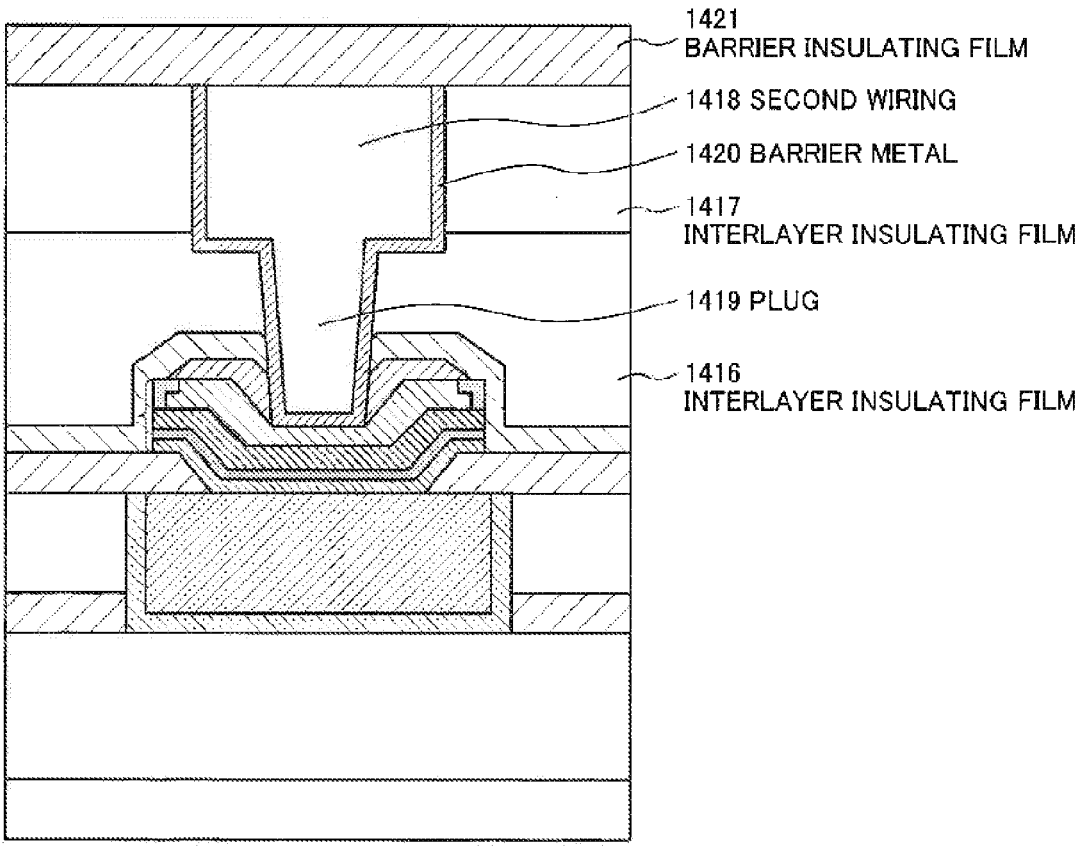
FIG. 14L is a schematic sectional view illustrating still another process (process 12) of manufacturing the semiconductor device including the two-terminal switching element according to the third exemplary embodiment of the present invention.

[Process 12] (FIG. 14L)

An interlayer insulating film 1416 (for example, a silicon oxide film) and an interlayer insulating film 1417 (for example, a stack of a 150-nm thick SiCHO film and a 150-nm thick silicon oxide film) are deposited on the protective insulating film 1415 in this order. A pilot hole for a plug 1419 is formed and a wiring trench for second wiring 1418 is further formed. A copper dual damascene wiring process is used to simultaneously form second wiring 1418 (for example, copper) and a plug 1419 (for example, copper) in the wiring trench and the pilot hole, respectively, through a barrier metal 1420 (for example, tantalum nitride/tantalum). A barrier insulating film 1421 (for example, a silicon nitride film) is deposited on the interlayer insulating film 1417 including the second wiring 1418.

The second wiring 1418 can be formed using a process similar to that used in forming lower layer wiring. At this time, the use of the same material for both the barrier metal 1420 and the upper second electrode 1411 makes it possible to reduce the contact resistance between the plug 1419 and the upper second electrode 1411 to improve the element performance. The interlayer insulating films 1416 and 1417 can be formed by the plasma CVD method. To eliminate any step formed by the two-terminal switch, the interlayer insulating film 1416 may be formed at a desired thickness (for example, 110 nm) by being thickly deposited and then etched and planarized by CMP.

According to this exemplary embodiment, short-circuiting of a switching element using a metal bridge is prevented. Further, exposure of Cu wiring is prevented by suppressing etching of the barrier insulating film. These features attain a switching element, a switching element manufacturing method, a semiconductor device, and a semiconductor device manufacturing method having excellent operational stability and a high production yield.

In other words, this exemplary embodiment provides a switching element having excellent operational stability and a high production yield, and a semiconductor device using the switching element.

(Fourth Exemplary Embodiment)

Figure 15:
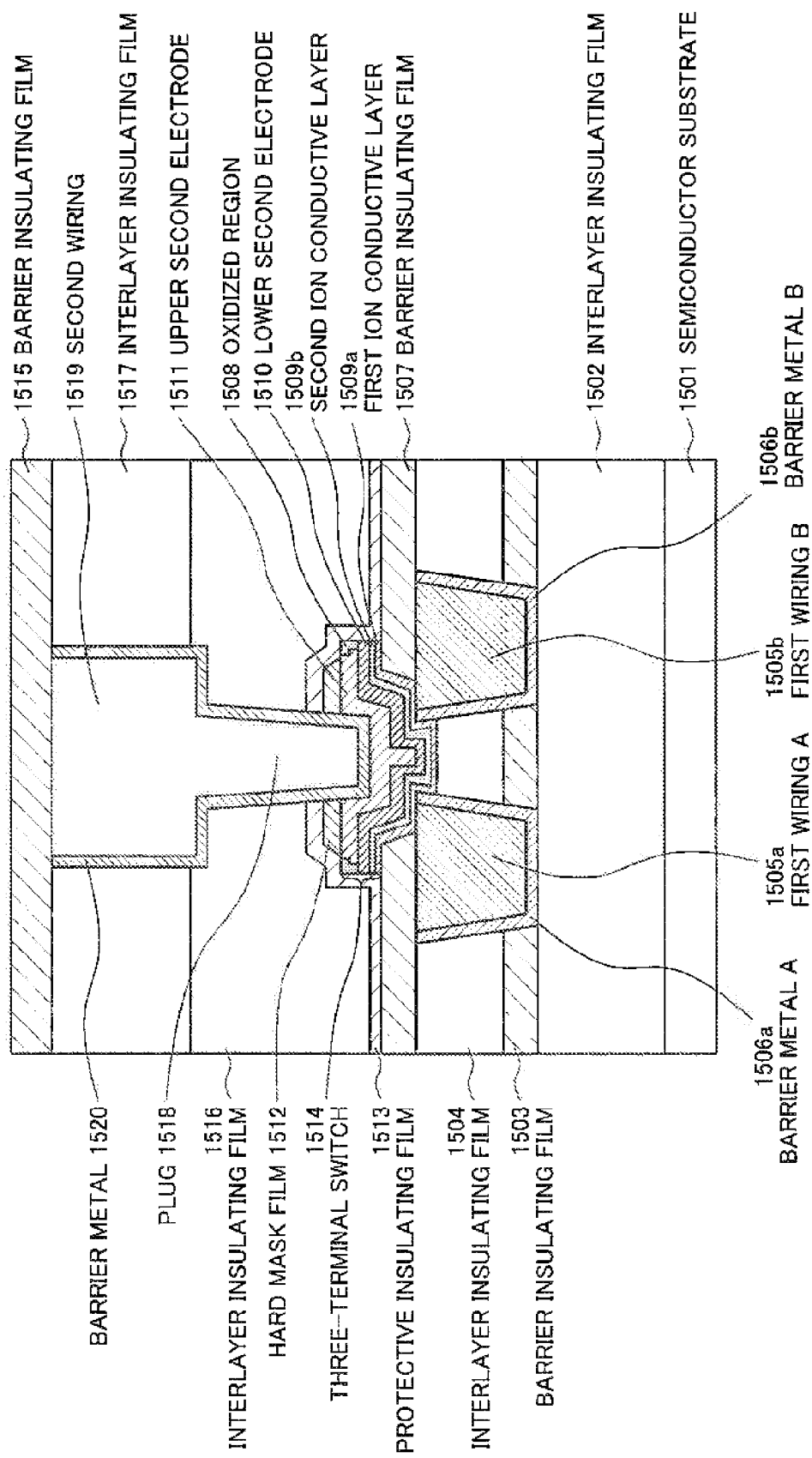
FIG. 15 is a schematic sectional view illustrating the configuration of a semiconductor device including a three-terminal switching element according to a fourth exemplary embodiment of the present invention.

FIG. 15 is a schematic sectional view illustrating the configuration of a semiconductor device including a three-terminal switching element according to a fourth exemplary embodiment of the present invention. A multilayer wiring layer on a semiconductor substrate 1501 includes a three-terminal switch 1514.

The multilayer wiring layer includes, on the semiconductor substrate 1501, an insulator stack including an interlayer insulating film 1502, a barrier insulating film 1503, an interlayer insulating film 1504, a barrier insulating film 1507, a protective insulating film 1513, interlayer insulating films 1516 and 1517, and a barrier insulating film 1515 stacked in this order. The multilayer wiring layer includes first wiring A 1505a and first wiring B 1505b buried through a barrier metal A 1506a and a barrier metal B 1506b in wiring trenches formed in the interlayer insulating film 1504 and the barrier insulating film 1503. The multilayer wiring layer also includes second wiring 1519 buried in a wiring trench formed in the interlayer insulating films 1516 and 1517. A plug 1518 is buried in a pilot hole formed in the interlayer insulating film 1516, the protective insulating film 1513, and a hard mask film 1512. The second wiring 1519 and the plug 1518 are integrated with each other. The side to bottom surfaces of the second wiring 1519 and the plug 1518 are covered with a barrier metal 1520.

In an opening formed in the barrier insulating film 1507, a first ion conductive layer 1509a, a second ion conductive layer 1509b, and a lower second electrode 1510 are formed on the first wiring A 1505a and the first wiring B 1505b, the wall surface defining the opening in the barrier insulating film 1507, and the barrier insulating film 1507. The first ion conductive layer 1509a, the second ion conductive layer 1509b, the lower second electrode 1510, and an upper second electrode 1511 are stacked in this order to form a three-terminal switch 1514. The hard mask film 1512 is formed on the upper second electrode 1511. The upper to side surfaces of the stack of the first ion conductive layer 1509a, the second ion conductive layer 1509b, the lower second electrode 1510, the upper second electrode 1511, and the hard mask film 1512 are covered with the protective insulating film 1513.

Enabling the first wiring A 1505a and the first wiring B 1505b to serve as the first electrode of the three-terminal switch 1514 makes it possible to lower the electrode resistance while achieving fewer processes. As an additional process to the normal copper damascene wiring process, simply generating at least two PR (photoresist) mask sets allows mounting of a three-terminal switch so as to simultaneously achieve reductions in both resistance and cost of the element.

In the three-terminal switch 1514, the first ion conductive layer 1509a is in contact with the first wiring A 1505a and the first wiring B 1505*b* and the second ion conductive layer 1509*b* is in contact with the lower second electrode 1510, in the region of the opening formed in the barrier insulating film 1507.

The plug 1518 is electrically connected to the upper second electrode 1511 via the barrier metal 1520 on the upper second electrode 1511. The three-terminal switch 1514 undergoes ON/OFF control by voltage application or current supply. For example, ON/OFF control is performed using electromigration of the metal associated with the first wiring A 1505*a* and the first wiring B 1505*b* into the first ion conductive layer 1509*a* and the second ion conductive layer 1509*b*. The ON and OFF states are maintained non-volatile.

The semiconductor substrate 1501 is a substrate including semiconductor elements. Examples of the semiconductor substrate 1501 may include substrates such as a silicon substrate, a single-crystal substrate, an SOI substrate, a TFT substrate, and a liquid crystal manufacturing substrate.

The interlayer insulating film 1502 is an insulating film formed on the semiconductor substrate 1501. Examples of the interlayer insulating film 1502 may include a silicon oxide film and a low dielectric film (for example, a SiOCH film) having a relative dielectric constant lower than that of a silicon oxide film. The interlayer insulating film 1502 may be implemented in a stack of a plurality of insulating films.

The barrier insulating film 1503 is an insulating film which has barrier properties and is interposed between the interlayer insulating films 1502 and 1504. The barrier insulating film 1503 serves as an etching stop layer during processing of wiring trenches for the first wiring A 1505*a* and the first wiring B 1505*b*. Examples of the barrier insulating film 1503 may include a silicon nitride film, a SiC film, and a silicon carbonitride film. Wiring trenches to bury the first wiring A 1505*a* and the first wiring B 1505*b* are formed in the barrier insulating film 1503. The first wiring A 1505*a* and the first wiring B 1505*b* are buried in the wiring trenches through the barrier metal A 1506*a* and the barrier metal B 1506*b*. The barrier insulating film 1503 can also be removed, depending on the selection of the etching conditions of the wiring trenches.

The interlayer insulating film 1504 is an insulating film formed on the barrier insulating film 1503. Examples of the interlayer insulating film 1504 may include a silicon oxide film and a low dielectric film (for example, a SiOCH film) having a relative dielectric constant lower than that of a silicon oxide film. The interlayer insulating film 1504 may be implemented in a stack of a plurality of insulating films. Wiring trenches to bury the first wiring A 1505*a* and the first wiring B 1505*b* are formed in the interlayer insulating film 1504. The first wiring A 1505*a* and the first wiring B 1505*b* are buried in the wiring trenches through the barrier metal A 1506*a* and the barrier metal B 1506*b*.

The first wiring A 1505*a* and the first wiring B 1505*b* are wiring buried through the barrier metal A 1506*a* and the barrier metal B 1506*b* in the wiring trenches formed in the interlayer insulating film 1504 and the barrier insulating film 1503. The first wiring A 1505*a* and the first wiring B 1505*b* serve as the first electrode of the three-terminal switch 1514 and are in direct contact with the first ion conductive layer 1509*a*. The second ion conductive layer 1509*b* has its lower surface in direct contact with the first ion conductive layer 1509*a* and its upper surface in direct contact with the lower second electrode 1510. The first wiring A 1505*a* and the first wiring B 1505*b* are made of a diffusible metal capable of ion conduction in the first ion conductive layer 1509*a* and the second ion conductive layer 1509*b* and can use, for example, copper. The first wiring A 1505*a* and the first wiring B 1505*b* may also be alloyed with aluminum.

The barrier metal A 1506*a* and the barrier metal B 1506*b* are conductive films which have barrier properties and cover the wiring side to bottom surfaces to prevent diffusion of the metal associated with the first wiring A 1505*a* and the first wiring B 1505*b* to the interlayer insulating film 1504 and underlying layers. When the first wiring A 1505*a* and the first wiring B 1505*b* are made of a metal containing, for example, copper as the main component, the barrier metal A 1506*a* and the barrier metal B 1506*b* can use a refractory metal, its nitride, or their stacked film. Examples of the refractory metal or its nitride may include tantalum, tantalum nitride, titanium nitride, and tungsten carbonitride.

The barrier insulating film 1507 is formed on the interlayer insulating film 1504 including the first wiring A 1505*a* and the first wiring B 1505*b* to prevent oxidation of the metal (for example, copper) associated with the first wiring A 1505*a* and the first wiring B 1505*b*. The barrier insulating film 1507 also prevents diffusion of the metal associated with the first wiring A 1505*a* and the first wiring B 1505*b* into the interlayer insulating film 1516. The barrier insulating film 1507 serves as an etching stop layer during processing of the first ion conductive layer 1509*a*, the second ion conductive layer 1509*b*, the lower second electrode 1510, and the upper second electrode 1511. Examples of the barrier insulating film 1507 may include a silicon carbonitride film, a silicon nitride film, and their stack. The barrier insulating film 1507 is preferably made of the same material as those of the protective insulating film 1513 and the hard mask film 1512.

The first ion conductive layer 1509*a* and the second ion conductive layer 1509*b* are films, the resistances of which undergo a non-volatile change. The first ion conductive layer 1509*a* and the second ion conductive layer 1509*b* can be made of a material, the resistance of which changes due to an action (for example, diffusion or ion conduction) of the metal associated with the first wiring A 1505*a* and the first wiring B 1505*b* (first electrode). Films capable of ion conduction are used when metal ion precipitation brings about a change in resistance of the three-terminal switch 1514.

The second ion conductive layer 1509*b* is formed using the plasma CVD method. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

The first ion conductive layer 1509*a* serves to prevent diffusion of the metal associated with the first wiring A 1505*a* and the first wiring B 1505*b* into the second ion conductive layer 1509*b* due to heating or a plasma during deposition of the second ion conductive layer 1509*b*. The first ion conductive layer 1509*a* also serves to prevent oxidation of the first wiring A 1505*a* and the first wiring B 1505*b*, the oxidation of which promotes diffusion. The metal of the first ion conductive layer 1509*a*, for example, titanium, aluminum, or their stack, turns into titanium oxide, aluminum oxide, or their stack during deposition of the second ion conductive layer 1509*b*, and forms part of the ion conductive layer. The optimum total thickness of the metal of the first ion conductive layer 1509*a* is 1 nm; the use of thicknesses smaller than 1 nm slightly oxidizes the copper wiring surface while the use of thicknesses larger than 1 nm makes the metal remain partly unoxidized.

The first ion conductive layer 1509a and the second ion conductive layer 1509b are formed on the first wiring A 1505a and the first wiring B 1505b, a tapered face defining the opening in the barrier insulating film 1507, and the barrier insulating film 1507. In the first ion conductive layer 1509a, the outer peripheral portion of the portion connecting the first wiring A 1505a and the first wiring B 1505b to the first ion conductive layer 1509a is located at least along the tapered face defining the opening in the barrier insulating film 1507.

The first ion conductive layer 1509a may form a stack of titanium and aluminum or be implemented in single-layered titanium and aluminum films.

The lower second electrode 1510 serves as the upper electrode of the three-terminal switch 1514 and is in contact with the second ion conductive layer 1509b. The lower second electrode 1510 uses a metal which is less likely to ionize and, in turn, is less likely to diffuse and ionically conduct in the second ion conductive layer 1509b than the metal associated with the first wiring A 1505a and the first wiring B 1505b. Examples include alloys of ruthenium and titanium, tantalum, aluminum, manganese, zirconium, hafnium, magnesium, cobalt, copper, and zinc exhibiting high adhesion strength to the metal associated with the first wiring A 1505a and the first wiring B 1505b. The ruthenium content is desirably 10% (inclusive) to 80% (inclusive). Ruthenium may be doped with two or more types of metals.

As a metal with which ruthenium is doped in the lower second electrode 1510, a metal having a standard Gibbs energy higher in the negative direction than that of ruthenium is desirably selected. Titanium, tantalum, aluminum, manganese, zirconium, hafnium, magnesium, cobalt, copper, and zinc having a standard Gibbs energy higher in the negative direction than that of ruthenium are more likely to cause spontaneous chemical reactions than ruthenium. Hence, the use of an alloy of ruthenium as the lower second electrode 1510 may improve the adhesion strength to a metal bridge formed by the metal associated with the first wiring A 1505a and the first wiring B 1505b.

When, however, the lower second electrode 1510 is formed using only a doping metal, the obtained electrode has a standard Gibbs energy equal to or higher in the negative direction than that of the metal associated with the first wiring A 1505a and the first wiring B 1505b. An ON to OFF transition progresses upon oxidation (dissolution) of the metal bridge. When the standard Gibbs energy of the lower second electrode 1510 is higher in the negative direction than that of the metal associated with the first wiring A 1505a and the first wiring B 1505b, a transition to OFF state is impossible because oxidation of the lower second electrode 1510 progresses more than oxidation of the metal bridge. Therefore, the lower second electrode 1510 needs to be made of an alloy of ruthenium having a standard Gibbs energy lower in the negative direction than that of copper.

The upper second electrode 1511 serves to protect the stacked structure of the three-terminal switch 1514. More specifically, the upper second electrode 1511 can restrain damage to the stacked structure of the three-terminal switch 1514 to maintain given switching characteristics of the three-terminal switch 1514. The upper second electrode 1511 can use, for example, tantalum, titanium, tungsten, or their nitrides.

The hard mask film 1512 serves both as a hard mask film and a passivation film in etching the upper second electrode 1511, the lower second electrode 1510, the second ion conductive layer 1509b, and the first ion conductive layer 1509a. Examples of the hard mask film 1512 may include a silicon nitride film. The hard mask film 1512 is preferably made of the same material as those of the protective insulating film 1513 and the barrier insulating film 1507. More specifically, surrounding the three-terminal switch 1514 by the same material makes it possible to integrate the material interfaces together, thereby preventing entrance of, for example, moisture from the outside and further preventing desorption from the three-terminal switch 1514.

The three-terminal switch 1514 is etched using the hard mask film 1512 as an etching mask. The lower second electrode 1510 implemented in an alloy electrode containing ruthenium as the main component is etched by charging oxygen, nitrogen, and chlorine into a chamber as etching gases. An oxidized region 1508 serving as an insulator is formed on the upper portion and side surface of the upper second electrode 1511 by oxygen that is one of the etching gases. The side surface means herein the peripheral portion of the upper second electrode 1511.

The protective insulating film 1513 is an insulating film which functions to prevent desorption of oxygen from the first ion conductive layer 1509a and the second ion conductive layer 1509b while inflicting no damage on the three-terminal switch 1514. Examples of the protective insulating film 1513 may include a silicon nitride film and a silicon carbonitride film. The protective insulating film 1513 is preferably made of the same material as those of the hard mask film 1512 and the barrier insulating film 1507. In the case of the same material, the protective insulating film 1513 can be integrated with the barrier insulating film 1507 and the hard mask film 1512 to improve the adhesion strength of the interfaces and more reliably protect the three-terminal switch 1514.

The interlayer insulating film 1516 is an insulating film formed on the protective insulating film 1513. Examples of the interlayer insulating film 1516 may include a silicon oxide film, a SiOC film, and a low dielectric film (for example, a SiOCH film) having a relative dielectric constant lower than that of a silicon oxide film. The interlayer insulating film 1516 may be implemented in a stack of a plurality of insulating films. The interlayer insulating film 1516 may be made of the same material as that of the interlayer insulating film 1504. A pilot hole to bury the plug 1518 is formed in the interlayer insulating film 1516 such that the plug 1518 is buried in the pilot hole through the barrier metal 1520.

The interlayer insulating film 1517 is an insulating film formed on the interlayer insulating film 1516. Examples of the interlayer insulating film 1517 may include a silicon oxide film, a SiOC film, and a low dielectric film (for example, a SiOCH film) having a relative dielectric constant lower than that of a silicon oxide film. The interlayer insulating film 1517 may be implemented in a stack of a plurality of insulating films. The interlayer insulating film 1517 may be made of the same material as that of the interlayer insulating film 1516. A wiring trench to bury the second wiring 1519 is formed in the interlayer insulating film 1517 such that the second wiring 1519 is buried in the wiring trench through the barrier metal 1520.

The second wiring 1519 is wiring buried through the barrier metal 1520 in the wiring trench formed in the interlayer insulating films 1515 and 1516. The second wiring 1519 is integrated with the plug 1518. The plug 1518 is buried through the barrier metal 1520 in the pilot hole formed in the interlayer insulating film 1516, the protective insulating film 1513, and the hard mask film 1512. The plug 1518 is electrically connected to the upper second electrode 1511 via the barrier metal 1520. The second wiring 1519 and the plug 1518 can use, for example, copper.

The barrier metal 1520 is a conductive film which has barrier properties and covers the side to bottom surfaces of the second wiring 1519 and the plug 1518 to prevent diffusion of the metal associated with the second wiring 1519 (including the plug 1518) to the interlayer insulating films 1516 and 1517 and underlying layers. When the second wiring 1519 and the plug 1518 are made of a metal containing copper as the main component, the barrier metal 1520 can use a refractory metal or its nitride, such as tantalum, tantalum nitride, titanium nitride, or tungsten carbonitride, or their stacked film. The barrier metal 1520 is preferably made of the same material as that of the upper second electrode 1511. When the barrier metal 1520 has, for example, a stack of tantalum nitride (lower layer)/tantalum (upper layer), tantalum nitride employed as the lower layer material is preferably used for the upper second electrode 1511.

The barrier insulating film 1515 is an insulating film which is formed on the interlayer insulating film 1517 including the second wiring 1519, and serves to prevent oxidation of the metal (for example, copper) associated with the second wiring 1519 and prevent diffusion of the metal associated with the second wiring 1519 to upper layers. Examples of the barrier insulating film 1515 may include a silicon carbonitride film, a silicon nitride film, and their stack.

(Etching)

Etching of the three-terminal switch illustrated in FIG. 15 will be described below. The three-terminal switch illustrated in FIG. 15 is etched by the same method as the etching method described in the second exemplary embodiment.

(Switching Operation)

The operation of the three-terminal switch illustrated in FIG. 15 will be described below with reference to FIG. 12. The three-terminal switch illustrated in FIG. 15 is implemented using two, two-terminal switches which share the lower second electrode 1204 shown in FIG. 12 according to the third exemplary embodiment. Thus, the operation of each two-terminal switch is the same as in the switching operation method described in the third exemplary embodiment. During the operation of one two-terminal switch, the first wiring 1201 of another two-terminal switch is floating.

(Manufacturing Method)

A method for manufacturing a semiconductor device including a switching element according to this exemplary embodiment will be described next with reference to the accompanying drawings. FIGS. 16A to 16L are process sectional views schematically illustrating a method for manufacturing a semiconductor device including a switching element according to this exemplary embodiment.

Figure 16A:
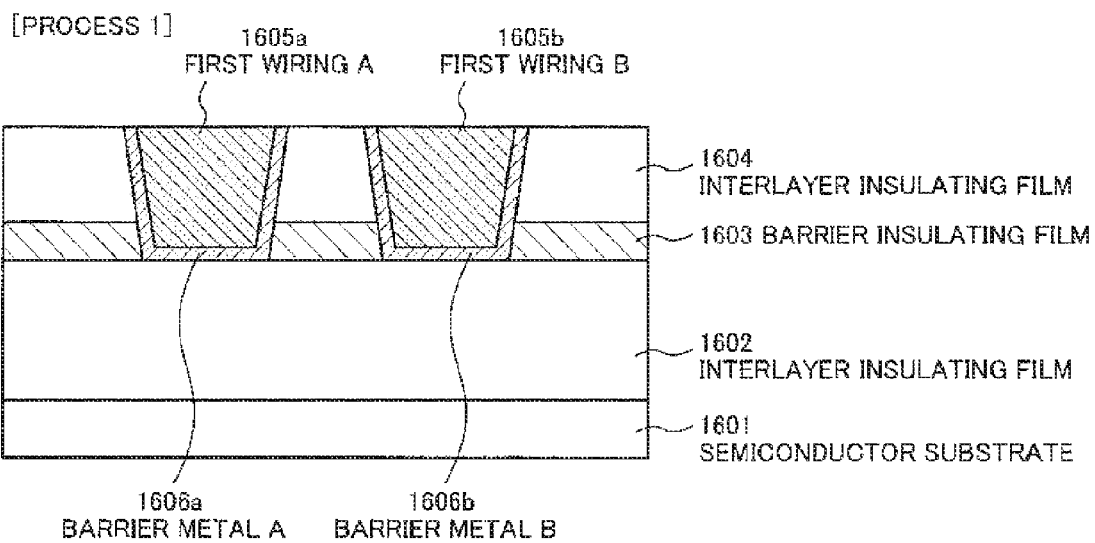
FIG. 16A is a schematic sectional view illustrating a process (process 1) of manufacturing a semiconductor device including a three-terminal switching element according to the fourth exemplary embodiment of the present invention.

[Process 1] (FIG. 16A)

An interlayer insulating film 1602 (for example, a 300-nm thick silicon oxide film) is deposited on a semiconductor substrate 1601 (for example, a substrate including semiconductor elements). A barrier insulating film 1603 (for example, a 30-nm thick silicon nitride film) is also deposited on the interlayer insulating film 1602. An interlayer insulating film 1604 (for example, a stack of a 150-nm thick SiCHO film and a 100-nm thick silicon oxide film) is moreover deposited on the barrier insulating film 1603. Wiring trenches are formed in the interlayer insulating film 1604 and the barrier insulating film 1603 using the lithography method (including photoresist formation, dry etching, and photoresist removal). First wiring A 1605a and first wiring B 1605b (for example, copper) are buried in the wiring trenches through a barrier metal A 1606a and a barrier metal B 1606b (for example, 5-nm/5-nm thick tantalum nitride/tantalum films).

Interlayer insulating films 1602 and 1604 can be formed by the plasma CVD method. First wiring A 1605a and first wiring B 1605b are formed in the following way: a barrier metal A 1606a and a barrier metal B 1606b (for example, a stacked film of tantalum nitride/tantalum) are formed by the PVD method. Copper seeds are formed by the PVD method and the copper is buried in the wiring trenches by the electroplating method. The first wiring A 1605a and the first wiring B 1605b can be formed by performing a heat treatment at temperatures of 200° C. or more and removing excess copper except in the wiring trenches by the CMP method.

Figure 16B:
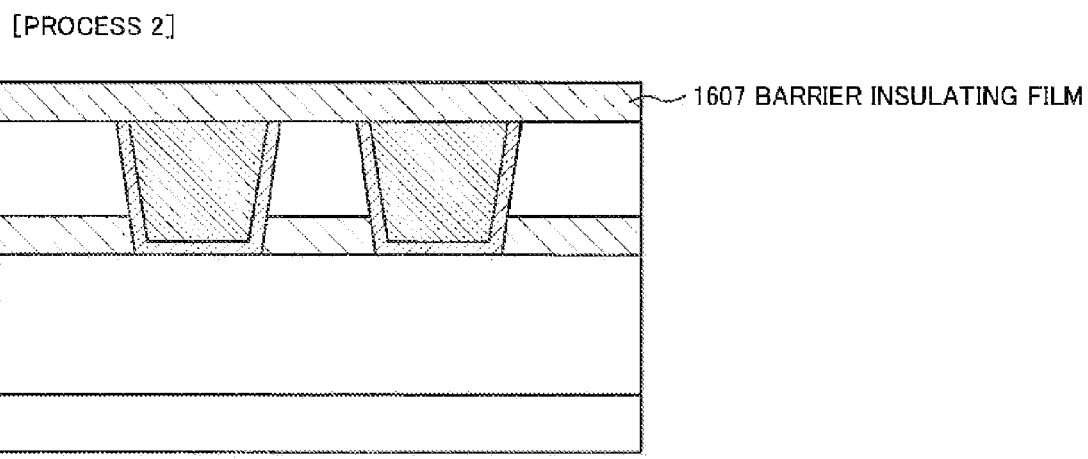
FIG. 16B is a schematic sectional view illustrating another process (process 2) of manufacturing the semiconductor device including the three-terminal switching element according to the fourth exemplary embodiment of the present invention.

[Process 2] (FIG. 16B)

A barrier insulating film 1607 (for example, a 30-nm thick silicon nitride or silicon carbonitride film) is formed on the interlayer insulating film 1604 including the first wiring A 1605a and the first wiring B 1605b. The barrier insulating film 1607 can be formed by the plasma CVD method. The thickness of the barrier insulating film 1607 is preferably about 10 nm to 50 nm.

Figure 16C:
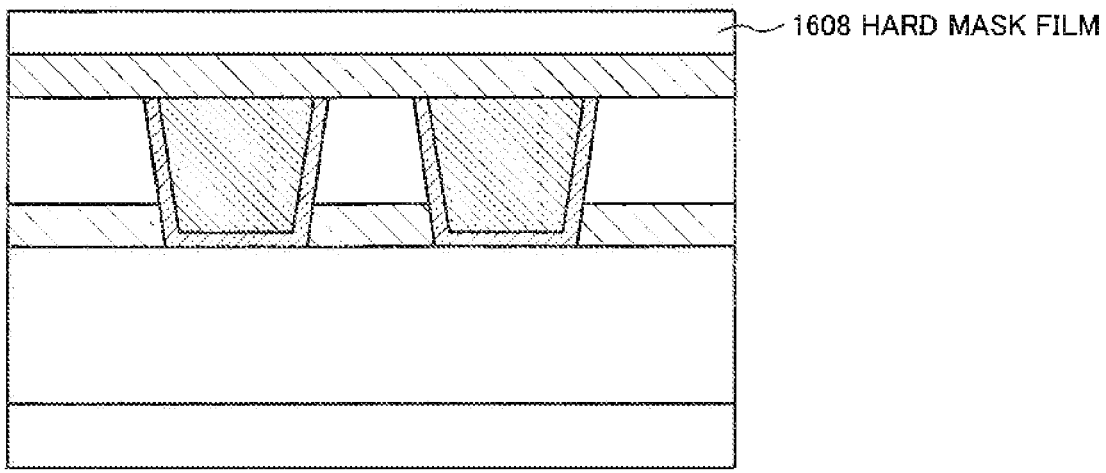
FIG. 16C is a schematic sectional view illustrating still another process (process 3) of manufacturing the semiconductor device including the three-terminal switching element according to the fourth exemplary embodiment of the present invention.

[Process 3] (FIG. 16C)

A hard mask film 1608 (for example, a 40-nm thick silicon oxide film) is formed on the barrier insulating film 1607. Note that in terms of maintaining a high etching selectivity in dry etching, the hard mask film 1608 is preferably made of a material different from that of the barrier insulating film 1607 and may either be an insulating or conductive film. Examples of the hard mask film 1608 may include a silicon oxide film, a silicon nitride film, titanium nitride, titanium, tantalum, and tantalum nitride, as well as a stack of silicon nitride/silicon oxide films.

Figure 16D:
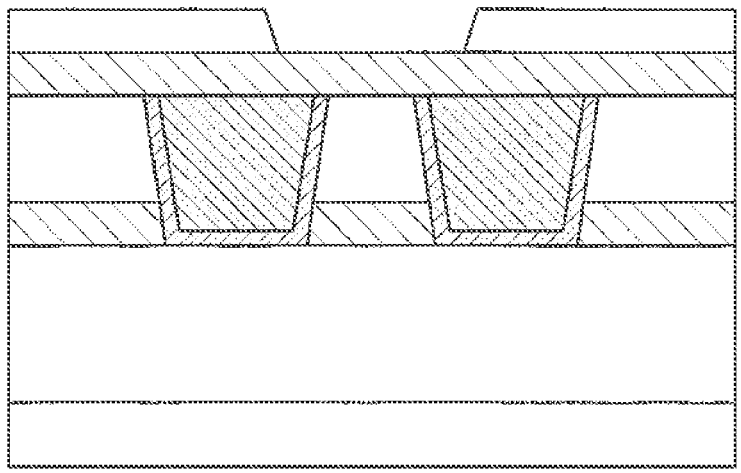
FIG. 16D is a schematic sectional view illustrating still another process (process 4) of manufacturing the semiconductor device including the three-terminal switching element according to the fourth exemplary embodiment of the present invention.

[Process 4] (FIG. 16D)

An opening pattern is formed in the hard mask film 1608 by patterning the hard mask film 1608 with an opening using a photoresist (not illustrated), and performing dry etching using the photoresist as a mask. The photoresist is then stripped by, for example, oxygen plasma ashing. At this time, dry etching need not always be stopped on the upper surface of the barrier insulating film 1607 and may have reached into the barrier insulating film 1607.

Figure 16E:
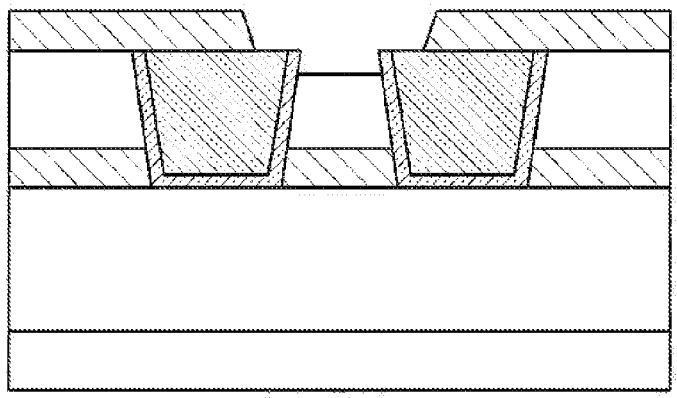
FIG. 16E is a schematic sectional view illustrating still another process (process 5) of manufacturing the semiconductor device including the three-terminal switching element according to the fourth exemplary embodiment of the present invention.

[Process 5] (FIG. 16E)

The barrier insulating film 1607 exposed from the opening in the hard mask film 1608 is etched back (processed by dry etching) using the hard mask film 1608 as a mask to form an opening in the barrier insulating film 1607. With this operation, the first wiring A 1605a and the first wiring B 1605b are exposed from the opening in the barrier insulating film 1607. Etching back the barrier insulating film 1607 makes it possible to form the wall surface defining the opening in the barrier insulating film 1607 into a tapered face, using reactive dry etching. Reactive dry etching can use a gas containing fluorocarbon as an etching gas.

The hard mask film 1608 is preferably removed completely during an etch-back operation but may remain intact in the case of an insulating material. The shape of the opening in the barrier insulating film 1607 can be a circle having a diameter of 100 nm to 500 nm. The oxide on the surfaces of the first wiring A 1605a and the first wiring B 1605b is removed by RF (Radio Frequency; high frequency) etching that uses a non-reactive gas. Helium or argon can be used as the non-reactive gas.

Figure 16F:
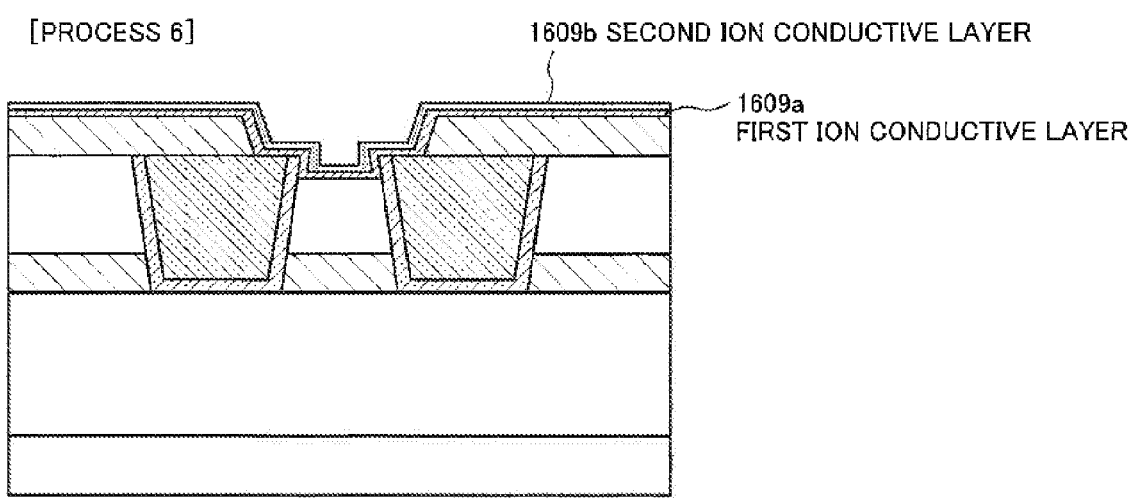
FIG. 16F is a schematic sectional view illustrating still another process (process 6) of manufacturing the semiconductor device including the three-terminal switching element according to the fourth exemplary embodiment of the present invention.

[Process 6] (FIG. 16F)

Titanium and aluminum are deposited by 0.5 nm or less in this order on the barrier insulating film 1607 including the first wiring A 1605a and the first wiring B 1605b. Titanium and aluminum can be formed using the PVD or CVD method. A SIOCH polymer film containing silicon, oxygen, carbon, and hydrogen is formed as a second ion conductive layer 1609b by plasma CVD. Supply of RF power is started when a source of cyclic organic siloxane and helium serving as a carrier gas have been fed into a reaction chamber, supply of these two substances has stabilized, and the reaction chamber has reached a constant pressure. A source is supplied by 10 to 200 sccm, and helium is supplied via a source evaporator by 500 sccm and directly supplied into the reaction chamber by 500 sccm on another line.

Titanium and aluminum are exposed to a source of a SIOCH polymer film containing oxygen during the formation of the second ion conductive layer 1608b and thereby automatically oxidize into oxides, which form a first ion conductive layer 1609a and part of the second ion conductive layer 1609b. The portions defining the opening in the barrier insulating film 1607 have moisture and the like adhering to them upon an organic stripping process and are, therefore, preferably degassed by a heat treatment under reduced pressure at temperatures of about 250° C. to 350° C. before deposition of the first ion conductive layer 1609a.

Figure 16G:
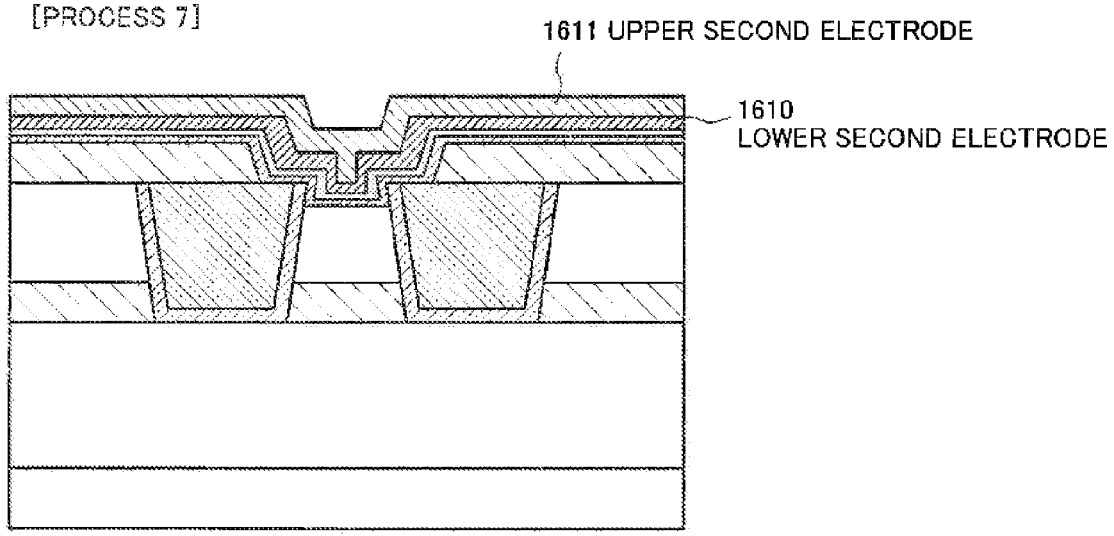
FIG. 16G is a schematic sectional view illustrating still another process (process 7) of manufacturing the semiconductor device including the three-terminal switching element according to the fourth exemplary embodiment of the present invention.

[Process 7] (FIG. 16G)

A 10-nm thick film made of an alloy of ruthenium and tantalum is formed on the second ion conductive layer 1609b as a lower second electrode 1610 by the co-sputtering method. At this time, ruthenium and tantalum targets are present in the same chamber and simultaneously sputtered to deposit an alloy film. A power of 150 W is supplied to the ruthenium target and a power of 50 W is supplied to the tantalum target to obtain a ruthenium content of 75%. An upper second electrode 1611 (for example, a 25-nm thick tantalum film) is further formed on the lower second electrode 1610.

Figure 16H:
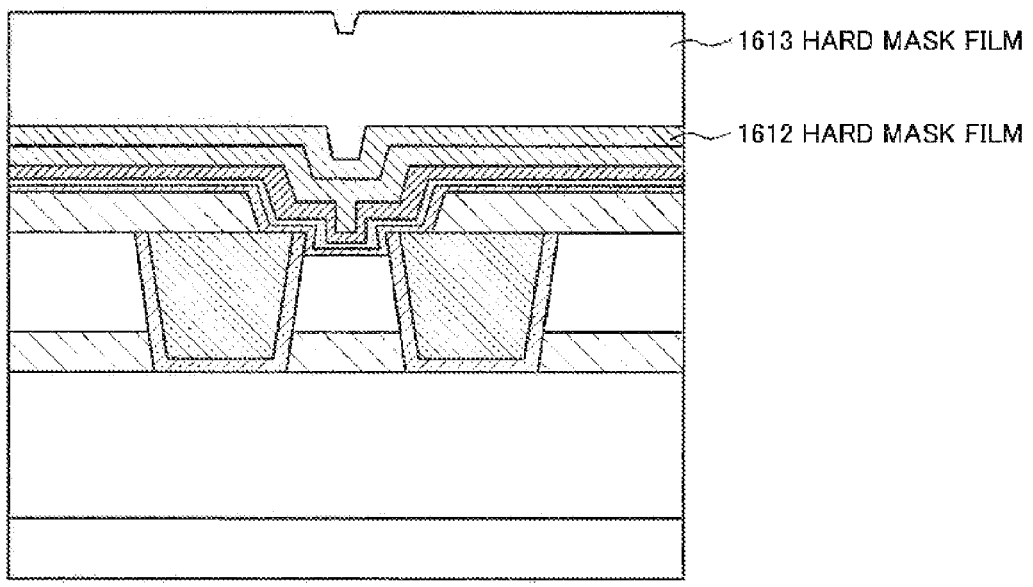
FIG. 16H is a schematic sectional view illustrating still another process (process 8) of manufacturing the semiconductor device including the three-terminal switching element according to the fourth exemplary embodiment of the present invention.

[Process 8] (FIG. 16H)

A hard mask film 1612 (for example, a 30-nm thick silicon nitride or silicon carbonitride film) and a hard mask film 1613 (for example, a 100-nm thick silicon oxide film) are stacked on the upper second electrode 1611 in this order. The hard mask films 1612 and 1613 can be deposited using the plasma CVD method. The hard mask films 1612 and 1613 can be formed using the general plasma CVD method in the technical field of the art.

The hard mask films 1612 and 1613 are preferably different types of films and can be implemented using, for example, a silicon carbonitride film for the hard mask film 1612 and a silicon oxide film for the hard mask film 1613. In this case, the hard mask film 1612 is preferably made of the same material as those of a protective insulating film and a barrier insulating film (to be described later). More specifically, surrounding the entire resistive-change element by the same material makes it possible to integrate the material interfaces together, thereby preventing entrance of, for example, moisture from the outside and further preventing desorption from the resistive-change element.

Figure 16I:
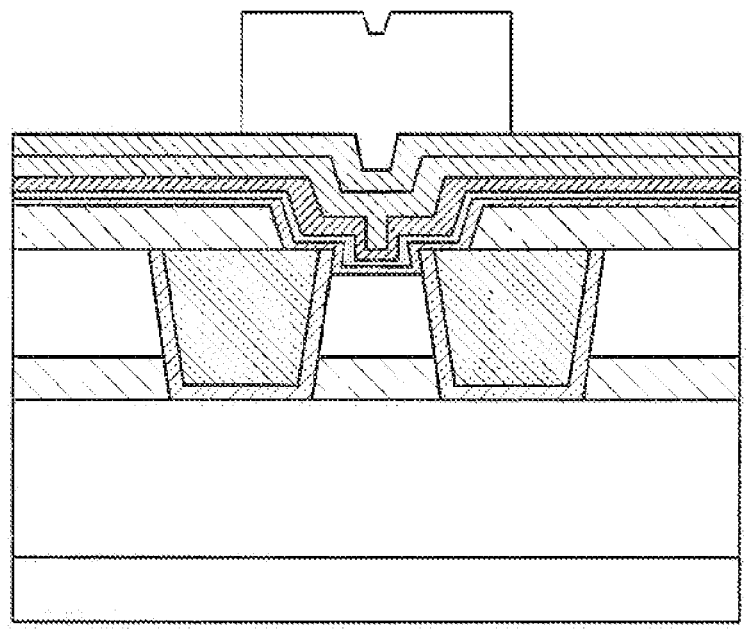
FIG. 16I is a schematic sectional view illustrating still another process (process 9) of manufacturing the semiconductor device including the three-terminal switching element according to the fourth exemplary embodiment of the present invention.

[Process 9] (FIG. 16I)

A photoresist (not illustrated) for forming a three-terminal switch by patterning is formed on the hard mask film 1613. Dry etching of the hard mask film 1613 is performed using the photoresist as a mask until the hard mask film 1612 becomes exposed. The photoresist is then removed by oxygen plasma ashing and organic stripping.

Figure 16J:
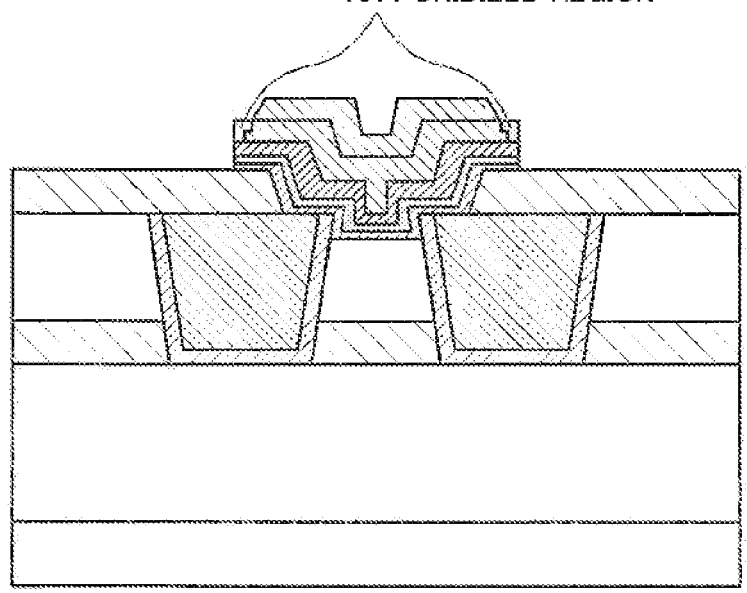
FIG. 16J is a schematic sectional view illustrating still another process (process 10) of manufacturing the semiconductor device including the three-terminal switching element according to the fourth exemplary embodiment of the present invention.

[Process 10] (FIG. 16J)

Dry etching is continuously performed on the hard mask film 1612, the upper second electrode 1611, the lower second electrode 1610, the second ion conductive layer 1609b, and the first ion conductive layer 1609a using the hard mask film 1613 as a mask. At this time, the hard mask film 1613 is preferably removed completely during an etch-back operation but may remain intact. When, for example, the upper second electrode 1611 is made of tantalum or tantalum oxide, it can be processed using chlorine-based RIE. When the lower second electrode 1610 is made of an alloy of ruthenium and tantalum, it is desirably processed using a gas mixture of chlorine, nitrogen, and oxygen at a chlorine:nitrogen:oxygen ratio of, for example, 25%:25%:50%.

The second ion conductive layer 1609b and the first ion conductive layer 1609a under the lower second electrode 1610 can also be etched using the same gas as that used for the lower second electrode 1610. As a result, dry etching can be stopped on the lower, barrier insulating film 1607. The use of such a hard mask RIE method allows the resistive-change element portion to be processed without exposure to oxygen plasma ashing for resist removal.

When an oxidation process is performed using an oxygen plasma after processing, oxygen plasma irradiation is possible independently of the resist stripping time. By oxygen used during etching of layers under the lower second electrode 1610, the side surface and part of the upper surface of the upper second electrode 1611 exposed due to degeneration of the hard mask film 1612 oxidize into an oxidized region 1614.

Figure 16K:
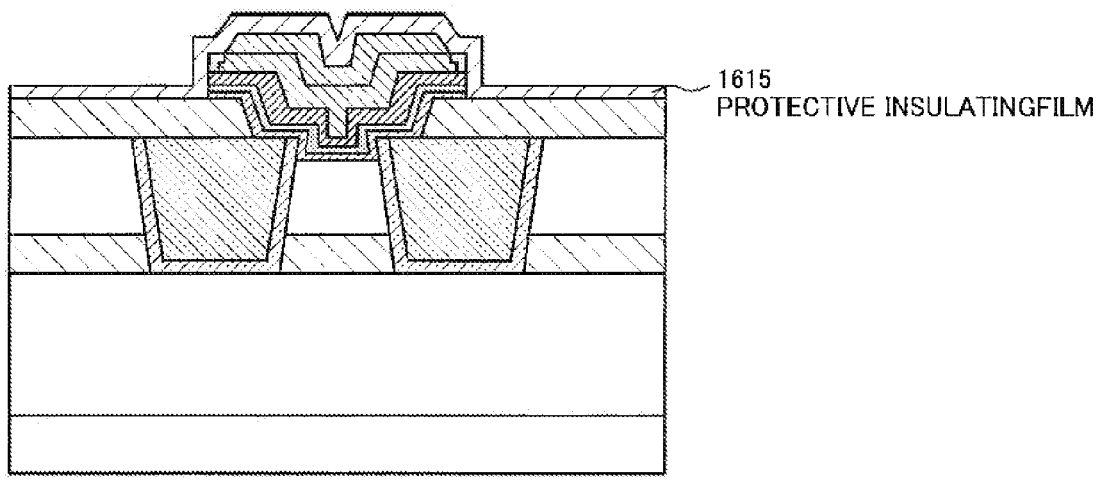
FIG. 16K is a schematic sectional view illustrating still another process (process 11) of manufacturing the semiconductor device including the three-terminal switching element according to the fourth exemplary embodiment of the present invention.

[Process 11] (FIG. 16K)

A protective insulating film 1615 (for example, a 20-nm thick silicon nitride or silicon carbonitride film) is deposited on the hard mask film 1612, the upper second electrode 1611, the lower second electrode 1610, the second ion conductive layer 1609b, the first ion conductive layer 1609a, and the barrier insulating film 1607. The protective insulating film 1615 can be deposited by the plasma CVD method. Before deposition, the reactive chamber needs to be maintained under reduced pressure, and this involves oxygen desorption from the side surfaces of the second ion conductive layer 1609b and the first ion conductive layer 1609a and increases the leakage current of these ion conductive layers. To suppress this effect, the deposition temperature of the protective insulating film 1615 is preferably set to 250° C. or less. Further, no reductive gas is preferably used in terms of exposure to a deposition gas under reduced pressure before deposition. A silicon nitride film formed using a $SiH_4/N_2$ gas mixture at a substrate temperature of 200° C. by a high-density plasma, for example, is preferably employed.

Figure 16L:
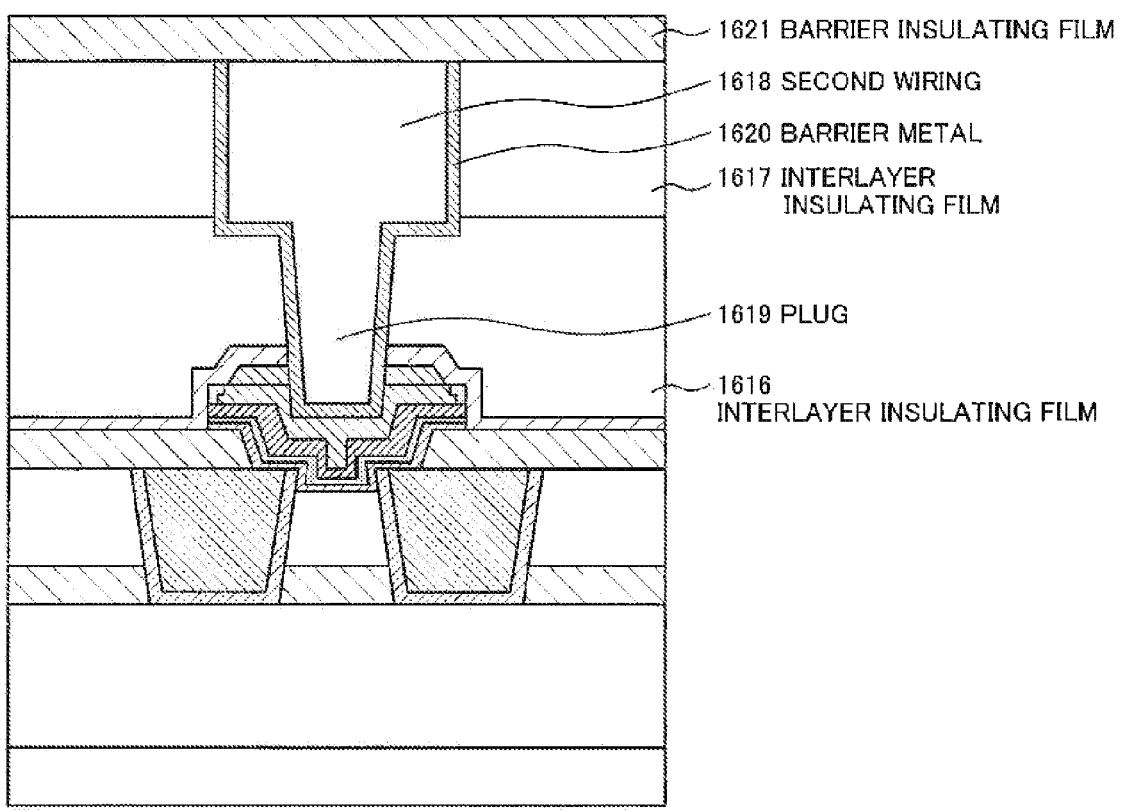
FIG. 16L is a schematic sectional view illustrating still another process (process 12) of manufacturing the semiconductor device including the three-terminal switching element according to the fourth exemplary embodiment of the present invention.

[Process 12] (FIG. 16L)

An interlayer insulating film 1616 (for example, a silicon oxide film) and an interlayer insulating film 1617 (for example, a stack of a 150-nm thick SiCHO film and a 150-nm thick silicon oxide film) are deposited on the protective insulating film 1615 in this order. A pilot hole for a plug 1619 is formed and a wiring trench for second wiring 1618 is further formed. A copper dual damascene wiring process is used to simultaneously form second wiring 1618 (for example, copper) and a plug 1619 (for example, copper) in the wiring trench and the pilot hole, respectively, through a barrier metal 1620 (for example, tantalum nitride/tantalum). A barrier insulating film 1621 (for example, a silicon nitride film) is deposited on the interlayer insulating film 1617 including the second wiring 1618.

The second wiring 1618 can be formed using a process similar to that used in forming lower layer wiring. At this time, the use of the same material for both the barrier metal 1620 and the upper second electrode 1611 makes it possible to reduce the contact resistance between the plug 1619 and the upper second electrode 1611 to improve the element performance. The interlayer insulating films 1616 and 1617 can be formed by the plasma CVD method. To eliminate any step formed by the two-terminal switch, the interlayer insulating film 1616 may be formed at a desired thickness (for example, 110 nm) by being thickly deposited and then etched and planarized by CMP.

According to this exemplary embodiment, short-circuiting of a switching element using a metal bridge is prevented. Further, exposure of Cu wiring is prevented by suppressing etching of the barrier insulating film. These features attain a switching element, a switching element manufacturing method, a semiconductor device, and a semiconductor device manufacturing method having excellent operational stability and a high production yield.

In other words, this exemplary embodiment provides a switching element having excellent operational stability and a high production yield, and a semiconductor device using the switching element.

(Fifth Exemplary Embodiment)

Figure 17:
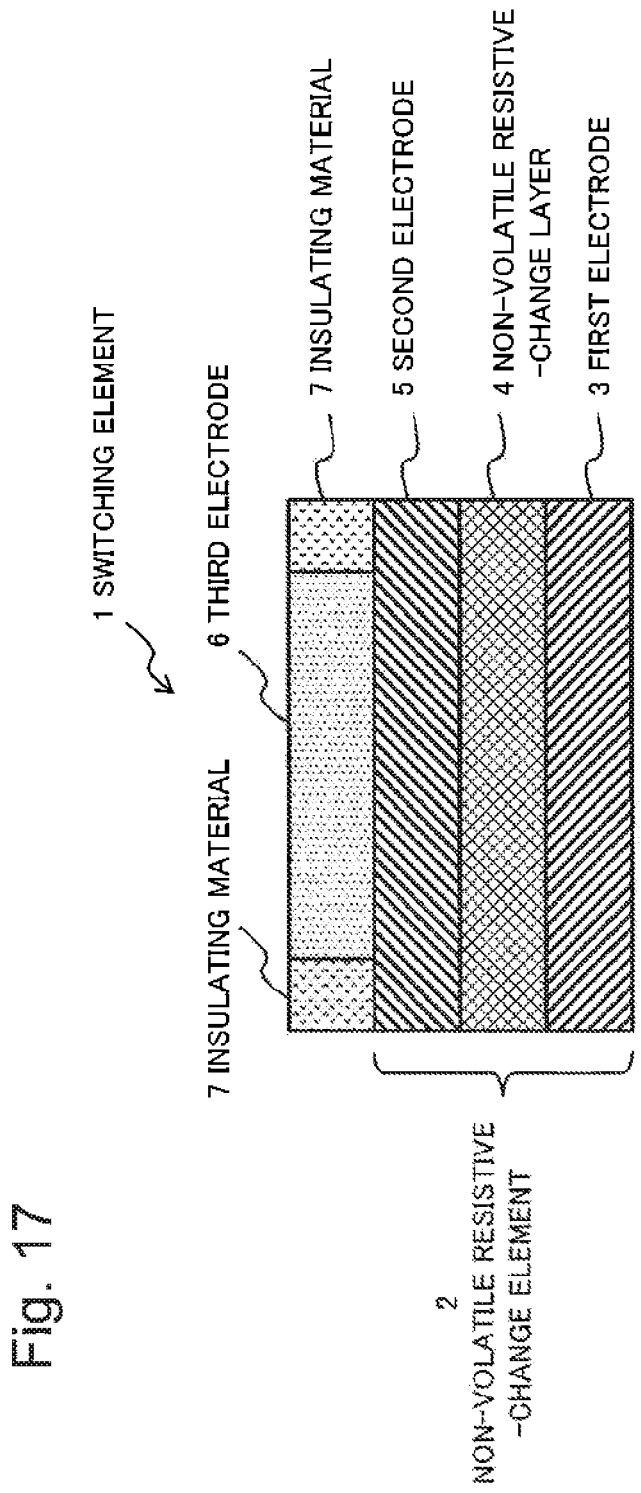
FIG. 17 is a schematic sectional view illustrating the configuration of a switching element according to a fifth exemplary embodiment of the present invention.

FIG. 17 is a schematic sectional view illustrating the configuration of a switching element according to a fifth exemplary embodiment of the present invention. A switching element 1 according to this exemplary embodiment includes a non-volatile resistive-change element 2 and a third electrode 6. The non-volatile resistive-change element 2 includes a first electrode 3, a second electrode 5, and a non-volatile resistive-change layer 4 provided between the first electrode 3 and the second electrode 5. The third electrode 6 is provided on the second electrode 5. The switching element 1 also includes an insulating material 7 at least on the side surface of the third electrode 6.

This exemplary embodiment provides a switching element having excellent operational stability and a high production yield, and a semiconductor device using the switching element.

The present invention can be modified into various forms without departing from the scope of the invention described in the scope of claims, and these modifications also fall within the scope of the present invention.

Although some or all of the above-mentioned exemplary embodiments can also be described as in the following supplementary notes, the present invention is not limited to this.

(Supplementary Note 1)

A switching element comprising: a non-volatile resistive-change element comprising a first electrode, a second electrode, and a non-volatile resistive-change layer provided between the first electrode and the second electrode; a third electrode provided on the second electrode; and an insulating material at least on a side surface of the third electrode.

(Supplementary Note 2)

The switching element according to supplementary note 1, further comprising a rectifying element comprising the second electrode, the third electrode, and a volatile resistive-change layer provided between the second electrode and the third electrode.

(Supplementary Note 3)

The switching element according to supplementary note 1 or 2, wherein the insulating material comprises an oxide.

(Supplementary Note 4)

The switching element according to any one of supplementary notes 1 to 3, wherein the non-volatile resistive-change layer is in contact with the first electrode through an opening formed in a barrier insulating film comprising a material selected from the group consisting essentially of SiC, SiCN, and SiN.

(Supplementary Note 5)

The switching element according to any one of supplementary notes 1 to 4, wherein the non-volatile resistive-change layer comprises an ion conductive layer which conducts a metal ion, the first electrode contains copper, and the second electrode contains ruthenium.

(Supplementary Note 6)

A method for manufacturing a switching element comprising: a non-volatile resistive-change element comprising a first electrode, a second electrode, and a non-volatile resistive-change layer provided between the first electrode and the second electrode; a third electrode provided on the second electrode; and an oxide at least on a side surface of the third electrode, the method comprising performing dry etching on the third electrode using an etching gas possessing oxidizing property.

(Supplementary Note 7)

The method for manufacturing a switching element according to supplementary note 6, wherein the switching element further comprises a rectifying element comprising the second electrode, the third electrode, and a volatile resistive-change layer provided between the second electrode and the third electrode.

(Supplementary Note 8) The method for manufacturing a switching element according to supplementary note 6 or 7, wherein the etching gas possessing the oxidizing property contains chlorine, nitrogen, and oxygen.

(Supplementary Note 9)

The method for manufacturing a switching element according to supplementary note 8, wherein the chlorine is present at a content of 15 to 25%, the nitrogen is present at a content of 15% to 25%, and the oxygen is present at a content of 50% to 70%.

(Supplementary Note 10)

A semiconductor device comprising a two-terminal non-volatile resistive-change element and a two-terminal volatile resistive-change element within a multilayer copper wiring layer on a semiconductor substrate, wherein the multilayer copper wiring layer comprises copper wiring and a copper plug, the two-terminal non-volatile resistive-change element comprises a first electrode, a second electrode, and an ion conductive layer provided between the first electrode and the second electrode, the copper wiring serves as the first electrode and comprises a barrier insulating film provided thereon, the barrier insulating film contains silicon carbonitride, the barrier insulating film comprises an opening which reaches the first electrode, the opening comprises the ion conductive layer and the second electrode, the ion conductive layer comprises a first ion conductive layer in contact with the first electrode and a second ion conductive layer in contact with the second electrode, the first ion conductive layer comprises a material selected from the group consisting essentially of titanium oxide, aluminum oxide, and a stack of titanium oxide and aluminum oxide, the second ion conductive layer comprises a polymer film containing silicon, oxygen, and carbon and having a relative dielectric constant of 2.1 (inclusive) to 3.0 (inclusive), the second electrode comprises a material selected from the group consisting essentially of an alloy of ruthenium and tantalum and an alloy of ruthenium and titanium, the two-terminal volatile resistive-change element comprises the second electrode, the third electrode, and a resistive-change layer provided between the second electrode and the third electrode, the opening comprises the resistive-change layer and the third electrode, the resistive-change layer comprises a material selected from the group consisting essentially of titanium oxide, aluminum oxide, tantalum oxide, niobium oxide, and a stack of titanium oxide, aluminum oxide, tantalum oxide, and niobium oxide, the third electrode is connected to the copper plug via a barrier metal, the third electrode contains tantalum, and the semiconductor device comprises an insulating material at least on a side surface of the third electrode.

(Supplementary Note 11)

A semiconductor device comprising a three-terminal non-volatile resistive-change element and a two-terminal volatile resistive-change element within a multilayer copper wiring layer on a semiconductor substrate, wherein the multilayer copper wiring layer comprises copper wiring and a copper plug, the three-terminal non-volatile resistive-change element comprises two first electrodes, a second electrode, and an ion conductive layer provided between the two first electrodes and the second electrode, the copper wiring serves as the first electrode and comprises a barrier insulating film provided thereon, the barrier insulating film contains silicon carbonitride, the barrier insulating film comprises an opening which reaches the two first electrodes, the opening comprises the ion conductive layer and the second electrode, the ion conductive layer comprises a first ion conductive layer in contact with the first electrode and a second ion conductive layer in contact with the second electrode, the first ion conductive layer comprises a material selected from the group consisting essentially of titanium oxide, aluminum oxide, and a stack of titanium oxide and aluminum oxide, the second ion conductive layer comprises a polymer film containing silicon, oxygen, and carbon and having a relative dielectric constant of 2.1 (inclusive) to 3.0 (inclusive), the second electrode comprises a material selected from the group consisting essentially of an alloy of ruthenium and tantalum and an alloy of ruthenium and titanium, the two-terminal volatile resistive-change element comprises the second electrode, the third electrode, and a resistive-change layer provided between the second electrode and the third electrode, the opening comprises the resistive-change layer and the third electrode, the resistive-change layer comprises a material selected from the group consisting essentially of titanium oxide, aluminum oxide, tantalum oxide, niobium oxide, and a stack of titanium oxide, aluminum oxide, tantalum oxide, and niobium oxide, the third electrode is connected to the copper plug via a barrier metal, the third electrode contains tantalum, and the semiconductor device comprises an insulating material at least on a side surface of the third electrode.

(Supplementary Note 12)

A semiconductor device comprising a two-terminal resistive-change element within a multilayer copper wiring layer on a semiconductor substrate, wherein the multilayer copper wiring layer comprises copper wiring and a copper plug, the two-terminal resistive-change element comprises a first electrode, a second electrode, and an ion conductive layer provided between the first electrode and the second electrode, the copper wiring serves as the first electrode and comprises a barrier insulating film provided thereon, the barrier insulating film contains silicon carbonitride, the barrier insulating film comprises an opening which reaches the first electrode, the opening comprises the ion conductive layer and the second electrode, the ion conductive layer comprises a first ion conductive layer in contact with the first electrode and a second ion conductive layer in contact with the second electrode, the first ion conductive layer comprises a material selected from the group consisting essentially of titanium oxide, aluminum oxide, and a stack of titanium oxide and aluminum oxide, the second ion conductive layer comprises a polymer film containing silicon, oxygen, and carbon and having a relative dielectric constant of 2.1 (inclusive) to 3.0 (inclusive), the second electrode is connected to the copper plug via a barrier metal, the second electrode comprises a stack of tantalum and a material selected from the group consisting essentially of an alloy of ruthenium and tantalum and an alloy of ruthenium and titanium, and the semiconductor device comprises an insulating material at least on a side surface of the second electrode.

(Supplementary Note 13)

A semiconductor device comprising a three-terminal resistive-change element within a multilayer copper wiring layer on a semiconductor substrate, wherein the multilayer copper wiring layer comprises copper wiring and a copper plug, the three-terminal resistive-change element comprises two first electrodes, a second electrode, and an ion conductive layer provided between the two first electrodes and the second electrode, the copper wiring serves as the first electrode and comprises a barrier insulating film provided thereon, the barrier insulating film contains silicon carbonitride, the barrier insulating film comprises an opening which reaches the two first electrodes, the opening comprises the ion conductive layer and the second electrode, the ion conductive layer comprises a first ion conductive layer in contact with the first electrode and a second ion conductive layer in contact with the second electrode, the first ion conductive layer comprises a material selected from the group consisting essentially of titanium oxide, aluminum oxide, and a stack of titanium oxide and aluminum oxide, the second ion conductive layer comprises a polymer film containing silicon, oxygen, and carbon and having a relative dielectric constant of 2.1 (inclusive) to 3.0 (inclusive), the second electrode is connected to the copper plug via a barrier metal, the second electrode comprises a stack of tantalum and a material selected from the group consisting essentially of an alloy of ruthenium and tantalum and an alloy of ruthenium and titanium, and the semiconductor device comprises an insulating material at least on a side surface of the second electrode.

(Supplementary Note 14)

The semiconductor device according to any one of supplementary notes 10 to 13, wherein the insulating material comprises an oxide.

(Supplementary Note 15)

A method for manufacturing a semiconductor device comprising a non-volatile resistive-change element and a volatile resistive-change element within a multilayer copper wiring layer on a semiconductor substrate, the method comprising:

forming a barrier insulating film containing silicon carbonitride on copper wiring serving as a first electrode, forming in the barrier insulating film, an opening which reaches the first electrode, forming in the opening, a first ion conductive layer comprising a material selected from the group consisting essentially of titanium oxide, aluminum oxide, and a stack of titanium oxide and aluminum oxide, forming a polymer film containing silicon, oxygen, and carbon and having a relative dielectric constant of 2.1 (inclusive) to 3.0 (inclusive) on the first ion conductive layer as a second ion conductive layer, forming on the second ion conductive layer, a second electrode comprising a material selected from the group consisting essentially of an alloy of ruthenium and tantalum and an alloy of ruthenium and titanium, forming on the second electrode, a resistive-change layer comprising a material selected from the group consisting essentially of titanium oxide, aluminum oxide, tantalum oxide, niobium oxide, and a stack of titanium oxide, aluminum oxide, tantalum oxide, and niobium oxide, forming a third electrode containing tantalum on the resistive-change layer, forming a hard mask film containing silicon nitride and silicon oxide on the third electrode, forming a photoresist pattern on the hard mask film, forming a hard mask by performing dry etching on the hard mask film by an etching gas containing carbon tetrafluoride, using the photoresist pattern as a mask, and performing dry etching on the third electrode, the resistive-change layer, the second electrode, the second ion conductive layer, and the first ion conductive layer by an etching gas possessing oxidizing property, using the hard mask as a mask.

(Supplementary Note 16)

A method for manufacturing a semiconductor device comprising a resistive-change element within a multilayer copper wiring layer on a semiconductor substrate, the method comprising:

forming a barrier insulating film containing silicon carbonitride on copper wiring serving as a first electrode, forming in the barrier insulating film, an opening which reaches the first electrode, forming in the opening, a first ion conductive layer comprising a material selected from the group consisting essentially of titanium oxide, aluminum oxide, and a stack of titanium oxide and aluminum oxide, forming a polymer film containing silicon, oxygen, and carbon and having a relative dielectric constant of 2.1 (inclusive) to 3.0 (inclusive) on the first ion conductive layer as a second ion conductive layer, forming on the second ion conductive layer, a second electrode comprising a stack of tantalum and a material selected from the group consisting essentially of an alloy of ruthenium and tantalum and an alloy of ruthenium and titanium, forming a hard mask film containing silicon nitride and silicon oxide on the second electrode, forming a photoresist pattern on the hard mask film, forming a hard mask by performing dry etching on the hard mask film by an etching gas containing carbon tetrafluoride, using the photoresist pattern as a mask, and performing dry etching on the second electrode, the second ion conductive layer, and the first ion conductive layer by an etching gas possessing oxidizing property, using the hard mask as a mask.

(Supplementary Note 17)

The method for manufacturing a semiconductor device according to supplementary note 15 or 16, wherein the etching gas possessing the oxidizing property contains chlorine, nitrogen, and oxygen.

(Supplementary Note 18)

The method for manufacturing a switching element according to supplementary note 17, wherein the chlorine is present at a content of 15 to 25%, the nitrogen is present at a content of 15% to 25%, and the oxygen is present at a content of 50% to 70%.

This application claims priority based on Japanese Patent Application No. 2013-134426 filed Jun. 27, 2013, the disclosure of which is incorporated herein by reference in its entirety.

INDUSTRIAL APPLICABILITY

The present invention is applicable to semiconductor devices such as programmable logic and memories.

REFERENCE SIGNS LIST 110, 604, 810, 910, 1010: second electrode
1110, 1204, 1410, 1510, 1610: lower second electrode
1112, 1411, 1511, 1611: upper second electrode
112, 606, 812, 911, 1012: third electrode
108a, 602, 809a, 909a, 1009a, 1108a, 1202, 1409a, 1509a, 1609a: first ion conductive layer
108b, 603, 809b, 909b, 1009b, 1108b, 1203, 1409b, 1509b, 1609b: second ion conductive layer
111, 605, 811, 908, 1011: resistive-change layer
607, 1205: metal ions
608, 1206: metal bridge
101, 801, 901, 1001, 1101, 1401, 1501, 1601: semiconductor substrate
102, 104, 114, 116, 802, 804, 817, 818, 902, 904, 916, 917, 1002, 1004, 1017, 1018, 1102, 1104, 1114, 1115, 1402, 1404, 1416, 1418, 1502, 1504, 1516, 1517, 1602, 1604, 1616, 1617: interlayer insulating film
103, 107, 119, 803, 807, 822, 903, 907, 921, 1003, 1007, 1022, 1106, 1107, 1119, 1403, 1407, 1421, 1503, 1507, 1515, 1603, 1607, 1621: barrier insulating film
106, 118, 806, 821, 920, 1021, 1106, 1118, 1406, 1420, 1520, 1620: barrier metal
906a, 1006a, 1506a, 1606a: barrier metal A
906b, 1006b, 1506b, 1606b: barrier metal B
105, 601, 805, 1105, 1201, 1405: first wiring
905a, 1005a, 1505a, 1605a: first wiring A
905b, 1005b, 1505b, 1605b: first wiring B
111, 605, 811, 908, 1011: resistive-change layer
116, 819, 919, 1019, 1116, 1418, 1519, 1618: second wiring
121, 808, 813, 814, 912, 1008, 1013, 1014, 1111, 1408, 1412, 1413,
1512, 1608, 1612, 1613: hard mask film 113, 816, 913, 1016, 1117, 1415, 1513, 1615: protective insulating film
117, 820, 918, 1020, 1113, 1419, 1518, 1619: plug
109, 1109: two-terminal switch
914, 1514: three-terminal switch
122, 815, 922, 1015, 1120, 1414, 1508, 1614: oxidized region
1: switching element
2: non-volatile resistive-change element
3: first electrode
4: non-volatile resistive-change layer
5: second electrode
6: third electrode
7: insulating material

The invention claimed is:

1. A semiconductor device comprising a non-volatile resistive-change element and a volatile resistive-change element within a multilayer copper wiring layer on a semiconductor substrate, wherein
   the multilayer copper wiring layer comprises copper wiring and a copper plug,
   the non-volatile resistive-change element comprises a first electrode, a second electrode, and an ion conductive layer provided between the first electrode and the second electrode,
   the copper wiring serves as the first electrode and comprises a barrier insulating film provided thereon,
   the barrier insulating film contains silicon carbonitride,
   the barrier insulating film comprises an opening which reaches the first electrode,
   the opening comprises the ion conductive layer and the second electrode,
   the ion conductive layer comprises a first ion conductive layer in contact with the first electrode and a second ion conductive layer in contact with the second electrode,
   the first ion conductive layer comprises a material selected from the group consisting essentially of titanium oxide, aluminum oxide, and a stack of titanium oxide and aluminum oxide,
   the second ion conductive layer comprises a polymer film containing silicon, oxygen, and carbon and having a relative dielectric constant of 2.1 (inclusive) to 3.0 (inclusive),
   the second electrode comprises a material selected from the group consisting essentially of an alloy of ruthenium and tantalum and an alloy of ruthenium and titanium,
   the volatile resistive-change element comprises the second electrode, the third electrode, and a resistive-change layer provided between the second electrode and the third electrode,
   the opening comprises the resistive-change layer and the third electrode,
   the resistive-change layer comprises a material selected from the group consisting essentially of titanium oxide, aluminum oxide, tantalum oxide, niobium oxide, and a stack of titanium oxide, aluminum oxide, tantalum oxide, and niobium oxide,
   the third electrode is connected to the copper plug via a barrier metal,
   the third electrode contains tantalum, and
   the semiconductor device comprises an insulating material at least on a side surface of the third electrode.

2. A method for manufacturing a semiconductor device according to claim 1, the method comprising:
   forming the barrier insulating film containing silicon carbonitride on copper wiring serving as a first electrode,
   forming in the barrier insulating film, the opening which reaches the first electrode,
   forming in the opening, the first ion conductive layer comprising the material selected from the group consisting essentially of titanium oxide, aluminum oxide, and a stack of titanium oxide and aluminum oxide,
   forming the polymer film containing silicon, oxygen, and carbon and having a relative dielectric constant of 2.1 (inclusive) to 3.0 (inclusive) on the first ion conductive layer as the second ion conductive layer,
   forming on the second ion conductive layer, the second electrode comprising the material selected from the group consisting essentially of an alloy of ruthenium and tantalum and an alloy of ruthenium and titanium,
   forming on the second electrode, the resistive-change layer comprising the material selected from the group consisting essentially of titanium oxide, aluminum oxide, tantalum oxide, niobium oxide, and a stack of titanium oxide, aluminum oxide, tantalum oxide, and niobium oxide,
   forming the third electrode containing tantalum on the resistive-change layer,
   forming a hard mask film containing silicon nitride and silicon oxide on the third electrode,
   forming a photoresist pattern on the hard mask film,
   forming a hard mask by performing dry etching on the hard mask film by an etching gas containing carbon tetrafluoride, using the photoresist pattern as a mask, and
   performing dry etching on the third electrode, the resistive-change layer, the second electrode, the second ion conductive layer, and the first ion conductive layer by an etching gas possessing oxidizing property, using the hard mask as a mask.

* * * * *